US012792171B2

(12) United States Patent
Do

(10) Patent No.: US 12,792,171 B2
(45) Date of Patent: Nov. 10, 2026

(54) DISPLAY APPARATUS

(71) Applicant: LG Display Co., Ltd., Seoul (KR)

(72) Inventor: Wonchang Do, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/092,027

(22) Filed: Mar. 27, 2025

(65) Prior Publication Data

US 2026/0056624 A1 Feb. 26, 2026

(30) Foreign Application Priority Data

Aug. 26, 2024 (KR) ........................ 10-2024-0114218

(51) Int. Cl.

| | |
|---|---|
| ***G06F 3/041*** | (2006.01) |
| ***G09G 3/32*** | (2016.01) |
| ***H10H 29/39*** | (2025.01) |
| *H10H 29/80* | (2025.01) |

(52) U.S. Cl.

CPC ........ *G06F 3/0412* (2013.01); *G06F 3/04166* (2019.05); *G09G 3/32* (2013.01); *H10H 29/39* (2025.01); *G09G 2300/0426* (2013.01); *G09G 2300/0842* (2013.01); *G09G 2300/0861* (2013.01); *G09G 2354/00* (2013.01); *H10H 29/882* (2025.01)

(58) Field of Classification Search

CPC ..... G06F 3/0412; G06F 3/04166; G09G 3/32; G09G 2300/0842; G09G 2300/0861; G09G 2354/00; H10H 29/39; H10H 29/882

See application file for complete search history.

(56) References Cited

U.S. PATENT DOCUMENTS

| | | | | |
|---|---|---|---|---|
| 2019/0012012 | A1* | 1/2019 | Lai | G06F 3/0412 |
| 2020/0091247 | A1* | 3/2020 | Lee | G06F 3/0412 |
| 2020/0103997 | A1* | 4/2020 | Coppoolse | G06F 3/0412 |
| 2021/0064170 | A1* | 3/2021 | Hwang | G06F 3/016 |
| 2021/0091163 | A1* | 3/2021 | Son | G09G 3/3225 |
| 2021/0134191 | A1* | 5/2021 | Jung | G09F 9/301 |
| 2021/0407379 | A1* | 12/2021 | Yang | G06F 3/042 |
| 2022/0173155 | A1* | 6/2022 | Rho | H10H 20/813 |
| 2022/0229514 | A1* | 7/2022 | Park | H10H 20/851 |
| 2022/0293712 | A1* | 9/2022 | Park | H10K 59/353 |
| 2023/0004271 | A1* | 1/2023 | Lee | G06F 3/0446 |
| 2023/0015262 | A1* | 1/2023 | Shim | H10K 59/8792 |

(Continued)

*Primary Examiner* — Ryan A Lubit
(74) *Attorney, Agent, or Firm* — Fish & Richardson P.C.

(57) ABSTRACT

A display apparatus in which positions of touch electrodes can be changed, where the display apparatus includes a display panel; and a touch determination circuit configured to determine whether the display panel is touched using touch sensing signals transmitted from pixel driving circuits in the display panel. The display panel also includes: a substrate including a display area and a non-display area; the pixel driving circuits in the display area on the substrate; first electrodes electrically connected to the pixel driving circuits; light emitting devices on the first electrodes; and second electrodes on the light emitting devices. At least one of the pixel driving circuits is configured to drive each of the light emitting devices, each of the second electrodes is electrically connected to at least two light emitting devices, and at least one second electrode is electrically connected to each of the pixel driving circuits.

15 Claims, 23 Drawing Sheets

(56) References Cited

U.S. PATENT DOCUMENTS

| | | | | |
|---|---|---|---|---|
| 2023/0200121 | A1* | 6/2023 | Lee | G06F 3/0443 345/174 |
| 2023/0205373 | A1* | 6/2023 | Han | G06F 3/0412 345/173 |
| 2023/0229044 | A1* | 7/2023 | Yin | G06F 3/0412 349/149 |
| 2024/0138169 | A1* | 4/2024 | Kusunoki | G06F 3/042 |
| 2024/0153443 | A1* | 5/2024 | Morita | G09G 3/32 |
| 2024/0169914 | A1* | 5/2024 | Yamazaki | H10D 30/67 |
| 2024/0414967 | A1* | 12/2024 | Shin | G09G 3/3225 |
| 2025/0063861 | A1* | 2/2025 | Cha | H10H 20/8506 |
| 2025/0306703 | A1* | 10/2025 | Burkovskyy | G06F 3/04166 |

* cited by examiner

DISPLAY APPARATUS

CROSS-REFERENCE TO RELATED APPLICATIONS

Pursuant to 35 U.S.C. § 119(a), this application claims the benefit of an earlier filing date and right of priority to Korean Patent Application No. 10-2024-0114218 filed on Aug. 26, 2024, the contents of which are incorporated by reference herein in their entirety.

TECHNICAL FIELD

The present disclosure relates to a display apparatus.

BACKGROUND

A display apparatus is applied to various electronic devices such as TVs, mobile phones, laptops, and tablets.

Display apparatuses include an organic light emitting display (OLED) that emits light by itself and a liquid crystal display (LCD) that requires a separate light source.

Recently, a display apparatus including a light emitting diode (LED) has attracted attention as a next-generation display apparatus. The light emitting diode is made of an inorganic material, not an organic material. Accordingly, compared to the liquid crystal display or the organic light emitting display, a display apparatus including the light emitting diode has a faster lighting speed, has excellent luminous efficiency, and can display an image having high luminance.

SUMMARY

Accordingly, the present disclosure is directed to providing a display apparatus that substantially obviates one or more problems due to limitations and disadvantages of the related art.

An aspect of the present disclosure is directed to providing a display apparatus in which positions of touch electrodes can be changed.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description as well as the appended drawings.

To achieve these and other advantages and in accordance with the purpose of the disclosure, as embodied and broadly described herein, there is provided a display apparatus comprising a display panel; and a touch determination circuit configured to determine whether the display panel is touched using touch sensing signals transmitted from pixel driving circuits in the display panel, wherein the display panel comprises: a substrate including a display area and a non-display area; the pixel driving circuits in the display area on the substrate; first electrodes electrically connected to the pixel driving circuits; light emitting devices on the first electrodes; and second electrodes on the light emitting devices, at least one of the pixel driving circuits is configured to drive each of the light emitting devices, each of the second electrodes is electrically connected to at least two light emitting devices, and at least one second electrode is electrically connected to each of the pixel driving circuits.

It is to be understood that both the foregoing general description and the following detailed description of the present disclosure are example and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate implementations of the disclosure and together with the description serve to explain the principle of the disclosure. In the drawings.

DETAILED DESCRIPTION

Figure 1:
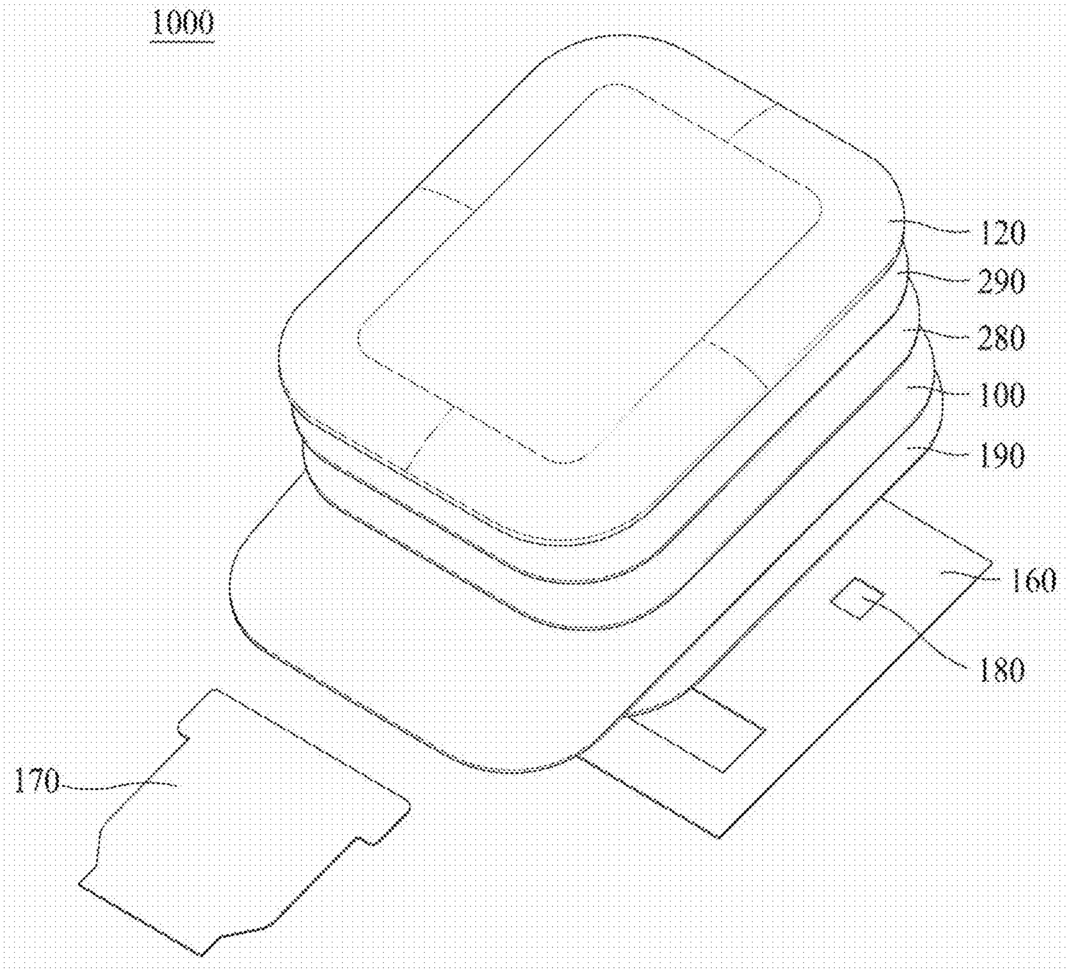
FIG. 1 is a perspective view illustrating a display apparatus according to an implementation of the present disclosure.

Reference will now be made in detail to implementations of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following implementations described with reference to the accompanying drawings. The present disclosure can, however, be embodied in different forms and should not be construed as limited to the implementations set forth herein. Rather, these implementations are provided so that this disclosure will be thorough and complete, and will fully convey the scope of the present disclosure to those skilled in the art.

A shape, a size, a ratio, an angle, and a number disclosed in the drawings for describing implementations of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. When “comprise,” “have,” and “include” described in the present disclosure are used, another part can be added unless “only” is used. The terms of a singular form can include plural forms unless referred to the contrary.

In construing an element, the element is construed as including an error or tolerance range although there is no explicit description of such an error or tolerance range.

In describing a position relationship, for example, when a position relation between two parts is described as, for example, “on,” “over,” “under,” and “next,” one or more other parts can be disposed between the two parts unless a more limiting term, such as “just” or “direct(ly)” is used.

In describing a time relationship, for example, when the temporal order is described as, for example, “after,” “subsequent,” “next,” and “before,” a case that is not continuous can be included unless a more limiting term, such as “just,” “immediate(ly),” or “direct(ly)” is used.

It will be understood that, although the terms “first,” “second,” etc. can be used herein to describe various elements, these elements should not be limited by these terms. These terms are only used to distinguish one element from another and may not define order of sequence. For example, a first element could be termed a second element, and, similarly, a second element could be termed a first element, without departing from the scope of the present disclosure.

In describing elements of the present disclosure, the terms “first,” “second,” “A,” “B,” “(a),” “(b),” etc. can be used. These terms are intended to identify the corresponding elements from the other elements, and basis, order, or number of the corresponding elements should not be limited by these terms. The expression that an element is “connected,” “coupled,” or “adhered” to another element or layer should be understood the element or layer cannot only be directly connected or adhered to another element or layer, but also be indirectly connected or adhered to another element or layer with one or more intervening elements or layers “disposed,” or “interposed” between the elements or layers, unless otherwise specified.

The term “at least one” should be understood as including any and all combinations of one or more of the associated listed items. For example, the meaning of “at least one of a first item, a second item, and a third item” denotes the combination of all items proposed from two or more of the first item, the second item, and the third item as well as the first item, the second item, or the third item. Also, the term “can” used herein includes all meanings and definitions of the word “may”.

Features of various implementations of the present disclosure can be partially or overall coupled to or combined with each other, and can be variously inter-operated with each other and driven technically as those skilled in the art can sufficiently understand. The implementations of the present disclosure can be carried out independently from each other, or can be carried out together in co-dependent relationship.

Hereinafter, implementations of the present disclosure will be described in detail with reference to the accompanying drawings.

FIG. 1 is a perspective view illustrating a display apparatus according to an implementation of the present disclosure.

Referring to FIG. 1, a display apparatus 1000 according to an implementation of the present disclosure can include a display panel 100, a polarizing layer 280, an adhesive layer 290, a cover member 120, a support substrate 190, a flexible circuit board 170, and a printed circuit board 160.

The display panel 100 can implement information, a video, and/or an image provided to a user.

The polarizing layer 280 can be disposed on the display panel 100. The polarizing layer 280 can prevent or reduce light generated from an external light source from entering the display panel 100 to affect a light emitting device or the like.

The adhesive layer 290 can attach the cover member 120 to the display panel 100. The adhesive layer 290 can be disposed between the polarizing layer 280 and the cover member 120 to attach the cover member 120 to the polarizing layer 280. The adhesive layer 290 can include an optically clear adhesive (OCA), an optically clear resin (OCR), a pressure sensitive adhesive (PSA) or the like, but implementations of the present disclosure are not limited thereto.

The cover member 120 can be disposed on the polarizing layer 280. The cover member 120 can be disposed on the adhesive layer 290. The cover member 120 can be a member for protecting the display panel 100. The cover member 120 can be formed of a transparent material.

The support substrate 190 can be disposed between the display panel 100 and the printed circuit board 160. The support substrate 190 can reinforce rigidity of the display panel 100. The support substrate 190 can be a back plate, but implementations of the present disclosure are not limited thereto.

The flexible circuit board 170 and the printed circuit board 160 can be disposed on a bottom of the display panel 100. The flexible circuit board 170 and the printed circuit board 160 can be disposed on at least one edge of the display panel 100. One side of the flexible circuit board 170 can be attached to the display panel 100 and the other side of the flexible circuit board 170 can be attached to the printed circuit board 160. The flexible circuit board 170 can be a flexible film, but implementations of the present disclosure are not limited thereto.

The printed circuit board 160 can include at least one hole 180. An internal component that senses ambient light or temperature, which can be provided to a plurality of sensors, can be disposed in an area corresponding to at least one hole 180. For example, the internal component can include an ambient light sensor (ALS) or a temperature sensor. For example, the hole 180 can be a through hole, etc., but implementations of the present disclosure are not limited thereto.

Figure 2:
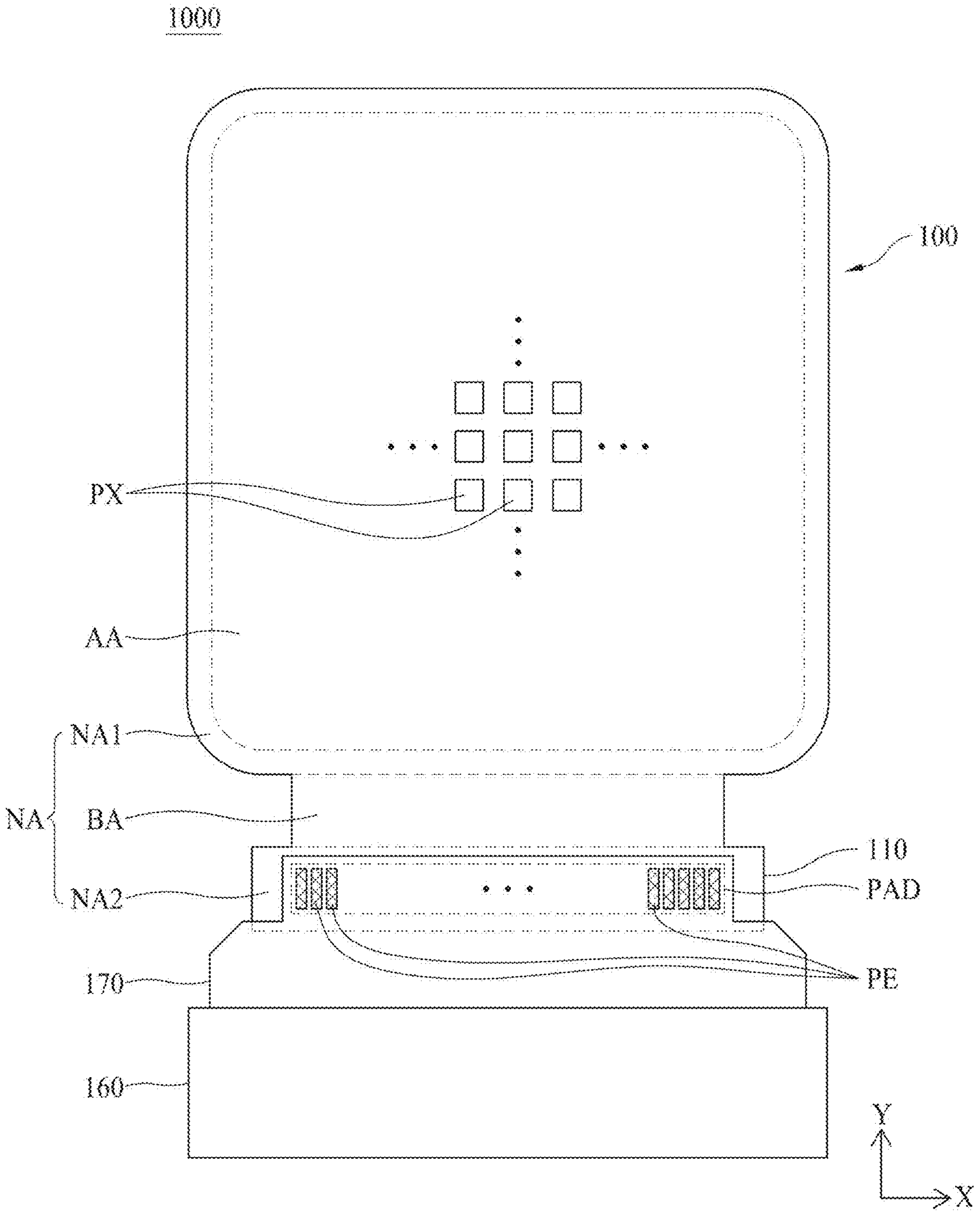
FIG. 2 is a plan view of a display apparatus according to an implementation of the present disclosure.
Figure 3:
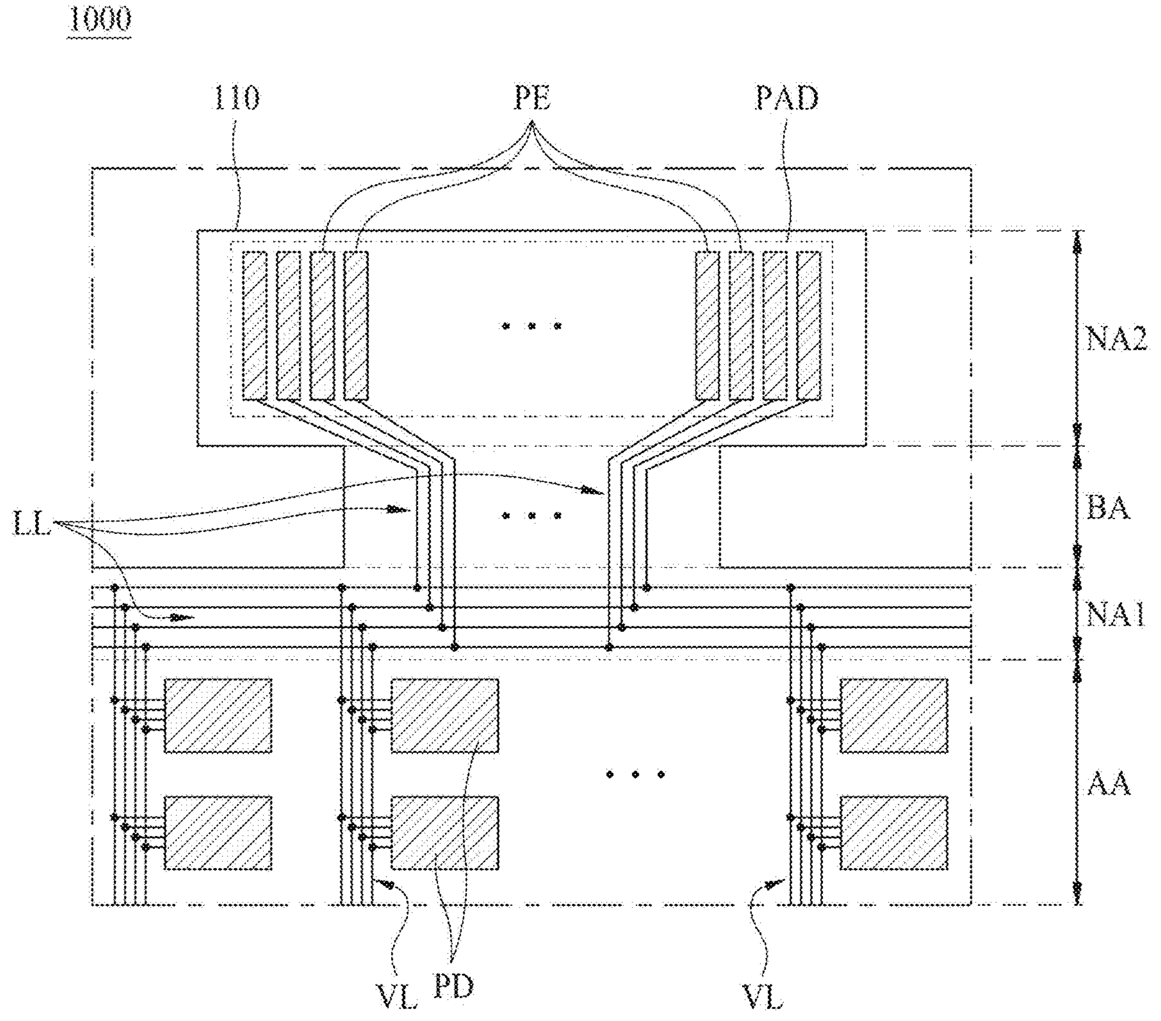
FIG. 3 is an enlarged view of a display apparatus according to an implementation of the present disclosure.

FIG. 2 is a plan view of a display apparatus according to an implementation of the present disclosure and FIG. 3 is an enlarged view of a display apparatus according to an implementation of the present disclosure.

Referring to FIGS. 2 and 3, the display apparatus 1000 can include the display panel 100, the flexible circuit board 170, and the printed circuit board 160.

The display panel 100 can include a substrate 110. The substrate 110 can be a member that supports other components of the display apparatus 1000. The substrate 110 can be made of an insulating material. For example, the substrate 110 can be made of glass or resin. Also, the substrate 110 can be made of a material having flexibility. For example, the substrate 110 can be made of a plastic material having flexibility, such as polyimide (PI). However, implementations of the present disclosure are not limited thereto.

For example, the display panel 100 can include a display area AA and a non-display area NA. For example, the substrate 110 can include the display area AA and the non-display area NA. The display area AA and the non-display area NA are not limited to the substrate 110 but can be described throughout the display apparatus 1000.

The display area AA can be an area in which an image is displayed. The display area AA can include a plurality of pixels PX. Each of the plurality of pixels PX can include a plurality of sub-pixels. A plurality of light emitting devices can be disposed in each of the plurality of sub-pixels. A plurality of light emitting devices can be configured to be different according to a type of the display apparatus 1000. For example, when the display apparatus 1000 is an inorganic light emitting display apparatus, the light emitting device can be a light-emitting diode (LED), a micro light-emitting diode (Micro-LED), or a mini-light-emitting diode (MLED).

The display area AA can be configured in various shapes according to a design of the display apparatus 1000. For example, the display area AA can be configured in a rectangular shape having four rounded corners. For another example, the display area AA can be configured in a rectangular having four corners, each of which has a right-angle shape, or a circular shape.

Referring to FIG. 3, a plurality of pixel driving circuits PD can be disposed in the display area AA. The plurality of pixel driving circuits PD can be circuits for driving light emitting devices of the plurality of sub-pixels. Each of the plurality of pixel driving circuits PD can include a storage capacitor and a plurality of transistors including a driving transistor. In addition, each of the plurality of pixel driving circuits PD can control a light emitting operation of the plurality of light emitting devices by supplying a control signal, a power source, and a driving current to the light emitting devices of the plurality of sub-pixels. For example, the pixel driving circuit PD can include a power line and a signal line for controlling light emission on/off and/or light emission time of the light emitting device. For example, the plurality of pixel driving circuits PD can be manufactured using a metal-oxide-silicon field effect transistor (MOSFET) manufacturing process on a semiconductor substrate, but implementations of the present disclosure are not limited thereto.

The non-display area NA can be an area in which no image is displayed. Various wirings, circuits, and the like for driving the plurality of pixels PX of the display area AA can be disposed in the non-display area NA. For example, various wirings and driving circuits can be mounted in the non-display area NA. Also, a pad part PAD to which an integrated circuit, a printed circuit, and the like is connected can be disposed in the non-display area NA.

For example, the driving circuit can be a data driving circuit and/or a gate driving circuit. Wirings to which a control signal for controlling the driving circuits is supplied can be disposed in the non-display area NA. For example, the control signal can include a clock signal, an input data enable signal, and synchronization signals. The control signal can be received through the pad part PAD. For example, link lines LL for transmitting a signal can be disposed in the non-display area NA. For example, a driving component such as the flexible circuit board 170 and the printed circuit board 160 can be connected to the pad part PAD.

According to the present disclosure, the non-display area NA can include a first non-display area NA1, a bending area BA, and a second non-display area NA2. For example, the first non-display area NA1 can be an area surrounding at least a portion of the display area AA. The bending area BA can be an area extending from at least one of a plurality of sides of the first non-display area NA1 and can be a bendable area. The second non-display area NA2 is an area extending from the bending area BA, and the pad part PAD can be disposed in the second non-display area NA2. For example, the bending area BA can be bent, and a remaining area of the substrate 110 except for the bending area BA can be flat. In this case, as the bending area BA is bent, the second non-display area NA2 can be disposed on a rear surface of the display area AA. However, implementations of the present disclosure are not limited thereto.

A plurality of link lines LL can be disposed in the non-display area NA. The plurality of link lines LL can be wirings for transmitting various signals from one or more flexible circuit boards (or flexible films) 170 and the printed circuit board 160 to the display area AA. The plurality of link lines LL can extend from a plurality of pad electrodes PE of the second non-display area NA2 toward the bending area BA and the first non-display area NA1 to be electrically connected to a plurality of driving lines VL of the display area AA. The plurality of pixel driving circuits PD can be driven by receiving signals from one or more flexible circuit boards (or flexible films) 170 and the printed circuit board 160 through the driving line VL in the display area AA and the link line LL in the non-display area NA.

For example, each of the driving line VL and the link line LL can be a wiring for transmitting a signal output from the flexible circuit board (or flexible film) 170 and the printed circuit board 160 to the pixel driving circuit PD. The driving line VL can be disposed in the display area AA to be electrically connected to the pixel driving circuit PD. The driving line VL can extend from the display area AA toward the non-display area NA to be electrically connected to the link line LL. Accordingly, the signal output from the flexible circuit board (or flexible film) 170 and the printed circuit board 160 can be transmitted to the pixel driving circuit PD through the link line LL and the driving line VL.

As the bending area BA is bent, a portion of the link line LL can also be bent with the bending area BA. Stress is concentrated on a portion of the bent link line LL, and thus, a crack can occur in the link line LL. The link line LL can be formed of a conductive material having excellent ductility in order to reduce cracks when the bending area BA is bent. For example, the link line LL can be formed of a conductive material having excellent ductility, such as gold (Au), silver (Ag), aluminum (Al), and the like, but implementations of the present disclosure are not limited thereto.

Also, the link line LL can be formed of one of various conductive materials used in the display area AA. For example, the link line LL can be formed of molybdenum (Mo), chromium (Cr), titanium (Ti), nickel (Ni), neodymium (Nd), copper (Cu), an alloy of silver (Ag) and magnesium (Mg), or an alloy of them, but implementations of the present disclosure are not limited thereto. The link line LL can be a multilayer structure including various conductive materials. For example, the link line LL can be a triple layer structure including titanium (Ti), aluminum (Al), and titanium (Ti), but implementations of the present disclosure are not limited thereto.

The link line LL can be configured in various shapes to reduce stress. At least a portion of the link line LL disposed on the bending area BA can extend in a same direction as the extending direction of the bending area BA, or can extend in a direction different from the extending direction of the bending area BA to reduce stress. For example, when the bending area BA extends in one direction from the first non-display area NA1 to the second non-display area NA2, at least a portion of the link line LL disposed on the bending area BA can extend in a direction inclined to the one direction. For another example, at least a portion of the link line LL can be formed in various shapes of patterns. For example, at least a portion of the link line LL disposed on the bending area BA can have a shape in which a conductive pattern having at least one of a diamond shape, a rhombus shape, a trapezoidal shape, a triangular wave shape, a sawtooth wave shape, a sinusoidal shape, a circular shape, and an omega shape is repeatedly arranged, but implementations of the present disclosure are not limited thereto. Therefore, in order to minimize the stress concentrated on the link line LL and the crack due to the stress, the shape of the link line LL can be formed in various shapes including the above-described shape.

According to the present disclosure, a width of the second non-display area NA2 in which the plurality of pad electrodes PE is disposed can be wider than a width of the bending area BA in which only the plurality of link lines LL is disposed. Also, a width of the display area AA in which the plurality of sub-pixels is disposed can be wider than the width of the bending area BA in which only the plurality of link line LL is disposed. Although the width of the bending area BA is shown to be narrower than a width of other areas of the substrate 110 in FIGS. 2 and 3, a shape of the substrate 110 including the bending area BA is an example, and thus, implementations of the present disclosure are not limited thereto.

A pad part PAD including the plurality of pad electrodes PE can be disposed in the second non-display area NA2. A driving component including one or more the flexible circuit boards (or flexible films) 170 and the printed circuit board 160 can be attached to or bonded to the pad part PAD. The plurality of pad electrodes PE are electrically connected to one or more flexible circuit boards (or flexible films), and can transmit various signals (or power) received from the printed circuit board 160 and the flexible circuit board (or flexible film) 170 to the plurality of pixel driving circuits PD in the display area AA.

The flexible circuit board (or flexible film) 170 can be a film having a flexibility and various components can be disposed on the flexible circuit board. For example, a driving IC such as a gate driver IC or a data driver IC can be disposed on the flexible circuit board (or flexible film). The driving IC can be a component that processes data and a driving signal for displaying an image. The driving IC can be disposed by a method of chip on glass (COG) or chip on film (COF) or a tape carrier package (TCP). The flexible circuit board (or flexible film) 170 can be attached to or bonded on the plurality of pad electrodes PE through a conductive adhesive layer.

The printed circuit board 160 can be electrically connected to one or more flexible circuit boards (or flexible films) 170, and supply signals to the driving IC. The printed circuit board 160 can be disposed on one side of the flexible circuit board (or flexible film) 170 to be electrically connected to the flexible circuit board (or flexible film). Various components for supplying various signals to the driving IC can be disposed on the printed circuit board 160. For example, various components, such as a timing controller, a power supply part, a memory, a processor, etc., can be disposed on the printed circuit board 160. For example, the printed circuit board 160 can include a power management integrated circuit (PMIC).

Figure 4:
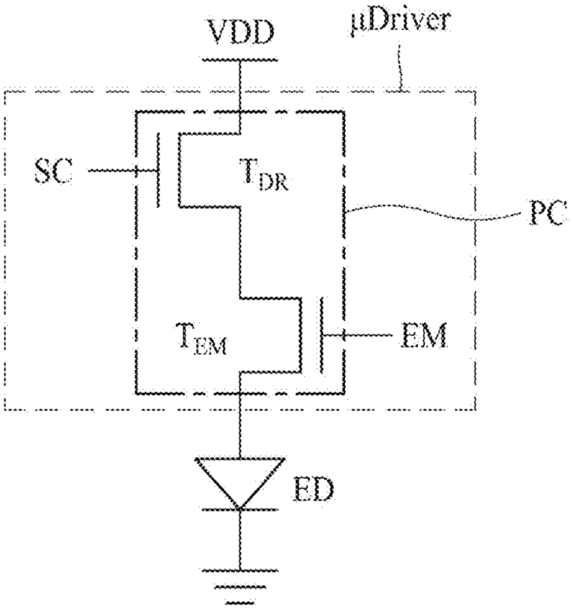
FIG. 4 is a diagram illustrating a circuit structure according to an implementation of the present disclosure.

FIG. 4 is a diagram illustrating a circuit structure according to an implementation of the present disclosure.

Figure 9:
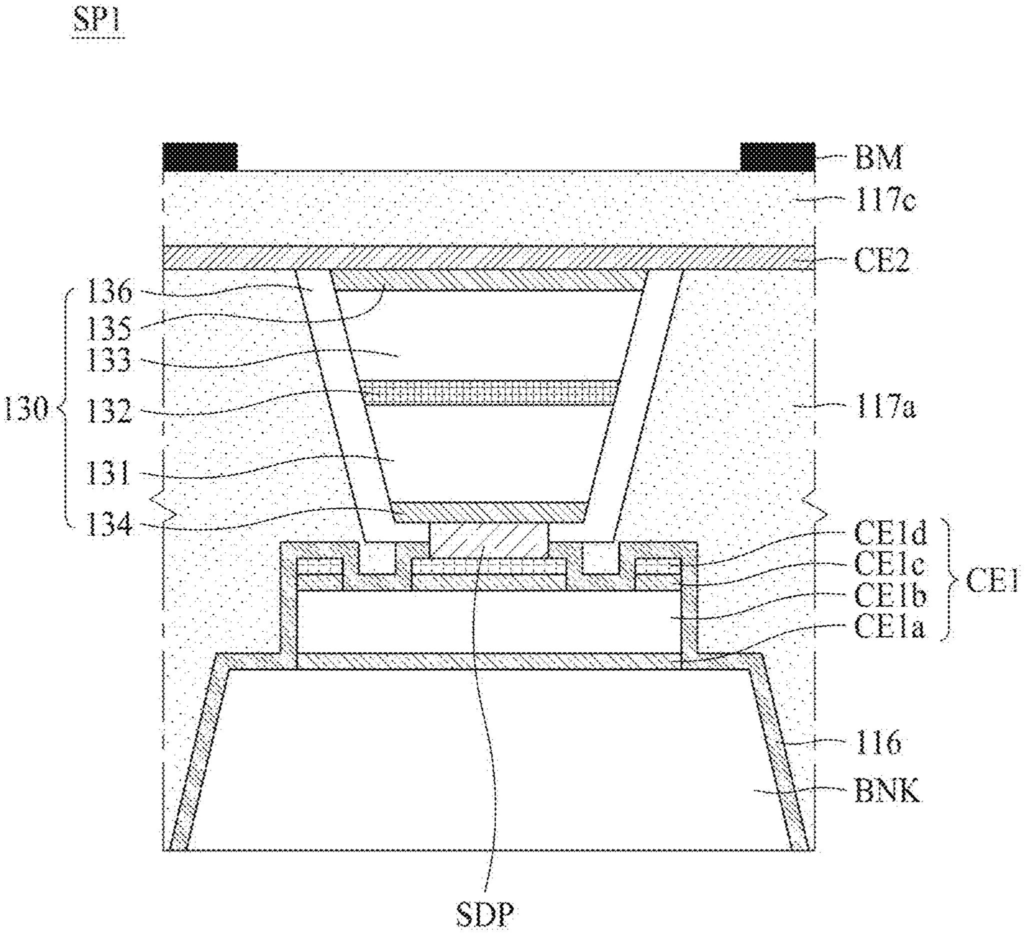
FIG. 9 is another cross-sectional view of a display apparatus according to an implementation of the present disclosure.

The pixel driving circuit PD described with reference to FIG. 3 can be a micro-driver (pDriver) illustrated in FIG. 4. FIG. 9 illustrates that one light emitting device ED is connected to one micro-driver (uDriver), but is not limited thereto. For example, eight light emitting devices ED can be connected to one micro-driver (uDriver). For another example, 16 light emitting devices ED can be connected to one micro-driver (uDriver) and 32 light emitting devices ED or 64 light emitting devices ED can be connected to one micro-driver (uDriver) at the same time. The light emitting device ED can be a micro light emitting device (uLED). In addition, one pixel driving circuit PD (e.g., micro-driver (uDriver)) can be connected to at least two light emitting devices ED. In this case, one pixel driving circuit PD (e.g., micro-driver (uDriver)) can include one or more circuits illustrated in FIG. 4.

One micro-driver (uDriver) can include a driving transistor TDR and a light emitting transistor TEM, but implementations of the present disclosure are not limited thereto.

For example, a high potential power voltage VDD can be applied to a first electrode of the driving transistor TDR, a first electrode of the light emitting transistor TEM can be connected to a second electrode of the driving transistor TDR, and a scan signal SC can be applied to a gate electrode of the driving transistor TDR. The scan signal SC applied to the gate electrode of the driving transistor TDR is a direct current power source, and a fixed reference voltage can be applied in every frame, but implementations of the present disclosure are not limited thereto.

The second electrode of the driving transistor TDR can be connected to a first electrode of the light emitting transistor TEM, the light emitting device ED can be connected to a second electrode of the light emitting transistor TEM, and a light emitting signal EM can be applied to a gate electrode of the light emitting transistor TEM. The light emitting signal EM applied to the gate electrode of the light emitting transistor TEM can be a pulse width modulation signal (PWM) that changes in every frame.

A first electrode of the light emitting device ED can be connected to the second electrode of the light emitting transistor TEM, and a second electrode of the light emitting device ED can be connected to ground. For example, the first electrode of the light emitting device ED can be an anode electrode and the second electrode of the light emitting device ED can be a cathode electrode.

Each of the driving transistor TDR and the light emitting transistor TEM can be an n-type transistor or a p-type transistor.

In the micro-driver (uDriver), the driving transistor TDR can be turned on by the scan signal SC applied from a timing controller T-CON and the light emitting transistor TEM can be turned on by the light emitting signal EM. A driving current can be applied to the light emitting device ED through the driving transistor TDR and the light emitting transistor TEM by the high potential power voltage VDD applied to the first electrode of the driving transistor TDR, and thus the light emitting device ED can emit light.

Figure 5:
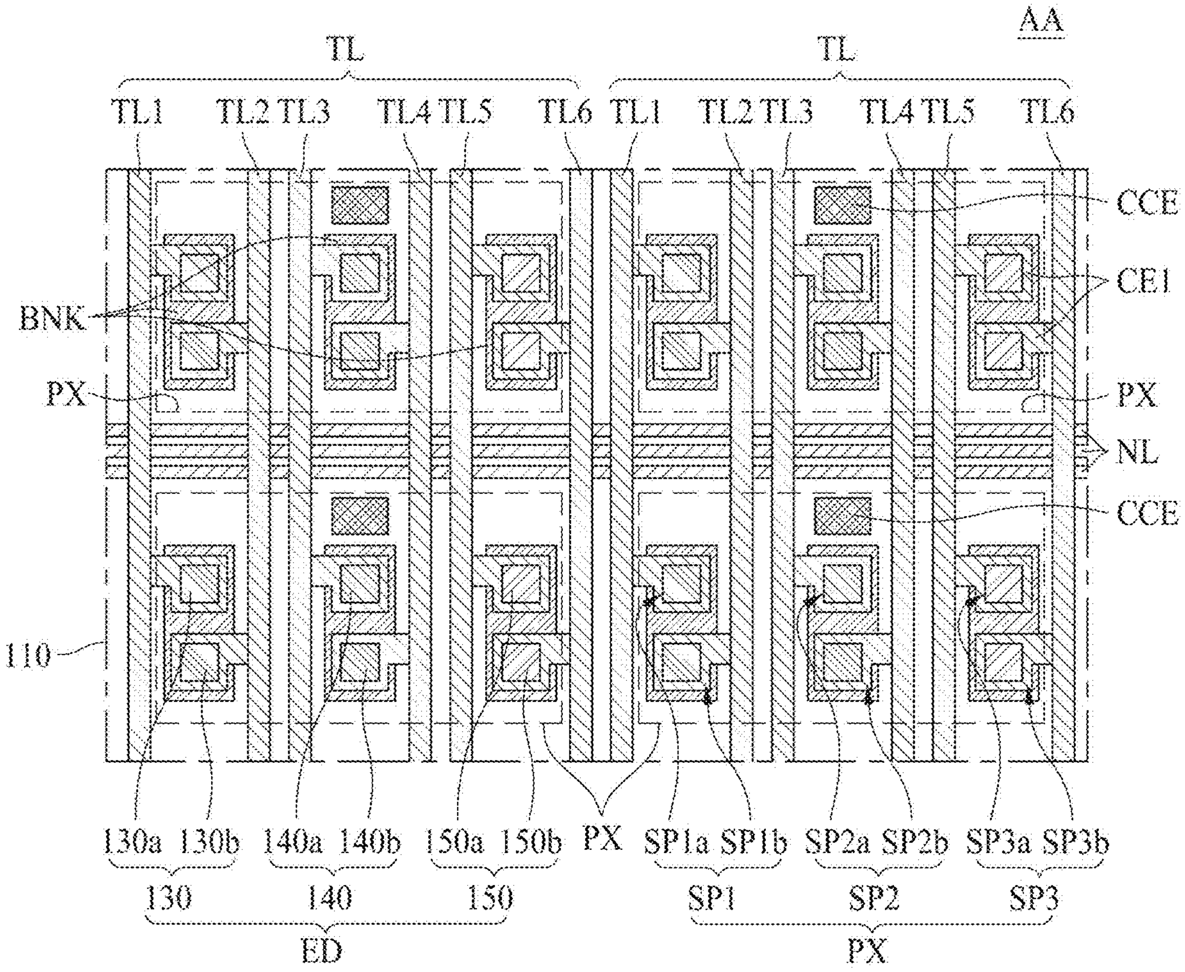
FIGS. 5 to 7 are plan views of a display apparatus according to an implementation of the present disclosure.
Figure 6:
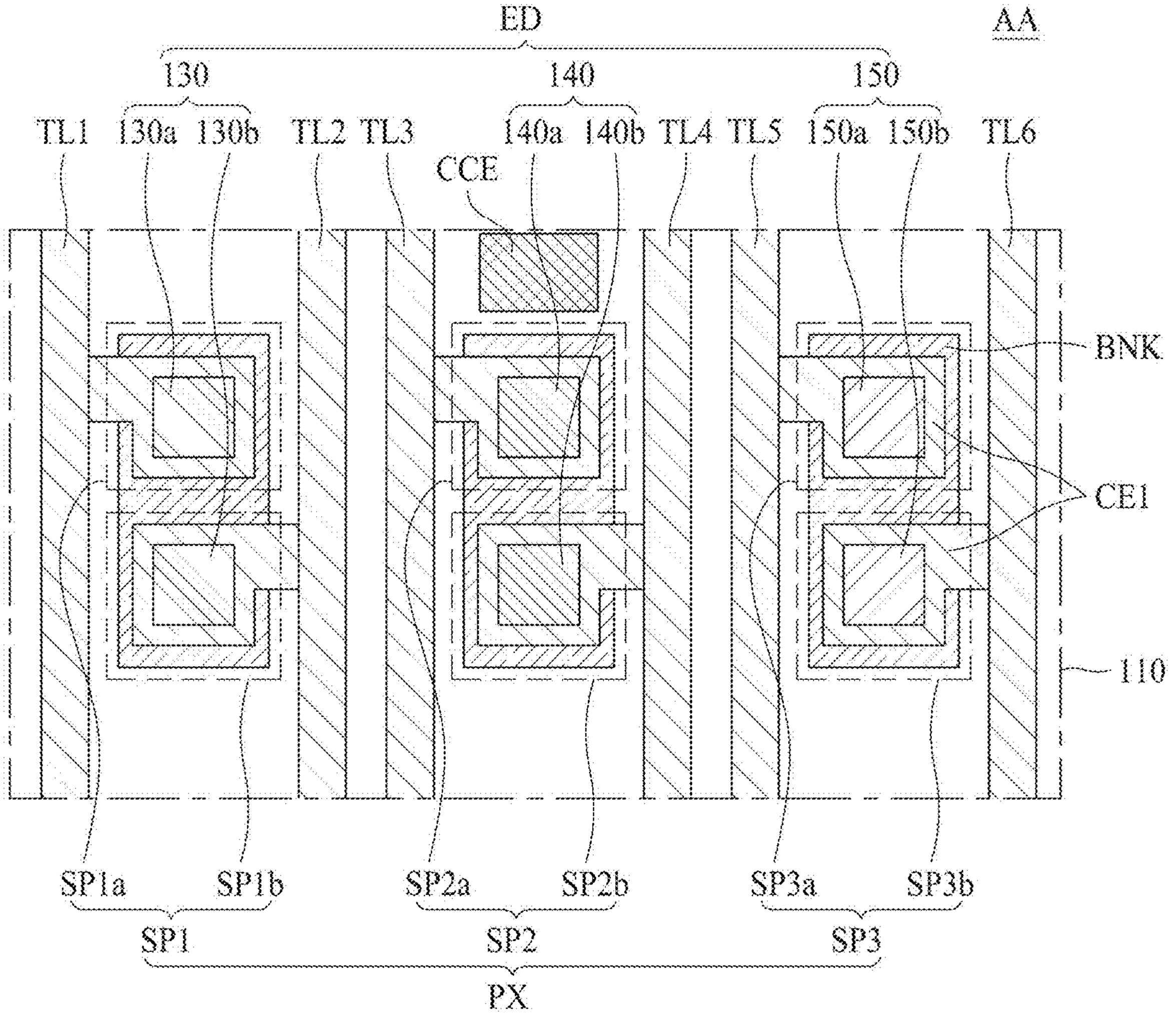
Figure 7:
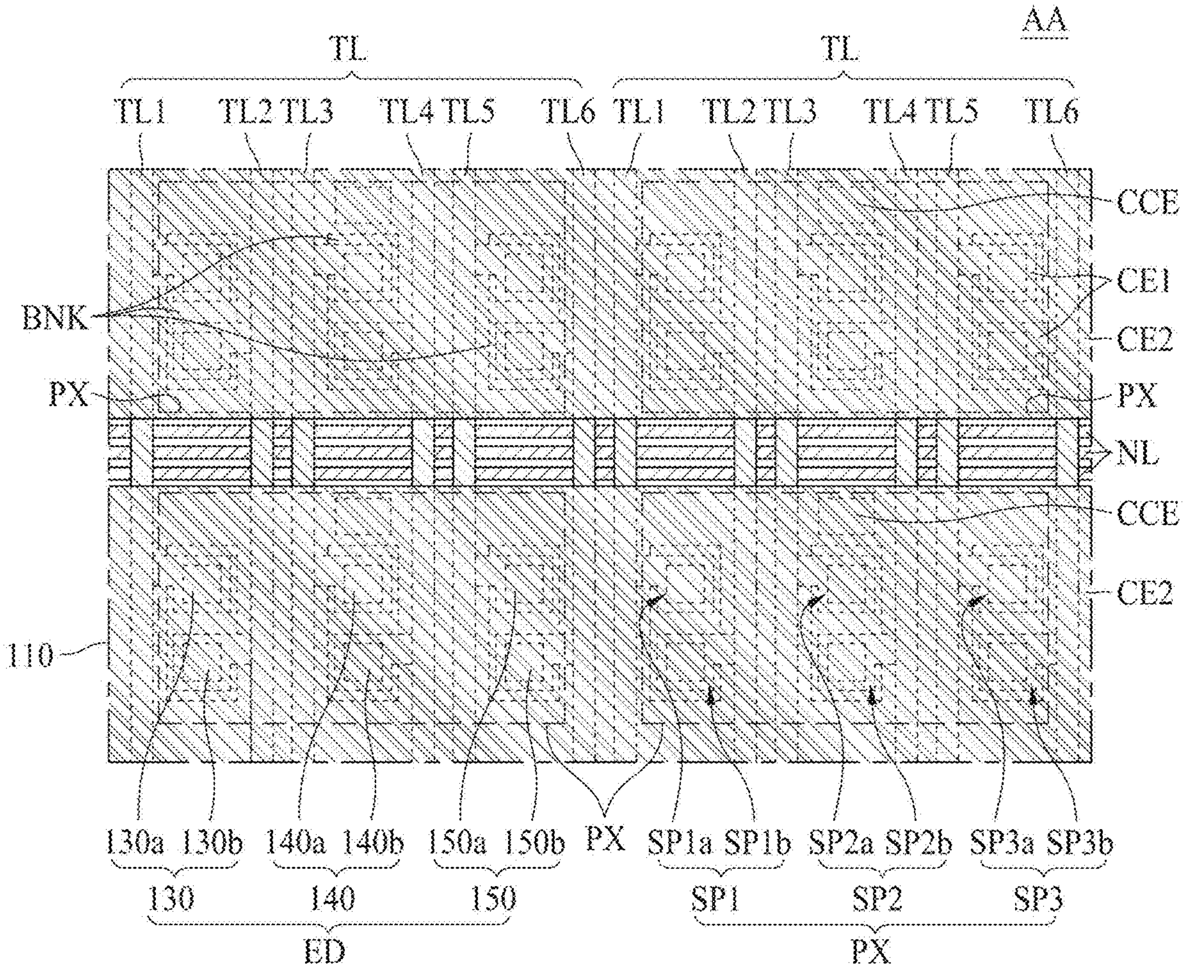

FIGS. 5 to 7 are plan views of a display apparatus according to an implementation of the present disclosure. For example, FIG. 5 is an enlarged plan view of a display area including a plurality of pixels. For example, FIG. 6 is an enlarged plan view of a display area including a pixel. For example, FIG. 7 is an enlarged plan view of a display area including a plurality of pixels. Although FIGS. 5 and 6 illustrate a plurality of signal lines TL, a plurality of communication lines NL, a plurality of first electrodes CE1, a plurality of banks BNK, and a plurality of light emitting devices ED, implementations of the present disclosure are not limited thereto. FIG. 7 is an enlarged plan view in which the plurality of second electrodes CE2 are additionally disposed compared to FIG. 5, for convenience, an area overlapping the second electrodes CE2 is indicated by a dotted line in FIG. 7.

Referring to FIGS. 5 to 7, a plurality of pixels PX including a plurality of sub-pixels can be disposed in the display area AA. Each of the plurality of sub-pixels includes a light emitting device ED and can independently emit light. The plurality of sub-pixels can be configured in a plurality of rows and a plurality of columns and can be disposed in a matrix form, but implementations of the present disclosure are not limited thereto.

The plurality of sub-pixels can include a first sub-pixel SP1, a second sub-pixel SP2, and a third sub-pixel SP3. For example, any one of the first sub-pixel SP1, the second sub-pixel SP2, and the third sub-pixel SP3 can be a red sub-pixel, another can be a green sub-pixel, and the other can be a blue sub-pixel. Types of the plurality of sub-pixels are examples, and implementations of the present disclosure are not limited thereto.

Each of the plurality of pixels PX can include one or more first sub-pixels SP1, one or more second sub-pixels SP2, and one or more third sub-pixels SP3. For example, one pixel PX can include a pair of first sub-pixels SP1, a pair of second sub-pixels SP2, and a pair of third sub-pixels SP3. The pair of first sub-pixels SP1 can include a 1-1th sub-pixel SPla and a 1-2th sub-pixel SP1*b*. The pair of second sub-pixels SP2 can include a 2-1th sub-pixel SP2*a* and a 2-2th sub-pixel SP2*b*. The pair of third sub-pixels SP3 can include a 3-1th sub-pixel SP3*a* and a 3-2th sub-pixel SP3*b*. For example, one pixel PX can include the 1-1th sub-pixel SPla, the 1-2th sub-pixel SP2*a*, the 2-1th sub-pixel SP2*a*, the 2-2th sub-pixel SP2*b*, the 3-1th sub-pixel SP3*a*, and the 3-1th sub-pixel SP3*b*, but implementations of the present disclosure are not limited thereto.

The plurality of sub-pixels constituting one pixel PX can be variously arranged. For example, in one pixel PX, the pair of first sub-pixels SP1 can be disposed in the same column, the pair of second sub-pixels SP2 can be disposed in the same column, and the pair of third sub-pixels SP3 can be disposed in the same column. The first sub-pixel SP1, the second sub-pixel SP2, and the third sub-pixel SP3 can be disposed in the same row. The number and arrangement of the plurality of sub-pixels constituting one pixel PX are examples, and implementations of the present disclosure are not limited thereto.

The plurality of signal lines TL can be disposed in an area between the plurality of sub-pixels. The plurality of signal lines TL can extend in a column direction between the plurality of sub-pixels. The plurality of signal lines TL can be lines that transmit an anode voltage from the pixel driving circuit PD (showed in FIG. 3) to the plurality of sub-pixels. For example, the signal line TL can be electrically connected to the pixel driving circuit PD and the first electrode CE1 of the sub-pixel. The anode voltage output from the pixel driving circuit PD (for example, from the micro-driver (uDriver)) can be transmitted to the first electrode CE1 of the sub-pixel through the signal line TL. For example, the first electrode CE1 can be an electrode electrically connected to the anode electrode of the light emitting device ED. The anode voltage transmitted through the signal line TL can be transmitted to the anode electrode of the light emitting device ED through the first electrode CE1.

In the present disclosure, instead of forming a plurality of transistors and storage capacitors in each of the plurality of sub-pixels, the pixel driving circuit PD in which the plurality of pixel circuits is integrated is used, and thus, a structure of the display apparatus 1000 can be simplified. In addition, because a circuit disposed in each of the plurality of sub-pixels is integrated in one pixel driving circuit PD, high efficiency and low power driving can be possible.

The plurality of signal lines TL can include a first signal line TL1, a second signal line TL2, a third signal line TL3, a fourth signal line TLA, a fifth signal line TL5, and a sixth signal line TL6. Each of the first signal line TL1 and the second signal line TL2 can be electrically connected to the pair of first sub-pixels SP1. Each of the third signal line TL3 and the fourth signal line TLA can be electrically connected to the pair of second sub-pixels SP2. Each of the fifth signal line TL5 and the sixth signal line TL6 can be electrically connected to the pair of third sub-pixels SP3.

The first signal line TL1 can be disposed at one side of the pair of first sub-pixels SP1, and the second signal line TL2 can be disposed at the other side of the pair of first sub-pixels SP1. The first signal line TL1 can be electrically connected to one of the pair of first sub-pixels SP1, for example, the first electrode CE1 of the 1-1th sub-pixel SPla. The second signal line TL2 can be electrically connected to the remaining first sub-pixel SP1 of the pair of first sub-pixels SP1, for example, the first electrode CE1 of the 1-2th sub-pixel SP1*b*.

The third signal line TL3 can be disposed at one side of the pair of second sub-pixels SP2, and the fourth signal line TL4 can be disposed at the other side of the pair of second sub-pixels SP2. For example, the third signal line TL3 can be disposed adjacent to the second signal line TL2. The third signal line TL3 can be electrically connected to one of the pair of second sub-pixels SP2, for example, the first electrode CE1 of the 2-1th sub-pixel SP2*a*. The fourth signal line TLA can be electrically connected to the remaining second sub-pixel SP2 of the pair of second sub-pixels SP2, for example, the first electrode CE1 of the 2-2th sub-pixel SP2*b*.

The fifth signal line TL5 can be disposed at one side of the pair of third sub-pixels SP3, and the sixth signal line TL6 can be disposed at the other side of the pair of third sub-pixels SP3. For example, the fifth signal line TL5 can be disposed adjacent to the fourth signal line TL4. The sixth signal line TL6 can be disposed adjacent to the first signal line TL1 connected to the adjacent pixel PX. The fifth signal line TL5 can be electrically connected to one of the pair of third sub-pixels SP3, for example, the first electrode CE1 of the 3-1th sub-pixel SP3*a*. The sixth signal line TL6 can be electrically connected to the remaining third sub-pixel SP3 of the pair of third sub-pixels SP3, for example, the first electrode CE1 of the 3-2th sub-pixel SP3*b*.

The signal line TL can be formed of a conductive material. For example, the signal line TL can be formed of the conductive material such as titanium (Ti), aluminum (Al), copper (Cu), molybdenum (Mo), nickel (Ni), chromium (Cr), indium tin oxide (ITO), indium zinc oxide (IZO), indium gallium zinc oxide (IGZO), etc., but implementations of the present disclosure are not limited thereto. For another example, the plurality of signal lines TL can be formed of a multilayer structure of a conductive material. For example, the plurality of signal lines TL can be formed of the multilayer structure in which titanium (Ti), aluminum (Al), titanium (Ti), and indium tin oxide (ITO) are stacked.

The plurality of communication lines NL can be disposed in an area between adjacent pixels PX. The communication line NL can be disposed to extend in a row direction in an area between the adjacent pixels PX. The communication line NL can be disposed in an area between adjacent electrodes CE2 and may not overlap the adjacent second electrodes CE2. For example, the communication line NL can be a wiring used for short-range communication such as near field communication (NFC). The communication line NL can function as an antenna.

According to the present disclosure, a bank BNK can be disposed in each of the plurality of sub-pixels. The bank BNK can be a structure in which the plurality of light emitting devices ED is disposed. The plurality of banks BNK can guide positions of the plurality of light emitting devices ED in a transfer process of the plurality of light emitting devices ED. The plurality of light emitting devices ED can be transferred onto the plurality of banks BNK in the transfer process of the plurality of light emitting devices ED. The entire area of the light emitting device ED can overlap the bank BNK. The plurality of banks BNK can be bank patterns or construction, but implementations of the present disclosure are not limited thereto.

A bank BNK of the first sub-pixel SP1, a bank BNK of the second sub-pixel SP2, and a bank BNK of the third sub-pixel SP3 can be disposed to be spaced apart from each other. The bank BNK of the first sub-pixel SP1, the bank BNK of the second sub-pixel SP2, and the bank BNK of the third sub-pixel SP3 can be configured to be separated. Accordingly, the banks BNK of the first sub-pixel SP1, the second sub-pixel SP2, and the third sub-pixel SP3 to which different types of light emitting devices ED are transferred can be easily identified.

The bank BNK of the 1-1th sub-pixel SPla and the bank BNK of the 1-2th sub-pixel SP1*b* can be connected to each other or can be spaced apart from each other. For example, the bank BNK of the 1-1st sub-pixel SPla and the bank BNK of the 1-2th sub-pixel SP1*b* in which the same light emitting device ED is disposed can be connected or can be separated or spaced apart from each other in consideration of design such as transfer process requirements. Also, the bank BNK of the 2-1th sub-pixel SP2*a* and the bank BNK of the 2-2th sub-pixel SP2*b* can be connected to each other or can be separated or spaced apart from each other. The bank BNK of the 3-1th sub-pixel SP3*a* and the bank BNK of the 3-2th sub-pixel SP3*b* can be connected to each other or can be separated or spaced apart from each other. Accordingly, the bank BNK of the pair of first sub-pixels SP1, the bank BNK of the pair of second sub-pixels SP2, and the bank BNK of the pair of third sub-pixels SP3 can be variously formed.

For example, each of the plurality of banks BNK can be formed of an organic insulating material. Each of the plurality of banks BNK can be formed of a single layer or a multilayer of an organic insulating material. For example, each of the plurality of banks BNK can be formed of a photo resist, a polyimide (PI), an acryl-based material, or the like.

The first electrode CE1 can be disposed in each of the plurality of sub-pixels. The first electrode CE1 can overlap the bank BNK to be disposed on the bank BNK. The first electrode CE1 can be electrically connected to one of the plurality of signal lines TL. At least a portion of the first electrode CE1 can extend to an outside of the bank BNK to be electrically connected to the signal line TL closest to the first electrode CE1. A portion of the first electrode CE1 can overlap the bank BNK, and the rest of the first electrode CE1 may not overlap the bank BNK. For example, a portion of the first electrode CE1 of the 1-1th sub-pixel SPla can extend to one side area of the 1-1th sub-pixel SP1*a* to be electrically connected to the first signal line TL1, and a portion of the first electrode CE1 of the 1-2th sub-pixel SP1*b* can extend to the other side area of the 1-2th sub-pixel SP1*b* to be electrically connected to the second signal line TL2. A portion of the first electrode CE1 of the 2-1th sub-pixel SP2*a* can extend to one side area of the 2-1th sub-pixel SP2*a* to be electrically connected to the third signal line TL3, and a portion of the first electrode CE1 of the 2-2th sub-pixel SP2*b* can extend to the other side area of the 2-2th sub-pixel SP2*b* to be electrically connected to the fourth signal line TL4. A portion of the first electrode CE1 of the 3-1th sub-pixel SP3*a* can extend to one side area of the 3-1th sub-pixel SP3*a* to be electrically connected to the fifth signal line TL5, and a portion of the first electrode CE1 of the 3-2th sub-pixel SP3*b* can extend to the other side area of the 3-2th sub-pixel SP3*b* to be electrically connected to the sixth signal line TL6.

The first electrode CE1 is electrically connected to the anode electrode of the light emitting device ED. The anode voltage from the pixel driving circuit PD can be transmitted to the light emitting device ED via the signal line TL and the first electrode CE1. A different voltage can be applied to the first electrode CE1 of each of the plurality of sub-pixels according to an image that is displayed. For example, different voltage can be applied to the first electrode CE1 of each of the plurality of sub-pixels. Accordingly, the first electrode CE1 can be referred to as a pixel electrode.

The first electrode CE1 can be formed of a conductive material. For example, the first electrode CE1 can be formed integrally with the signal line TL. For example, the first electrode CE1 can be formed of the same conductive material as the signal line TL, but implementations of the present disclosure are not limited thereto. For example, the first electrode CE1 can be formed of the conductive material such as titanium (Ti), aluminum (Al), copper (Cu), molybdenum (Mo), nickel (Ni), chromium (Cr), indium tin oxide (ITO), indium zinc oxide (IZO), indium gallium zinc oxide (IGZO), and the like. For another example, the first electrode CE1 can be formed of a multilayer structure of the conductive material. For example, the plurality of first electrodes CE1 can be formed of the multilayer structure in which titanium (Ti), aluminum (Al), titanium (Ti), and indium tin oxide (ITO) are stacked.

The light emitting device ED can be disposed in each of a plurality of sub-pixels. The plurality of light emitting device ED can be any one of a light-emitting diode (LED) and a micro light-emitting diode (Micro LED). The plurality of light emitting devices ED can overlap the bank BNK and the first electrode CE1 to be disposed on the bank BNK and the first electrode CE1. The entire area of the light emitting device ED can overlap the bank BNK and the first electrode CE1.

The light emitting devices ED can be disposed on the first electrode CE1 and can be electrically connected to the first electrode CE1. Accordingly, the light emitting device ED can emit light by using the anode voltage from the pixel driving circuit PD through the signal line TL and the first electrode CE1.

The plurality of light emitting devices ED can include a first light emitting device 130, a second light emitting device 140, and a third light emitting device 150. The first light emitting device 130 can be disposed in the first sub-pixel SP1. The second light emitting device 140 can be disposed in the second sub-pixel SP2. The third light emitting device 150 can be disposed in the third sub-pixel SP3. For example, one of the first light emitting device 130, the second light emitting device 140, and the third light emitting device 150 can be a red light emitting device, another can be a green light emitting device, and the other can be a blue light emitting device, but implementations of the present disclosure are not limited thereto. Light of various colors including white can be implemented by combining red light, green light, and blue light emitted from the plurality of light emitting devices ED. Types of the plurality of light emitting devices ED are examples, and implementations of the present disclosure are not limited thereto.

The first light emitting device 130 can include a 1-1th light emitting device 130*a* disposed in the 1-1th sub-pixel SP1*a* and a 1-2th light emitting device 130*b* disposed in the 1-2th sub-pixel SP1*b*. The second light emitting device 140 can include a 2-1th light emitting device 140*a* disposed in the 2-1th sub-pixel SP2*a* and a 2-2th light emitting device 140*b* disposed in the 2-2th sub-pixel SP2*b*. The third light emitting device 150 can include a 3-1th light emitting device 150*a* disposed in the 3-1th sub-pixel SP3*a* and a 3-2th light emitting device 150*b* disposed in the 3-2th sub-pixel SP3*b*.

The second electrode CE2 can be disposed in each of the plurality of sub-pixels. The second electrode CE2 can be disposed on the light emitting device ED. The second electrode CE2 can be electrically connected to the pixel driving circuit PD through a plurality of contact electrodes CCE.

For example, the second electrode CE2 can be electrically connected to the cathode electrode of the light emitting device ED to transmit the cathode voltage from the pixel driving circuit PD to the light emitting device ED. The same cathode voltages can be applied to the second electrodes CE2 of the plurality of sub-pixels. For example, the same voltages can be applied to the second electrodes CE2 of the plurality of sub-pixels and the cathode electrodes of the light emitting device ED. Accordingly, the second electrode CE2 can be referred to as a common electrode.

At least some of the plurality of sub-pixels can share the second electrode CE2. Some of the second electrodes CE2 of the plurality of sub-pixels can be integrally formed to be electrically connected to each other. When the same voltage is applied to the second electrode CE2, the second electrodes CE2 of some of the sub-pixels can be shared to be used. For example, the second electrodes CE2 of some of the pixels PX arranged in the same row in the horizontal direction can be integrally formed and connected to each other. For example, one second electrode CE2 can be disposed in the plurality of pixels PX. One second electrode CE2 can be disposed for every n sub-pixels.

For example, some of the second electrodes CE2 of the plurality of sub-pixels can be spaced apart from each other or separated from each other. For example, the second electrode CE2 connected to the pixels PX of an n-th row and the second electrode CE2 connected to the pixels PX of an n+1th row can be spaced apart from each other or separated from each other. For example, the plurality of second electrodes CE2 can be spaced apart from each other with the plurality of communication lines NL extending in a row direction interposed therebetween. Accordingly, the number of the plurality of sub-pixels can be greater than the number of the plurality of second electrodes CE2.

The plurality of second electrodes CE2 can be formed of a transparent conductive material, but implementations of the present disclosure are not limited thereto. When the plurality of second electrodes CE2 are formed of the transparent conductive material, light emitted from the light emitting device ED is directed to an upper portion of the second electrode CE2. For example, the second electrode CE2 can be formed of the transparent conductive material such as indium tin oxide (ITO), indium zinc oxide (IZO), indium gallium zinc oxide (IGZO), or the like.

A plurality of contact electrodes CCE can be disposed on the substrate 110. For example, the plurality of contact electrodes CCE can be spaced apart from the plurality of banks BNK and the plurality of signal lines TL. Each of the plurality of second electrodes CE2 can overlap at least one contact electrode CCE. For example, one second electrode CE2 can overlap the plurality of contact electrodes CCE.

For example, the plurality of contact electrodes CCE can be electrically connected to the plurality of second electrodes CE2. The plurality of contact electrodes CCE can be disposed between the substrate 110 and the plurality of second electrodes CE2 to transmit the cathode voltage from the pixel driving circuit PD to the second electrode CE2.

For example, when a micro LED is used as the light emitting device ED, a plurality of micro LEDs can be formed in a wafer and the micro LEDs can be transferred to the substrate 110, and thus the display panel 100 can be manufactured. Various defects can occur in the process of transferring the plurality of light emitting devices ED having a micro size from the wafer to the substrate 110. For example, a non-transmission defect in which the light emitting device ED is not transferred can occur in some sub-pixels, and a defect in which the light emitting device ED is transferred out of a correct position due to an alignment error can occur in some sub-pixels. Also, even if the transfer process has proceeded normally, the transferred light emitting device ED itself can be a defect. Accordingly, the plurality of the same light emitting devices ED can be transferred to one sub-pixel in consideration of the defect during the transfer process of the plurality of light emitting devices ED. After the lighting test of the plurality of light emitting devices ED is performed, only one light emitting device ED finally determined to be normal can be used.

For example, the 1-1th light emitting device 130*a* and the 1-2th light emitting device 130*b* can be transferred to one pixel PX, and it is possible to inspect whether there is a defect in the 1-1th light emitting device 130*a* and the 1-2th light emitting device 130*b*. If both of the 1-1th light emitting device 130*a* and the 1-2th light emitting device 130*b* are determined to be normal, only the 1-1th light emitting device 130*b* can be used and the 1-2th light emitting device 130*b* can be not used. As another example, if only the 1-2th light emitting device 130*b* of the 1-1th light emitting device 130*a* and the 1-2th light emitting device 130*b* is determined to be normal, the 1-1th light emitting device 130*a* is not be used and only the 1-2th light emitting device 130*b* can be used. Therefore, even if the plurality of the same light emitting devices ED are transferred to one pixel PX, only one light emitting device ED can be finally used.

In this case, any one of the pair of light emitting devices ED can be referred to as a main or primary light emitting device ED, and the other light emitting device ED can be referred to as a redundancy light emitting device ED. The redundancy light emitting device ED can be an extra light emitting device ED transferred to prepare for a defect in the main light emitting device ED. When the main light emitting device ED is defective, the redundancy light emitting device ED can be used instead of the main light emitting device ED. The main light emitting device ED and the redundancy light emitting device ED are transferred to one pixel PX, thereby minimizing deterioration of display quality due to defects in the main light emitting device ED and the redundancy light emitting device ED.

For example, the 1-1th light emitting device 130*a*, the 2-1th light emitting device 140*a*, and the 3-1th light emitting device 150*a* transferred to one pixel PX can be used as the main light emitting device ED, and the 1-2th light emitting device 130*b*, the 2-2th light emitting device 140*b*, and the 3-2th light emitting device 150*b* can be used as the redundancy light emitting device ED.

Figure 8:
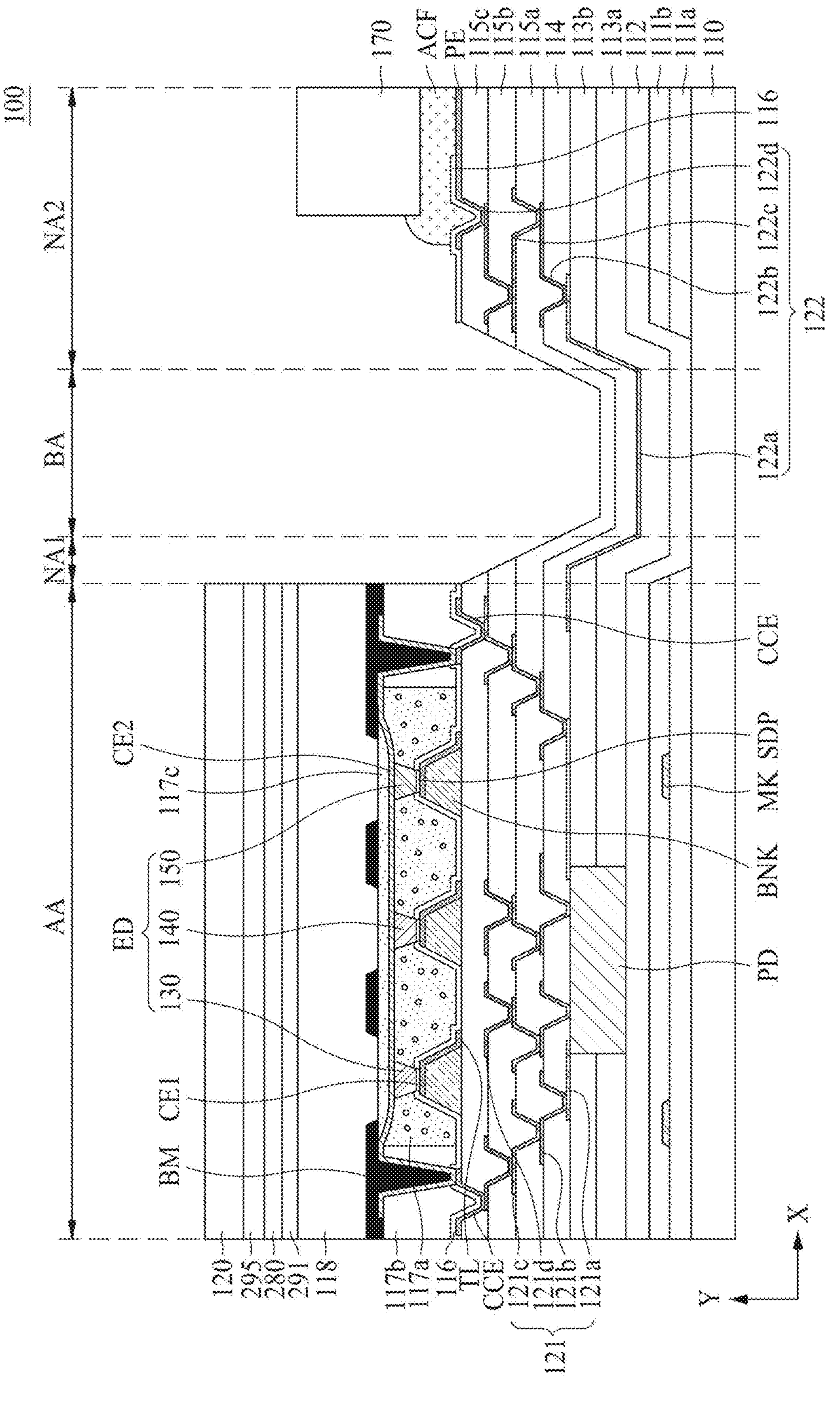
FIG. 8 is a cross-sectional view of a display apparatus according to an implementation of the present disclosure.

FIG. 8 is a cross-sectional view of a display apparatus according to an implementation of the present disclosure and FIG. 9 is another cross-sectional view of a display apparatus according to an implementation of the present disclosure. For example, FIG. 8 is a cross-sectional view of the display area AA, the first non-display area NA, the bending area BA, and the second non-display area NA2, and FIG. 9 is a cross-sectional view of a portion of the display area AA.

Referring to FIG. 8, a first buffer layer 111*a* and a second buffer layer 111*b* can be disposed in the remaining area of the substrate 110 except the bending area BA.

The first buffer layer 111*a* and the second buffer layer 111*b* can be disposed in the display area AA, the first non-display area NA1, and the second non-display area NA2. The first buffer layer 111*a* and the second buffer layer 111*b* can reduce penetration of moisture or impurities through the substrate 110. The first buffer layer 111*a* and the second buffer layer 111*b* can be formed of an inorganic insulating material. For example, each of the first buffer layer 111*a* and the second buffer layer 111*b* can be formed of a single layer composed of silicon oxide (SiOx) or silicon nitride (SiNx) or a multilayer including at least on of silicon oxide (SiOx) and silicon nitride (SiNx), but implementations of the present disclosure are not limited thereto For example, portions of the first buffer layer 111*a* and the second buffer layer 111*b* on the bending area BA can be removed. An upper surface of the substrate 110 disposed in the bending area BA cannot be covered by the first buffer layer 111*a* and the second buffer layer 111*b* to be exposed. When the first buffer layer 111*a* and the second buffer layer 111*b* made of the inorganic insulating material are removed from the bending area BA, cracks, which can occur during bending, in the first buffer layer 111*a* and the second buffer layer 111*b* can be minimized.

A plurality of alignment keys MK can be disposed between the first buffer layer 111*a* and the second buffer layer 111*b*. The plurality of alignment keys MK can be formed to identify a position of the pixel driving circuit PD during a manufacturing process of the display panel 100. For example, the plurality of alignment keys MK can align the position of the pixel driving circuit PD transferred onto an adhesive layer 112. However, the plurality of alignment keys MK can be omitted.

An adhesive layer 112 can be disposed on the second buffer layer 111*b*. The adhesive layer 112 can be disposed in the display area AA, the first non-display area NA1, the bending area BA, and the second non-display area NA2. For another example, a portion of the adhesive layer 112 can be removed from the non-display area NA including the bending area BA. For example, the adhesive layer 112 can be formed of any one of an Adhesive polymer, an epoxy resin, a UV curable resin, a polyimide-based resin, an acrylate-based material, a urethane-based material, and a polydimethylsiloxane (PDMS), but implementations of the present disclosure are not limited thereto.

In the display area AA, the pixel driving circuit PD can be disposed on the adhesive layer 112. The pixel driving circuit PD can be mounted on the adhesive layer 112 through a transfer process, but implementations of the present disclosure are not limited thereto.

A first protective layer 113*a* and a second protective layer 113*b* can be disposed on the adhesive layer 112 and the pixel driving circuit PD. The first protective layer 113*a* and the second protective layer 113*b* can surround a side surface of the pixel driving circuit PD, but implementations of the present disclosure are not limited thereto. For example, the second protective layer 113*b* can cover at least a portion of an upper surface of the pixel driving circuit PD. For example, at least one of the first protective layer 113*a* and the second protective layer 113*b* disposed on the bending area BA can be omitted. For example, the first protective layer 113*a* can be entirely disposed in the display area AA and the non-display area NA. Also, the second protective layer 113*b* can be partially disposed in the display area AA, the first non-display area NA1, and the second non-display area NA2. Moreover, the second protective layer 113*b* may not be disposed in the bending area BA. For example, a portion of the second protective layer 113*b* in the bending area BA can be removed.

The first protective layer 113*a* and the second protective layer 113*b* can be formed of an organic insulating material, but implementations of the present disclosure are not limited thereto. For example, the first protective layer 113*a* and the second protective layer 113*b* can be formed of a photo resist, polyimide (PI), a photo acryl-based material, or the like, but implementations of the present disclosure are not limited thereto. For example, the first protective layer 113*a* and the second protective layer 113*b* can be an overcoating layer or an insulating layer, but implementations of the present disclosure are not limited thereto.

According to the present disclosure, a plurality of first connection lines 121 can be disposed on the second protective layer 113*b* in the display area AA. The first connection line 121 can be a wiring for electrically connecting the pixel driving circuit PD to other elements. For example, the pixel driving circuit PD can be electrically connected to the signal line TL, the contact electrodes CCE, and the like through the first connection line 121. For example, the first connection line 121 can include a 1-1th connection line 121*a*, a 1-2th connection line 121*b*, a 1-3th connection line 121*c*, and a 1-4th connection line 121*d*.

For example, the plurality of 1-1th connection lines 121*a* can be disposed on the second protective layer 113*b*. The plurality of 1-1th connection lines 121*a* can be electrically connected to the pixel driving circuit PD. The 1-1th connection lines 121*a* can transmit voltages output from the pixel driving circuit PD to the first electrode CE1 or the second electrode CE2.

For example, a third protective layer 114 can be disposed on the second protective layer 113*b*. The third protective layer 114 can be disposed on the entire display area AA and the non-display area NA. In the bending area BA, the third protective layer 114 can disposed on or cover a side surface of the second protective layer 113*b* and an upper surface of the first protective layer 113*a*. The third protective layer 114 can be formed of an organic insulating material. For example, the third protective layer 114 can be formed of a photo resist, polyimide (PI), a photo acryl-based material, or the like. For example, the first protective layer 113*a*, the second protective layer 113*b*, and the third protective layer 114 can be formed of the same material, but implementations of the present disclosure are not limited thereto.

The plurality of 1-2th connection lines 121*b* can be disposed on the third protective layer 114. The 1-2th connection lines 121*b* can be connected to the pixel driving circuit PD through the 1-1th connection lines 121*a* or can be directly connected to the pixel driving circuit PD. For example, a portion of the 1-2th connection line 121*b* can be directly connected to the pixel driving circuit PD through a contact hole of the third protective layer 114. The other portion of the 1-2th connection wiring 121*b* can be electrically connected to the 1-1th connection line 121*a* through a contact hole of the third protective layer 114. However, implementations of the present disclosure are not limited thereto. For example, the voltage output from the pixel driving circuit PD can be transmitted to the first electrode CEL or the second electrode CE2 through a connection line different from the 1-2th connection lines 121*b*.

A first insulating layer 115*a* can be disposed on the plurality of 1-2-th connection lines 121*b*. The first insulating layer 115*a* can be disposed in the entire display area AA and the non-display area NA, but implementations of the present disclosure are not limited thereto. The first insulating layer 115*a* can be formed of an organic insulating material, but implementations of the present disclosure are not limited thereto. For example, the first insulating layer 115*a* can be formed of a photo resist, polyimide (PI), a photo acryl-based material, or the like.

The plurality of 1-3th connection lines 121*c* can be disposed on the first insulating layer 115*a*. The 1-3th connection lines 121*c* can be electrically connected to the 1-2th connection lines 121*b*. For example, the 1-3th connection lines 121*c* can be electrically connected to the 1-2th connection lines 121*b* through a contact hole of the first insulating layer 115*a*.

A second insulating layer 115*b* can be disposed on the plurality of 1-3th connection lines 121*c*. The second insulating layer 115*b* can be disposed in the remaining area except for the bending area BA, but implementations of the present disclosure are not limited thereto. The second insulating layer 115*b* can be disposed in the display area AA, the first non-display area NA1, and the second non-display area NA2, but implementations of the present disclosure are not limited thereto. For example, at least a portion of the second insulating layer 115*b* disposed in the bending area BA can be removed. The second insulating layer 115*b* can be formed of an organic insulating material, but implementations of the present disclosure are not limited thereto. For example, the second insulating layer 115*b* can be formed of a photo resist, polyimide (PI), a photo acryl-based material, or the like.

The plurality of 1-4th connection lines 121*d* can be disposed on the second insulating layer 115*b*. The 1-4th connection lines 121*d* can be electrically connected to the 1-3th connection lines 121*c*. For example, the 1-4th connection lines 121*d* can be electrically connected to the 1-3th connection lines 121*c* through a contact hole of the second insulating layer 115*b*.

The 1-4th connection line 121*d* can be connected to the contact electrode CCE through a contact hole of a third insulating layer 115*c*, and thus, the contact electrode CCE and the pixel driving circuit PD can be electrically connected to the first connection line 121.

The 1-4th connection line 121*d* can be directly connected to the signal line TL through a contact hole disposed in the third insulating layer 115*c*, or can be electrically connected to the signal ling TL through other additional line or electrode, and thus, the signal line TL and the pixel driving circuit PD can be electrically connected by the first connection line 121.

According to the present disclosure, a plurality of second connection lines 122 can be disposed on the second protective layer 113*b* in the non-display area NA. The second connection lines 122 can be a wiring for transmitting a signal received from the flexible circuit board (or a flexible film) 170 and a printed circuit board 160 to the pixel driving circuit PD of the display area AA.

For example, the plurality of second connection lines 122 can be electrically connected to the plurality of pad electrodes PE to receive signals from flexible circuit boards (or flexible films) 170 and printed circuit boards 160.

For example, the plurality of second connection lines 122 can extend from the pad part PAD toward the display area AA to transmit signals to the wirings of the display area AA. In this case, each of the plurality of second connection lines 122 can function as link lines LL (showed in FIG. 3). The second connection line 122 can include a 2-1th connection line 122*a*, a 2-2th connection line 122*b*, a 2-3th connection line 122*c*, and a 2-4th connection line 122*d*.

The plurality of 2-1th connection lines 122*a* can be disposed on the second protective layer 113*b*. The plurality of 2-1th connection lines 122*a* can extend from the second non-display area NA2 to the bending area BA and the first non-display area NA1. The plurality of 2-1 connection lines 122*a* can transmit signals received from the flexible circuit board (or flexible film 170 and the printed circuit board 160 to the pixel driving circuit PD of the display area AA. Accordingly, the 2-1th connection line 122*a* can be electrically connected to the pad electrode PE and the pixel driving circuit PD, respectively. For example, the 2-1 connection line 122*a* can extend to the display area AA to be directly connected to the pixel driving circuit PD in the display area AA, or can be electrically connected to the pixel driving circuit PD through other additional line or electrodes. Also, the 2-1 connection line 122*a* can be electrically connected to the pad electrode PE in the second non-display area NA2 through the 2-2 connection line 122*b*, the 2-3 connection line 122*c*, and the 2-4 connection line 122*d*. Therefore, the pixel driving circuit PD and the pad electrode PE can be electrically connected by the second connection line 122.

The plurality of 2-2th connection lines 122*b* can be disposed on the third protective layer 114. 2-2th connection lines 122*b* can be disposed in the second non-display area NA2. The 2-2 connection lines 122*b* can be electrically connected to the 2-1th connection lines 122*a* through a contact hole of the third protective layer 114. Therefore, signals from the flexible circuit board (or flexible film) 170 and the printed circuit board 160 can be transmitted to the 2-1 connection lines 122*a* through the 2-2 connection lines 122*b*.

The 2-3th connection line 122*c* can be disposed on the first insulating layer 115*a*. The 2-3th connection line 122*c* can be disposed in the second non-display area NA2. The 2-3th connection line 122*c* can be electrically connected to the 2-2th connection line 122*b* through a contact hole of the first insulating layer 115*a*. Accordingly, signals from the flexible circuit board (or flexible film) 170 and the printed circuit board 160 can be transmitted to the 2-1th connection line 122*a* through the 2-3th connection line 122*c* and the 2-2th connection line 122*b*.

The 2-4th connection line 122*d* can be disposed on the second insulating layer 115*b*. The 2-4th connection line 122*d* can be disposed in the second non-display area NA2. The 2-4th connection line 122*d* can be electrically connected to the 2-3th connection line 122*c* through a contact hole of the second insulating layer 115*b*. Accordingly, signals from the flexible circuit board (or flexible film) 170 and the printed circuit board 160 can be transmitted to the 2-1th connection line 122*a* through the 2-4th connection line 122*d*, the 2-3th connection line 122*c*, and the 2-2 connection line 122*b*.

Each of the first connection line 121 and the second connection line 122 can be formed of a conductive material having excellent ductility or various conductive materials used in the display area AA. For example, the second connection line 122 partially disposed in the bending area BA can be formed of a conductive material having excellent ductility, such as gold (Au), silver (Ag), or aluminum (Al), but implementations of the present disclosure are not limited thereto. For another example, each of the first connection lines 121 and the second connection lines 122 can be formed of molybdenum (Mo), chromium (Cr), titanium (Ti), nickel (Ni), neodymium (Nd), copper (Cu), an alloy of silver (Ag) and magnesium (Mg), or an alloy thereof, but implementations of the present disclosure are not limited thereto.

A third insulating layer 115*c* can be disposed on the plurality of first connection lines 121 and the plurality of second connection lines 122. The third insulating layer 115*c* can be disposed in the remaining area except for the bending area BA, but implementations of the present disclosure are not limited thereto. The third insulating layer 115*c* can be disposed in the display area AA, the first non-display area NA1, and the second non-display area NA2. At least a portion of the third insulating layer 115*c* in the bending area BA can be removed. The third insulating layer 115*c* can be formed of an organic insulating material, but implementations of the present disclosure are not limited thereto. For example, the third insulating layer 115*c* can be formed of a photo resist, polyimide (PI), a photo acryl-based material, or the like.

A bank BNK can be disposed on the third insulating layer 115*c* in the display area AA. The bank BNK can overlap the sub-pixel. The bank BNK may not be disposed in the first non-display area NA1, the second non-display area NA2, and the bending area BA. One or more light emitting devices ED of the same type can be disposed on an upper portion of the bank BNK.

In the display area AA, a plurality of signal lines TLs can be disposed on the third insulating layer 115*c*. The signal line TL can be disposed between the plurality of banks BNK. For example, the signal line TL can be disposed adjacent to any one of the plurality of banks BNK. The signal line TL can be electrically connected to the first connection line 121, for example, the 1-4th connection line 121*d*.

A plurality of contact electrodes CCE can be disposed on the third insulating layer 115*c* in the display area AA. The contact electrode CCE can supply the cathode voltage from the pixel driving circuit PD to the second electrode CE2. The contact electrodes CCE can be electrically connected to the first connection line 121, for example, the 1-4th connection line 121*d*.

A first electrode CE1 can be disposed on the bank BNK. For example, the first electrode CE1 can extend from the adjacent signal line TL to an upper portion of the bank BNK. The first electrode CE1 can be disposed on an upper surface of the bank BNK and a side surface of the bank BNK. For example, the first electrode CE1 can extend from the signal line TL on an upper surface of the third insulating layer 115*c* to the side surface of the bank BNK and the upper surface of the bank BNK. The first electrode CE1 can be integrally formed with the signal line TL.

Referring to FIG. 9, the first electrode CE1 can include a plurality of conductive layers. For example, the first electrode CE1 can include a first conductive layer CEla, a second conductive layer CE1*b*, a third conductive layer CElc, and a fourth conductive layer CEld.

The first conductive layer CEla can be disposed on the bank BNK. The second conductive layer CElb can be disposed on the first conductive layer CEla. The third conductive layer CEIc can be disposed on the second conductive layer CE1*b*, and the fourth conductive layer CEld can be disposed on the third conductive layer CElc. For example, the first conductive layer CEla, the second conductive layer CE1*b*, the third conductive layer CEIc, and the fourth conductive layer CEld can be formed of titanium (Ti), molybdenum (Mo), aluminum (Al), or titanium (Ti) and indium tin oxide (ITO), but implementations of the present disclosure are not limited thereto.

According to the present disclosure, some of the plurality of conductive layers included in the first electrode CE1 having high reflection efficiency can be used as an alignment key and/or a reflector for aligning the light emitting device ED. For example, the second conductive layer CE1*b* among the plurality of conductive layers of the first electrode CE1 can include a reflective material. For example, the second conductive layer CElb can include aluminum (Al). In this case, the second conductive layer CE1*b* can be used as a reflective plate.

Also, due to a high reflection efficiency of the second conductive layer CE1*b*, identification can be easily performed in a manufacturing process, and thus an arrangement position or a transfer position of the light emitting device ED can be arranged with respect to the second conductive layer CE1*b*.

For example, in order to use the second conductive layer CE1*b* as the reflective plate, the third conductive layer CE1*c* and the fourth conductive layer CE1*d* covering the second conductive layer CElb can be partially removed or etched. For example, portions of the third and fourth conductive layers CE1*c* and CE1*d* disposed on the bank BNK can be removed or etched to expose an upper surface of the second conductive layer CE1*b*. For example, a central portion and an edge portion of the third and fourth conductive layers CE1*c* and CE1*d* on which a solder pattern SDP is disposed can remain, and remaining portions except for the center portion and the edge portion of the third and fourth conductive layers CE1*c* and CE1*d* can be removed. For example, the central portion and the edge portion of each of the third conductive layer CE1*c* made of titanium (Ti) and the fourth conductive layer CE1*d* made of indium tin oxide (ITO) may not be etched. Thus, another conductive layer of the first electrode CE1 can be prevented from being corroded by a TMAH (Tetra Methyl Ammonium Hydroxide) solution used in a mask process of the first electrode CE1.

According to the present disclosure, the first conductive layer CE1*a* and the third conductive layer CE1*c* can include titanium (Ti) or molybdenum (Mo). The second conductive layer CE1*b* can include aluminum (Al). The fourth conductive layer CE1*d* can include a transparent conductive oxide layer, such as indium tin oxide (ITO) or indium zinc oxide (IZO), which has high adhesion to the solder pattern SDP and has corrosion resistance and acid resistance. However, implementations of the present disclosure are not limited thereto.

The first conductive layer CE1*a*, the second conductive layer CE1*b*, the third conductive layer CE1*c*, and the fourth conductive layer CE1*d* can be sequentially deposited and then patterned by a photolithography process and an etching process, but implementations of the present disclosure are not limited thereto.

According to the present disclosure, each of the signal line TL, the contact electrode CCE, and the pad electrode PE disposed on the same layer as the first electrode CE1 can be formed of multiple layers of conductive materials, but implementations of the present disclosure are not limited thereto. For example, each of the signal line TL, the contact electrode CCE, and the pad electrode PE can be formed of multiple layers in which indium tin oxide (ITO), titanium (Ti), aluminum (Al), and titanium (Ti) are stacked.

According to the present disclosure, a solder pattern SDP can be disposed on the first electrode CE1 in each of the plurality of sub-pixels. The solder pattern SDP can bond the light emitting device ED to the first electrode CE1. The first electrode CE1 and the light emitting device ED can be electrically connected to each other through eutectic bonding using the solder pattern SDP, but implementations of the present disclosure are not limited thereto. For example, when the solder pattern SDP is formed of indium (In), and the anode electrode 134 of the light emitting device ED is formed of gold (Au), the solder pattern SDP and the anode electrode 134 can be bonded to each other by applying heat and pressure in the transfer process of the light emitting device ED. The light emitting device ED can be bonded to the solder pattern SDP and the first electrode CE1 without a separate adhesive member through eutectic bonding. For example, the solder pattern SDP can be formed of indium (In), tin (Sn), or alloys thereof, but implementations of the present disclosure are not limited thereto. For example, the solder pattern SDP can be a bonding pad or the like.

According to the present disclosure, a passivation layer 116 can be disposed on the plurality of signal lines TL, the plurality of first electrodes CE1, the plurality of contact electrodes CCE, and the third insulation layer 115*c*. For example, the passivation layer 116 can be disposed in the display area AA, the first non-display area NA1, and the second non-display area NA2. A portion of the passivation layer 116 disposed in the bending area BA can be removed. A portion of the passivation layer 116 covering the plurality of pad electrodes PE can be removed in the second non-display area NA2. A portion of the passivation layer 116 covering the plurality of contact electrodes CCE can be removed in the display area AA. The passivation layer 116 covering the solder pattern SDP can be removed in the display area AA. The passivation layer 116 can cover the first electrode CE1. The passivation layer 116 can cover a portion of the exposed upper surface of a second conductive layer CE1*b*.

Because the passivation layer 116 covers the remaining areas while exposing a portion of the plurality of pad electrodes PE, a portion of the plurality of contact electrodes CCE and a portion of the solder pattern SDP, penetration of moisture or impurities flowing into the light emitting device ED can be reduced. For example, the passivation layer 116 can be formed of a single layer or multiple layers including silicon oxide (SiOx) or silicon nitride (SiNx), but implementations of the present disclosure are not limited thereto. For example, the passivation layer 116 can be a protective layer or an insulating layer. For example, the passivation layer 116 can include a hole exposing the solder pattern SDP and a hole exposing the contact electrode CCE.

In each of the plurality of sub-pixels, the light emitting device ED can be disposed on the solder pattern SDP. The first light emitting device 130 can be disposed in the first sub-pixel SP1. The second light emitting device 140 can be disposed in the second sub-pixel SP2. The third light emitting device 150 can be disposed in the third sub-pixel SP3.

The light emitting device ED can be formed on silicon wafers by means of metal organic vapor deposition (MOCVD), chemical vapor deposition (CVD), plasma-enhanced chemical vapor deposition (PECVD), molecular beam growth (MBE), hydride vapor deposition (HVPE), or sputtering, but implementations of the present disclosure are not limited thereto.

Referring to FIG. 9, the first light emitting device 130 can include an anode 134, a first semiconductor layer 131, an active layer 132, a second semiconductor layer 133, a cathode 135, and an encapsulation layer 136, but implementations of the present disclosure are not limited thereto. For example, the encapsulation layer 136 may not be included in the first light emitting device 130.

The first semiconductor layer 131 can be disposed on the solder pattern SDP. The second semiconductor layer 133 can be disposed on the first semiconductor layer 131.

For example, each of the first semiconductor layer 131 and the second semiconductor layer 133 can formed of a compound semiconductor such as a group III-V or a group II-VI, and can be doped with impurities (or dopants). For example, one of the first semiconductor layer 131 and the second semiconductor layer 133 can be a semiconductor layer doped with n-type impurities, and the other can be a semiconductor layer doped with p-type impurities. For example, each of the first semiconductor layer 131 and the second semiconductor layer 133 can be a layer in which an n-type or p-type impurity is doped into a material such as gallium nitride (GaN), gallium phosphide (GaP), gallium arsenic phosphide (GaAsP), aluminum gallium indium phosphide (AlGaInP), indium aluminum phosphide (InAIP), aluminum gallium nitride (AlGaN), aluminum indium nitride (AlInN), aluminum gallium nitride (AlInGaN), aluminum gallium arsenic (AlGaAs), gallium arsenic (AlGaAs), or a material such as gallium arsenic (GaAs). For example, the n-type impurity can be silicon (Si), germanium (Ge), selenium (Se), carbon (C), tellurium (Te), tin (Sn), or the like. For example, the p-type impurity can be magnesium (Mg), zinc (Zn), calcium (Ca), strontium (Sr), barium (Ba), beryllium (Be), or the like, For example, each of the first semiconductor layer 131 and the second semiconductor layer 133 can be a nitride semiconductor including the n-type impurity and a nitride semiconductor including the p-type impurity. For example, the first semiconductor layer 131 can be a nitride semiconductor including the p-type impurity, and the second semiconductor layer 133 can be a nitride semiconductor including the n-type impurity.

The active layer 132 can be disposed between the first semiconductor layer 131 and the second semiconductor layer 133. The active layer 132 can emit light by receiving holes and electrons from the first semiconductor layer 131 and the second semiconductor layer 133. For example, the active layer 132 can be formed of one of a single well structure, a multi-well structure, a single quantum well structure, a multi-quantum well (MQW) structure, a quantum dot structure, and a quantum line structure. For example, the active layer 132 can be formed of indium gallium nitride (InGaN), gallium nitride (GaN), or the like.

For another example, the active layer 132 can include a multi-quantum well (MQW) structure having a well layer and a barrier layer having a band gap higher than that of the well layer. For example, the active layer 132 can include InGaN as a well layer, and can include an AlGaN layer as a barrier layer.

The anode 134 can be disposed between the first semiconductor layer 131 and the solder pattern SDP. For example, the anode 134 can electrically connect the first semiconductor layer 131 to the first electrode CE1. The anode voltage output from the pixel driving circuit PD can be applied to the first semiconductor layer 131 through the signal line TL, the first electrode CE1, and the anode 134. For example, the anode 134 can be formed of a conductive material capable of eutectic bonding with the solder pattern SDP. For example, the anode 134 can be formed of gold (Au), tin (Sn), tungsten (W), silicon (Si), silicon (Ag), titanium (Ti), iridium (Ir), chromium (In), indium (Zn), zinc (Pb), lead (Ni), platinum (Pt), copper (Cu), or alloys thereof.

The cathode 135 can be disposed on the second semiconductor layer 133. For example, the cathode 135 can electrically connect the second semiconductor layer 133 to the second electrode CE2. The cathode voltage output from the pixel driving circuit PD can be applied to the second semiconductor layer 133 through the contact electrode CCE, the second electrode CE2, and the cathode 135. The cathode 135 can be formed of a transparent conductive material to allow light emitted from the light emitting device ED to be directed to an upper portion of the light emitting device ED. For example, the cathode 135 can be formed of a material such as indium tin oxide (ITO), indium zinc oxide (IZO), indium gallium zinc oxide (IGZO), or the like.

The encapsulation layer 136 can be disposed on at least a portion of each of the first semiconductor layer 131, the active layer 132, the second semiconductor layer 133, the anode 134, and the cathode 135. For example, the encapsulation layer 136 can surround at least a portion of each of the first semiconductor layer 131, the active layer 132, the second semiconductor layer 133, the anode 134, and the cathode 135.

For example, the encapsulation layer 136 can protect the first semiconductor layer 131, the active layer 132, and the second semiconductor layer 133. For example, the encapsulation layer 136 can be disposed on a side surface of the first semiconductor layer 131, a side surface of the active layer 132, and a side surface of the second semiconductor layer 133.

For example, the encapsulation layer 136 can be disposed on at least a portion of the anode 134 and the cathode 135. For example, the encapsulation layer 136 can be disposed on the edge portion (or one side) of the anode 134 and the edge portion (or one side) of the cathode 135. At least a portion of the anode 134 can be exposed by the encapsulation layer 136, and thus the anode 134 can connect with the solder pattern SDP. For example, at least a portion of the cathode 135 can be exposed by the encapsulation layer 136, and thus the cathode 135 can connect with the second electrode CE2. For example, the encapsulation layer 136 can be formed of an insulating material such as silicon nitride (SiNx) or silicon oxide (SiOx).

For another example, the encapsulation layer 136 can be a layer in which a reflective material is distributed in a resin layer. For example, the encapsulation layer 136 can be manufactured as a reflector having various structures. Light emitted from the active layer 132 can be reflected upward by the encapsulation layer 136 so that light extraction efficiency can be improved. In this case, the encapsulation layer 136 can be a reflective layer.

In the present disclosure, the light emitting device ED has been described as a vertical structure, but implementations of the present disclosure are not limited thereto. For example, the light emitting device ED can have a lateral structure or a flip chip structure.

Although the first light emitting device 130 has been described with reference to FIG. 9, the second light emitting device 140 and the third light emitting device 150 can have substantially the same structure as the first light emitting device 130. For example, each of the second light emitting device 140 and the third light emitting device 150 can have substantially the same configuration as the first semiconductor layer 131, the active layer 132, the second semiconductor layer 133, the anode 134, the cathode 135, and the encapsulation layer 136.

As shown in FIGS. 8 and 9, according to a present disclosure, a first optical layer 117*a* surrounding the plurality of light emitting devices ED can be disposed in the display area AA. For example, the first optical layer 117*a* can cover the side surfaces of the light emitting devices ED and the side surfaces of the plurality of banks BNK. For example, the first optical layer 117*a* can cover a portion of the passivation layer 116. For example, the first optical layer 117*a* can be disposed between the second electrode CE2, the passivation layer 116, and the plurality of light emitting devices ED. The first optical layer 117*a* can be disposed between the plurality of light emitting devices ED included in one pixel PX and cover the plurality of light emitting devices ED included in one pixel PX. Also, the first optical layer 117*a* can be disposed between the plurality of banks BNK included in one pixel PX and cover the plurality of light emitting devices ED included in one pixel PX. For example, the first optical layer 117*a* can extend in the first direction X, and the plurality of first optical layers 117*a* can be spaced apart from each other in the second direction Y in a plan view. For example, the first optical layer 117*a* can be disposed between the passivation layer 116 and the second electrode CE2 to surround the side surface of the light emitting device ED and the side surface of the bank BNK. For example, the first optical layer 117*a* can be referred to as a diffusion layer, a sidewall diffusion layer, or the like.

The first optical layer 117*a* can include an organic insulating material in which fine particles are distributed. For example, the first optical layer 117*a* can be formed of siloxane in which fine metal particles such as titanium dioxide ($TiO_2$) particles are distributed. Light from the plurality of light emitting devices ED can be scattered by fine particles distributed in the first optical layer 117*a* and emitted to an outside of the display panel 100. Accordingly, the first optical layer 117*a* can improve extraction efficiency of light emitted from the plurality of light emitting devices ED.

For example, the first optical layer 117*a* can be disposed in each of the plurality of pixels PX or can be disposed in some pixels PX disposed in the same row, but implementations of the present disclosure are not limited thereto. For example, the first optical layer 117*a* can be disposed in each of the plurality of pixels PX, or the plurality of pixels PX can share one first optical layer 117*a*. For another example, each of the plurality of sub-pixels can separately include a first optical layer 117*a*.

According to the present disclosure, the second optical layer 117*b* can be disposed on the passivation layer 116 in the display area AA. For example, the second optical layer

117*b* can surround the first optical layer 117*a*. For example, the second optical layer 117*b* can be in contact with a side surface of the first optical layer 117*a*. For example, the second optical layer 117*b* can be disposed in an area between the plurality of pixels PX. However, implementations of the present disclosure are not limited thereto. For example, the second optical layer 117*b* can be referred to as a diffusion layer, a window diffusion layer, or the like.

The second optical layer 117*b* can be formed of an organic insulating material, but implementations of the present disclosure are not limited thereto. The second optical layer 117*b* can be formed of the same material as the first optical layer 117*a*, but implementations of the present disclosure are not limited thereto. For example, the first optical layer 117*a* can include fine particles, and the second optical layer 117*b* may not include fine particles. For example, the second optical layer 117*b* can be formed of siloxane.

For example, a thickness of the first optical layer 117*a* can be less than a thickness of the second optical layer 117*b*. Accordingly, in a plan view, an area in which the first optical layer 117*a* is disposed can include a concave portion recessed from an upper surface of the second optical layer 117*b*.

According to the present disclosure, the second electrode CE2 can be disposed on the first optical layer 117*a* and the second optical layer 117*b*. For example, the second electrode CE2 can be electrically connected to the plurality of contact electrodes CCE through a contact hole of the second optical layer 117*b*. For example, the second electrode CE2 can be disposed on the plurality of light emitting devices ED. For example, the second electrode CE2 can include a transparent conductive oxide such as indium tin oxide (ITO) or indium zinc oxide (IZO). For example, the second electrode CE2 can be in contact with the cathode 135. For example, the second electrode CE2 can overlap the entire first optical layer 117*a*, and can overlap a portion of the second optical layer 117*b*.

The second electrode CE2 can extend continuously in the first direction X of the substrate 110. Accordingly, the second electrode CE2 can be connected in common to at least two of the plurality of pixels PX arranged in the first direction X of the substrate 110. For example, the second electrode CE2 can be connected in common to at least two of the plurality of pixels PX.

According to the present disclosure, the second electrode CE2 can continuously extend on the first optical layer 117*a*, the second optical layer 117*b*, and the light emitting device ED. The area in which the first optical layer 117*a* is disposed can include the concave portion recessed from the upper surface of the second optical layer 117*b*. Accordingly, because a first portion of the second electrode CE2 disposed on the first optical layer 117*a* is disposed along the concave portion, the first portion can be disposed at a lower position than a second portion of the second electrode CE2 disposed on the second optical layer 117*b*.

The third optical layer 117*c* can be disposed on the second electrode CE2. The third optical layer 117*c* can overlap the plurality of light emitting devices ED and the first optical layer 117*a*. For example, the third optical layer 117*c* may not overlap the second optical layer 117*b*. Because the third optical layer 117*c* is disposed on the second electrode CE2 and the plurality of light emitting devices ED, mura that can occur in some of the plurality of light emitting devices ED can be improved by the third optical layer 117*c*. For example, when the plurality of light emitting devices ED is transferred on the substrate 110 of the display panel 100, a region in which an gap between the plurality of light emitting devices ED is not uniform due to a process deviation, or the like can be formed. When the gap between the plurality of light emitting devices ED is not uniform, a light emitting area of each of the plurality of light emitting devices ED can be non-uniformly disposed, and thus a spot (or mura) can be recognized by a user. Accordingly, because the third optical layer 117*c* for uniformly diffusing light is formed on an upper portion of the plurality of light emitting devices ED, it is possible to reduce visibility of light emitted from some light emitting devices ED as spots (or mura). Therefore, because the light emitted from the plurality of light emitting devices ED is uniformly diffused by the third optical layer 117*c* and extracted to the outside of the display panel 100, the luminance uniformity of the display apparatus can be improved.

The third optical layer 117*c* can be formed of an organic insulating material in which fine particles are distributed, but implementations of the present disclosure are not limited thereto. For example, the third optical layer 117*c* can be formed of siloxane in which fine metal particles such as titanium dioxide ($TiO_2$) particles are distributed. For example, the third optical layer 117*c* can be formed of the same material as the first optical layer 117*a*. For example, the third optical layer 117*c* can be referred to as a diffusion layer, an upper diffusion layer, or the like.

According to the present disclosure, light from the plurality of light emitting devices ED can be scattered by fine particles distributed in the third optical layer 117*c* and emitted to the outside of the display panel 100. The third optical layer 117*c* can evenly mix the light emitted from the plurality of light emitting devices ED to further improve luminance uniformity of the display apparatus. In addition, light extraction efficiency of the display apparatus can be improved by the light scattered from the plurality of fine particles, and thus the display apparatus can be driven at a low power.

In the display area AA, a black matrix BM can be disposed on the second electrode CE2, the first optical layer 117*a*, the second optical layer 117*b*, and the third optical layer 117*c*. For example, the black matrix BM can fill a contact hole of the second optical layer 117*b*. Because the black matrix BM can cover the display area AA, color mixture of light of the plurality of sub-pixels and reflection of external light can be reduced. For example, because the black matrix BM is disposed within a contact hole in which the second electrode CE2 and the contact electrode CCE are connected, light leakage between the plurality of adjacent sub-pixels can be prevented.

For example, the black matrix BM can be formed of an opaque material, but implementations of the present disclosure are not limited thereto. For example, the black matrix BM can be an organic insulating material to which a black pigment or a black dye is added.

Referring to FIG. 8, a cover layer 118 can be disposed on the black matrix BM in the display area AA. The cover layer 118 can protect an element under the cover layer 118, for example, the cover layer 118 can be formed of an organic insulating material, but implementations of the present disclosure are not limited thereto. For example, the cover layer 118 can be formed of a photo resist, polyimide (PI), a photo acryl-based material, or the like. For example, the cover layer 118 can be referred to as an overcoating layer, an insulating layer, or the like.

A polarizing layer 280 can be disposed on the cover layer 118 via a first adhesive layer 291. A cover member 120 can be disposed on the polarizing layer 280 via a second adhesive layer 295. For example, the first adhesive layer 291 and the second adhesive layer 295 can include an optically clear adhesive (OCA), an optically clear resin (OCR), a pressure sensitive adhesive (PSA) or the like, but implementations of the present disclosure are not limited thereto.

According to the present disclosure, the plurality of pad electrodes PE can be disposed on the third insulating layer 115*c* in the second non-display area NA2. For example, a portion of the plurality of pad electrodes PE can be exposed by the passivation layer 116. For example, the pad electrode PE can be electrically connected to the 2-4th connection line 122*d* through a contact hole of the third insulating layer 115*c*.

An adhesive film ACF can be disposed on the plurality of pad electrodes PE. The adhesive film ACF can be an adhesive layer in which conductive balls are distributed in an insulating material. When heat or pressure is applied to the adhesive film ACF, the conductive ball can be electrically connected to the pad electrode in a region to which heat or pressure is applied, and thus the conductive ball can have conductive characteristics. An adhesive film ACF can be disposed between the plurality of pad electrodes PE and the flexible circuit board (or flexible film) 170, so that a flexible circuit board (or flexible film) 170 can be attached to or bonded to the plurality of pad electrodes PE. For example, the adhesive film ACF can be an anisotropic conductive film (ACF).

The flexible circuit board (or flexible film) 170 can be disposed on the adhesive film ACF. The flexible circuit board (or flexible film) 170 can be electrically connected to the plurality of pad electrodes PE through the adhesive film ACF. Therefore, signals output from the flexible circuit board (or flexible film) 170 and the printed circuit board 160 can be transmitted to the pixel driving circuit PD of the display area AA through the pad electrode PE, the 2-4th connection line 122*d*, the 2-3th connection line 122*c*, the 2-1th connection line 122*b*, and the 2-1th connection line 122*a*.

Figure 10:
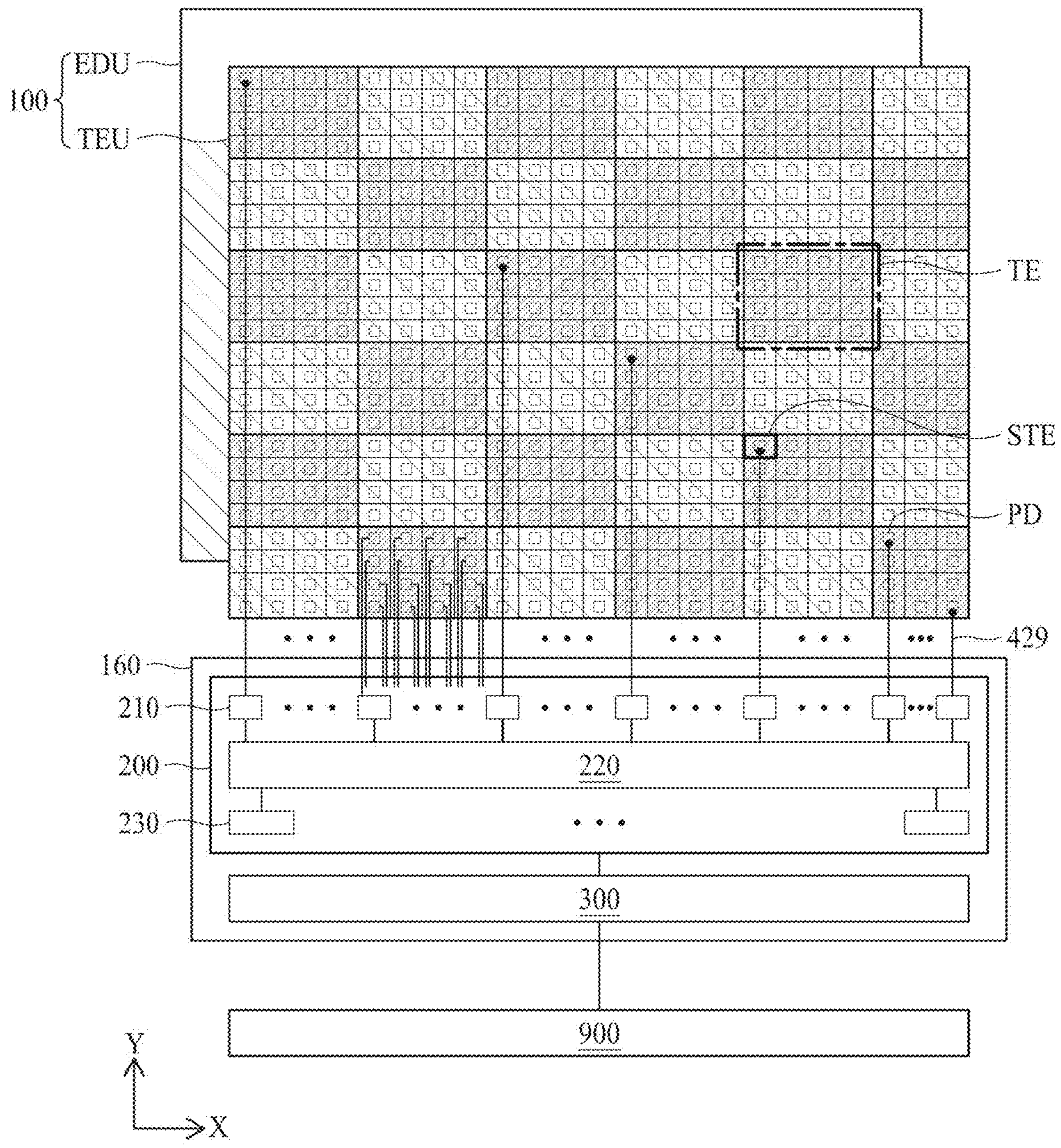
FIG. 10 is a diagram illustrating an example structure of a touch electrode part applied to a display apparatus according to an implementation of the present disclosure.

FIG. 10 is an exemplary diagram illustrating a structure of a touch electrode part applied to a display apparatus according to an implementation of the present disclosure. In the following descriptions, details that are the same as or similar to details described with reference to FIGS. 1 to 9 are omitted or briefly described.

The display apparatus according to an implementation of the present disclosure can include a display panel 100 and a touch determination part 200 for determining whether the display panel is touched using touch sensing signals transmitted from pixel driving circuits PD provided in the display panel 100.

Also, the display apparatus according to an implementation of the present disclosure can further include a timing controller 300, a power supply part, a memory, etc., as described with reference to FIGS. 1 and 2, in addition to the display panel 100 and the touch determination part 200. In this case, the touch determination part 200 can be included in the timing controller 300.

The display panel 100, as described with reference FIG. 8 can include the substrate 110 including the display area AA and the non-display area NDA, the pixel driving circuits PD provided in the display area on the substrate 110, the insulating layer on the pixel driving circuits PD, the banks BNK on the insulating layer, the first electrodes CE1 connected to the pixel driving circuits PD, the light emitting devices ED provided on the first electrodes, and the second electrodes CE2 provided on the light emitting devices ED.

Here, the insulating layer can be formed as a single layer, but can include a plurality of layers. For example, the insulating layer can include the first insulating layer 115*a*, the second insulating layer 115*b*, and the third insulating layer 115*c*.

The first electrode CE1 can be provided in each of the banks BNK.

The light emitting device ED can be provided on the first electrode CE1.

The light emitting device ED can be covered by the second electrode CE2.

Each of the light emitting devices ED can be driven by any one of the pixel driving circuits PD.

Each of the pixel driving circuits PD can be connected to at least two light emitting devices ED to drive at least two light emitting devices ED.

Each of the second electrodes CE2 can be connected to at least two light emitting devices ED.

As described above with reference to FIGS. 6 to 9, some of the plurality of sub-pixels can share the second electrode CE2. For example, as shown in FIG. 8, the first light emitting device 130, the second light emitting device 140, and the third light emitting device 150 provided in the first sub-pixel SP1, the second sub-pixel SP2, and the third sub-pixel SP3 can share one second electrode CE2.

However, sub-pixels SP included in two or more pixels PX can share one second electrode CE2.

Hereinafter, for convenience of description, as shown in FIG. 8, the display apparatus according to an implementation of the present disclosure will be described by using the display panel 100 in which the first light emitting device 130, the second light emitting device 140, and the third light emitting device 150 provided in one pixel PX share one second electrode CE2, as an example.

At least two second electrodes CE2 can be connected to each of the pixel driving circuits PD. For example, when the first light emitting device 130, the second light emitting device 140, and the third light emitting device 150 provided in one pixel PX share one second electrode CE2, and the pixel driving circuit PD drives at least two pixels PX, at least two second electrodes CE2 can be connected to the pixel driving circuit PD. In particular, when the pixels PX arranged in a 16×16 form are connected to the pixel driving circuit PD, 16 second electrodes CE2 can be connected to the pixel driving circuit PD.

In this case, the display panel 100 can include a light emitting device part EDU including pixel driving circuits PD and light emitting devices ED, and a touch electrode part TEU including at least two second electrodes CE2.

For example, in the display panel 100 illustrated in FIG. 8, the substrate 110, the buffer layers 111*a* and 111*b*, the adhesive layer 112, the pixel driving circuit PD, the protective layers 113*a*, 113*b* and 114, the insulating layers 115*a*, 115*b*, and 115*c*, the first connection line 121, the bank BNK, the first electrodes CE1, the light emitting devices CE1, and the optical layers 117*a* and 117*b* can be included in the light emitting device part EDU.

In addition, in the display panel 100 shown in FIG. 8, the second electrodes CE2 can be included in the touch electrode part TEU.

Also, in the display panel 100 shown in FIG. 8, the black matrix BM, the third optical layer 117*c*, and the cover layer 118 can be other components included in the display panel 100. However, hereinafter, for convenience of description, the black matrix BM, the third optical layer 117*c*, and the cover layer 118 can be included in the light emitting device part EDU.

In addition, as described with reference to FIG. 1, the display apparatus 1000 according to an implementation of the present disclosure can include a display panel 100, a polarizing layer 280, an adhesive layer 290, a cover member 120, a support substrate 190, a flexible circuit board 170, and a printed circuit board 160, and the display panel 100 can include various layers as shown in FIG. 8.

In this case, various layers included in the display panel 100 can be divided into the light emitting device part EDU and the touch electrode part TEU.

The light emitting device part EDU can include various layers as described above, and in particular, can include light emitting devices ED.

The touch electrode part TEU can include at least two second electrodes CE2.

In the following description, the second electrodes CE2 controlled by one pixel driving circuit PD are referred to as a sub-touch electrode STE.

In addition, in the following description, a configuration including at least one sub-touch electrode STE and corresponding to one touch coordinate is referred to as a touch electrode TE.

For example, the sub-touch electrode STE can be connected to the pixel driving circuit PD, and the sub-touch electrode STE can include at least two second electrodes CE2. As described above, when the pixels PX arranged in the form of 16×16 are connected to the pixel driving circuit PD, the sub-touch electrode STE can preferably include 16 second electrodes CE2.

One pixel driving circuit PD controlling one sub-touch electrode STE can be connected to the receiving part 210 included in the touch determination part 200, as shown in FIG. 10.

Hereinafter, for convenience of description, a display apparatus according to the present disclosure will be described by taking as an example a touch electrode TE including four sub-touch electrodes STE provided along the first direction X and four sub-touch electrodes STE provided along the second direction Y, as shown in FIG. 10. However, depending on the structure or resolution of the display panel 100, the touch electrode TE provided on the left side of the display panel 100 or the touch electrode TE provided on the right side of the display panel 100 can include three sub-touch electrodes STE provided along the first direction X and four sub-touch electrodes STE provided along the second direction Y. For example, in the display panel 100 shown in FIG. 10, each of the touch electrodes TE provided on the right side of the display panel 100 includes three sub-touch electrodes STE provided along the first direction X and four sub-touch electrodes STE provided along the second direction Y.

In addition, in the following description, the touch electrode TE can include 16 sub-touch electrodes STE. However, the number of sub-touch electrodes STE included in the touch electrode TE can be variously changed.

In this case, as shown in FIG. 10, the touch determination part 200 can include the receiving parts 210 connected to the pixel driving circuits PD, the determination parts 230 for determining whether there is a touch on the display panel 100 using touch sensing signals transmitted from the receiving parts 210, and the switching part 220 for connecting each of the determination parts 230 to at least two receiving parts 210.

As described above, the receiving part 210 can be connected to the pixel driving circuit PD and can receive a touch sensing signal transmitted from at least one second electrode CE2 connected to the pixel driving circuit PD.

The switching part 220 can connect at least two receiving parts 210 to one determination part 230 based on touch setting information stored in the touch determination part 200 or the timing controller 300.

For example, as shown in FIG. 10, when 16 sub-touch electrodes STE are included in one touch electrode TE, the switching part 220 can connect 16 receiving parts 210 connected to the 16 sub-touch electrodes STE to one determination part 230.

In addition, in FIG. 10, a display apparatus in which each of the 16 sub-touch electrodes STE included in one touch electrode TE is connected to one receiving part 210 is illustrated. In this case, each of the sub-touch electrodes STE can be connected to the receiving part 210 through the pixel driving circuit PD.

For example, in the display apparatus shown in FIG. 10, each of the pixel driving circuits PD corresponding to all the sub-touch electrodes STE included in the touch electrode part TEU can be connected to one receiving part 210.

However, at least two pixel driving circuits PD can be connected to one receiving part 210. In this case, at least two pixel driving circuits PD can sequentially transmit the touch sensing signal to the receiving part 210.

The determination part 230 can determine whether there is a touch on a touch electrode TE corresponding to one touch coordinate by using touch sensing signals transmitted from the sub-touch electrodes STE connected to the switching part 220.

For example, as shown in FIG. 10, when 16 sub-touch electrodes STE are included in one touch electrode TE and the switching part 220 connects the 16 sub-touch electrodes STE to one determination part 230, the determination part 230 can determine whether there is a touch on one touch electrode TE including the 16 sub-touch electrodes STE by using touch sensing signals received from the 16 sub-touch electrodes STE.

For example, the determination part 230 can determine whether there is a touch at the touch electrode TE by converting analog touch sensing signals transmitted from the pixel driving circuit PD into digital touch sensing signals. However, the determination part 230 can determine whether there is a touch at the touch electrode TE by using digital touch sensing signals transmitted from the pixel driving circuit PD.

In this case, the determination part 230 can generate touch coordinates of the touch electrode TE determined to have a touch, and can transmit the touch coordinates to the timing controller 300. The timing controller 300 can transmit the touch coordinates to the external system 900, and the external system 900 can perform various functions based on the touch coordinates.

Here, the external system 900 can perform a function of driving the timing controller 300 and the electronic device. The electronic device can be, for example, a wearable device, a mobile device, a notebook computer, a monitor, or a TV.

For example, when the electronic device is a wearable device, the external system can perform various functions of the wearable device using touch coordinates received from the timing controller 300.

However, the determination part 230 can perform only a function of converting analog touch sensing signals into digital touch sensing signals and transmitting the digital touch sensing signal to the timing controller 300. However, when a digital touch sensing signal is received from the pixel driving circuit PD, the determination part 230 can perform only a function of transmitting digital touch sensing signals to the timing controller 300.

In this case, whether or not a touch is present and a touch coordinate can be determined by the timing controller 300 or the external system 900.

However, in the following description, for convenience of description, the display apparatus according to the present disclosure will be described by taking as an example the determination part 230 that determines whether there is a touch in the display panel 100 by using touch sensing signals transmitted from the receiving parts 210.

In this case, the touch coordinates can be determined by the determination part 230, or can be determined by the timing controller 300 or the external system 900.

As described above, the switching part 220 can connect at least two receiving parts 210 to one determination part 230. Accordingly, the number of determination parts 230 can be smaller than the number of receiving parts 210.

Figure 11A:
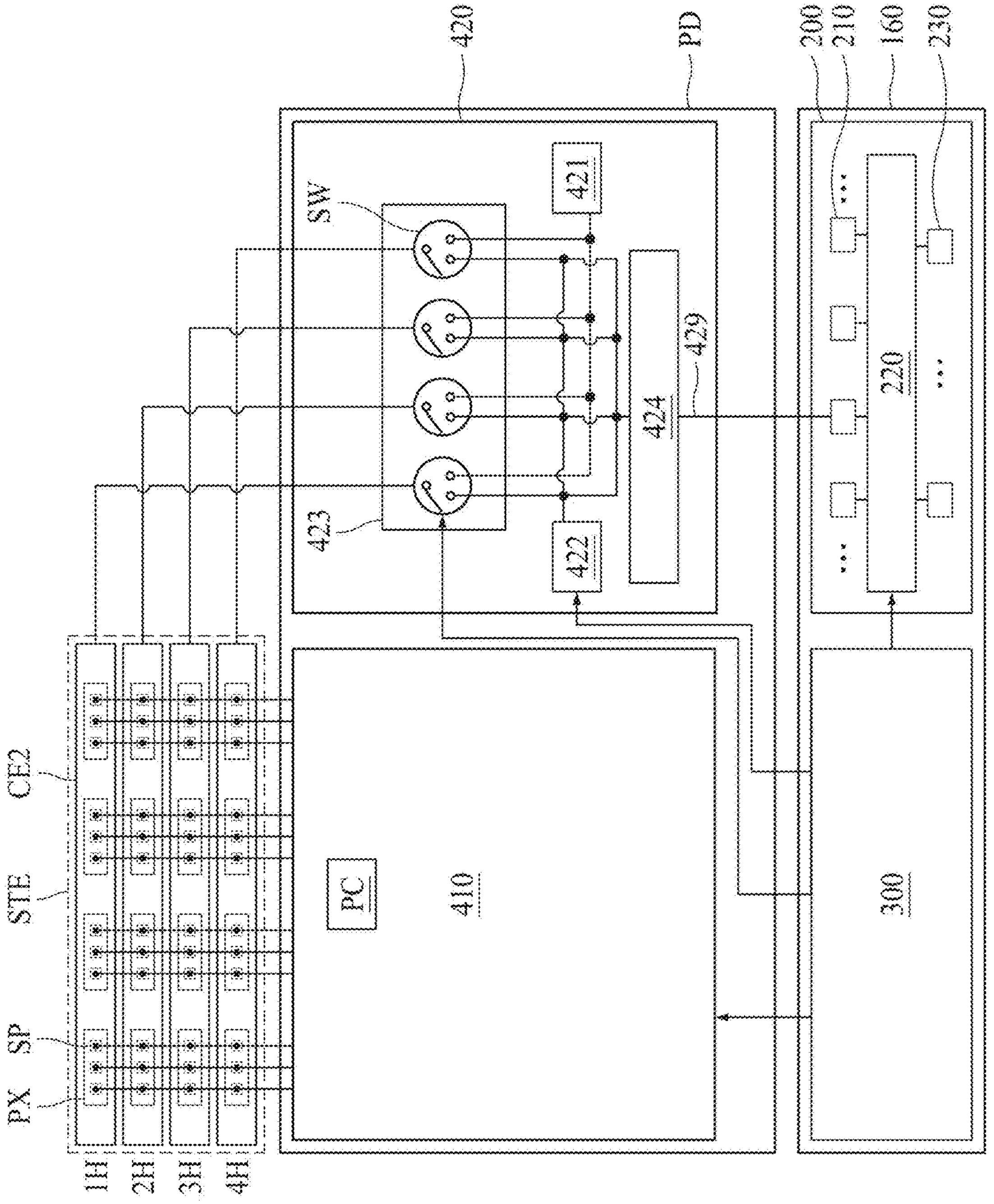
FIG. 11A is a diagram illustrating example structures of a sub-touch electrode and a pixel driving circuit applied to a display apparatus according to an implementation of the present disclosure.
Figure 11B:
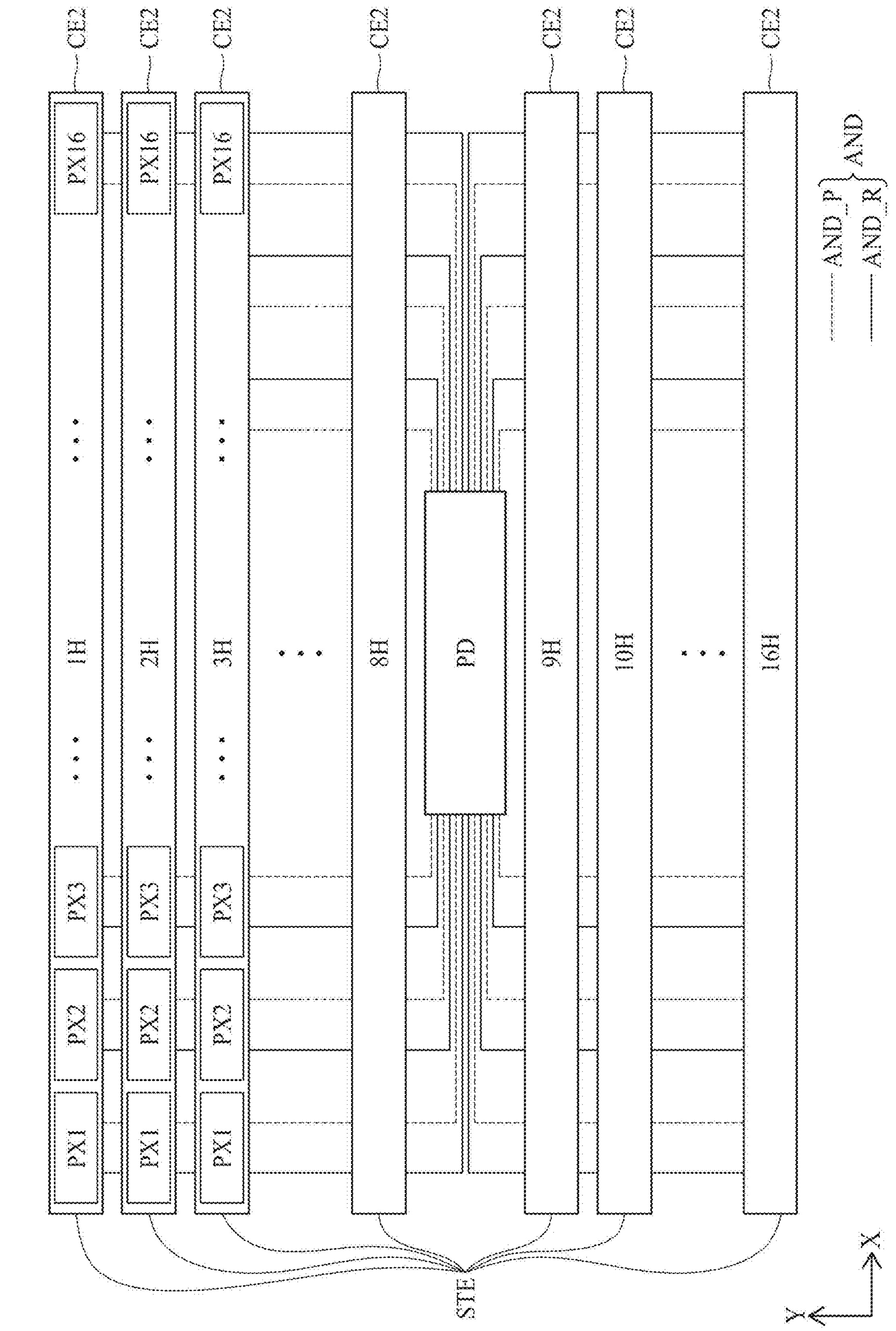
FIG. 11B is a diagram illustrating an example arrangement structure of a sub-touch electrode and a pixel driving circuit applied to a display apparatus according to an implementation of the present disclosure.
Figure 11C:
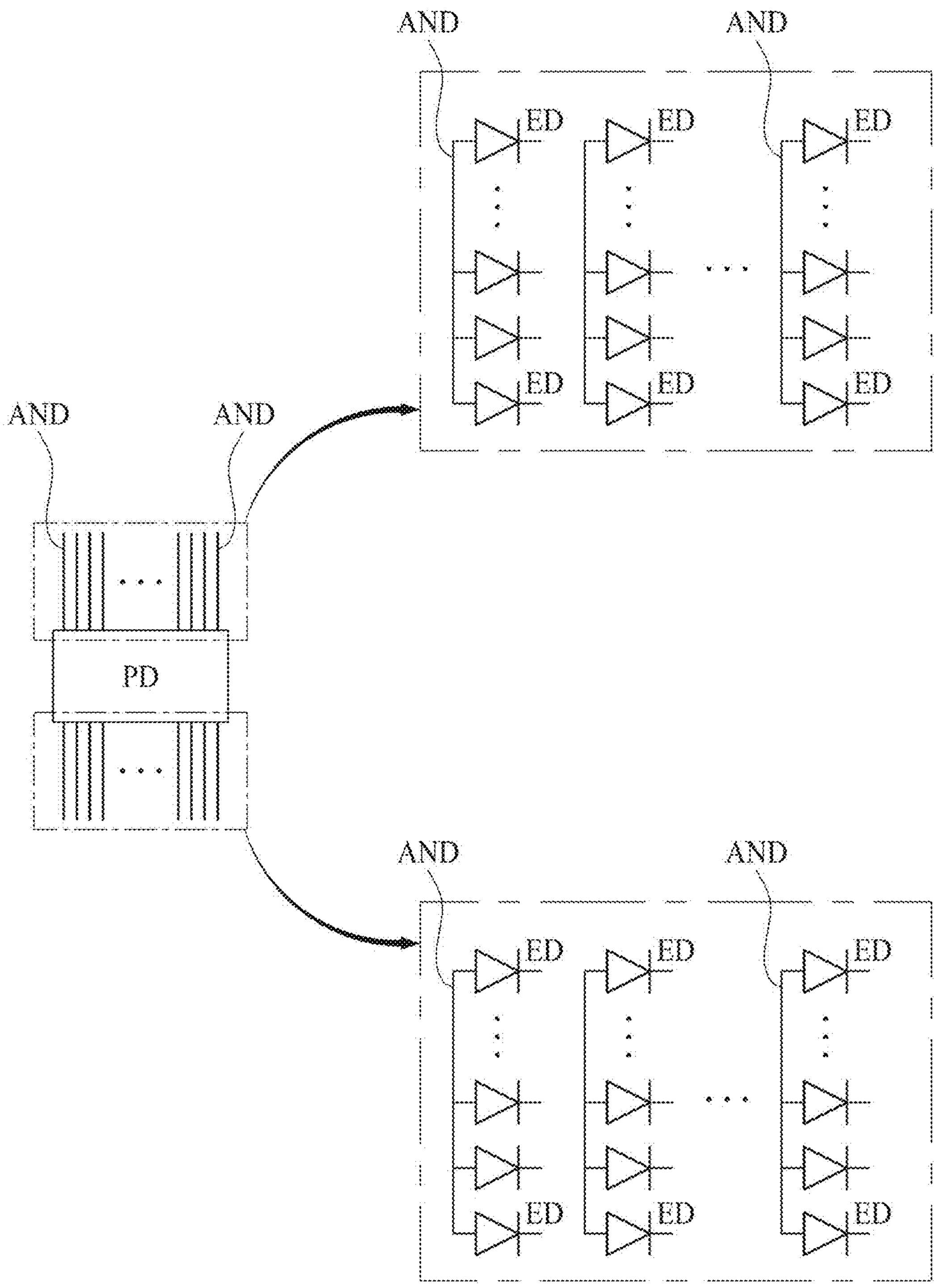
FIG. 11C is a diagram illustrating an example of a connection relationship between a pixel driving circuit and light emitting devices applied to a display apparatus according to an implementation of the present disclosure.

FIG. 11A is an exemplary diagram illustrating structures of a sub-touch electrode and a pixel driving circuit applied to a display apparatus according to an implementation of the present disclosure, FIG. 11B is an exemplary diagram illustrating an arrangement structure of a sub-touch electrode and a pixel driving circuit applied to a display apparatus according to an implementation of the present disclosure, and FIG. 11C is an exemplary diagram illustrating a connection relationship between a pixel driving circuit and light emitting devices applied to a display apparatus according to an implementation of the present disclosure. In the following descriptions, details that are the same as or similar to details described with reference to FIGS. 1 to 10 will be omitted or briefly described.

The pixel driving circuit PD can include a sub-pixel driving part 410 for supplying anode voltages to anode electrodes 134 provided in the sub-pixels SP and a touch control part 420 for supplying a cathode voltage or a touch driving signal to a second electrode CE2 shared in at least two sub-pixels SP, as shown in FIG. 11A.

As described above, the second electrodes CE2 controlled by one pixel driving circuit PD are referred to as sub-touch electrode STE.

The sub-touch electrode STE can include at least two second electrodes CE2.

As described above, at least two light emitting devices ED can be connected to one pixel driving circuit PD. In addition, one second electrode CE2 can be connected to at least two light emitting devices ED.

Hereinafter, for convenience of description, a pixel driving circuit PD to which 16 pixels PX having a 4×4 shape are connected, as shown in FIG. 11A, is described as an example of a display apparatus according to the present disclosure. In addition, in the display apparatus shown in FIG. 11A, pixels PX arranged in a 4×4 shape are connected to the pixel driving circuit PD, but in the display apparatus according to an implementation of the present disclosure, pixels PX arranged in a 4N×4M (N and M are natural numbers) form can be connected to the pixel driving circuit PD. For example, in FIG. 11B, pixels PX arranged in a 16×16 shape are connected to the pixel driving circuit PD.

For example, as shown in FIG. 11A, the pixel driving circuit PD can be connected to four pixels PX provided along the first direction X and four pixels PX provided along the second direction Y.

In this case, one second electrode CE2 controlled by the pixel driving circuit PD can be connected to the light emitting devices DE provided in at least two sub-pixels SP.

In particular, the second electrode CE2 can be connected to at least two light emitting devices DE provided along the first direction X of the display panel 100, and the at least two second electrodes CE2 provided along the first direction X can be separated from each other.

When four pixels PX are provided along the first direction X, and one pixel PX includes three sub-pixels SP, 12 sub-pixels PX can be provided along the first direction X.

In this case, when the second electrode CE2 provided along the first direction X is shared by the two sub-pixels SP, six second electrodes CE2 can be provided along the first direction X.

Accordingly, one pixel driving circuit PD can be connected to 24 (=6×4) second electrodes CE2.

However, hereinafter, for convenience of description, as shown in FIG. 11A, the display apparatus according to the present description will be described by taking as an example a display apparatus in which four pixels PX provided along the first direction X are connected to one second electrode CE2.

In this case, the pixel driving circuit PD can be connected to the four second electrodes CE2.

For example, for convenience of description, the display apparatus according to the present disclosure is described using a pixel driving circuit PD to which 16 pixels PX having a 4×4 shape are connected and a second electrode CE2 connected to four pixels PX along the first direction X, as shown in FIG. 11A.

First, as shown in FIGS. 4 and 11A, a circuit provided in the pixel driving circuit PD for driving at least one light emitting device ED is referred to as a pixel circuit PC. For example, the pixel circuit PC can include a driving transistor TDR and a light emitting transistor TEM, as shown in FIG. 4. In this case, a scan signal SC capable of turning on the driving transistor TDR can be supplied to a gate of the driving transistor TDR. The scan signal SC can be a direct current power source capable of continuously turning on the driving transistor TDR. For example, a fixed reference voltage Vref can be supplied to the gate of the driving transistor TDR for each frame.

A light emitting signal EM can be supplied to the gate of the light emitting transistor TEM. The light emitting signal EM can be a pulse width modulation (PWM) signal. The amount of current supplied to the light emitting device ED can be controlled by the light emitting signal EM, and thus, light having various brightness can be output from the light emitting device ED. At least one pixel circuit PC can be provided in the sub-pixel driver 410.

In this case, a high potential power supply voltage VDD can be supplied to the first electrode of the driving transistor TDR provided in the pixel circuit PC. The high potential power supply voltage VDD can be supplied from the power supply part provided outside the pixel driving circuit PD.

The scan signal SC and the light emitting signal EM can be transmitted from a control signal generation part provided outside the pixel driving circuit PD. For example, the scan signal SC and the light emitting signal EM can be transmitted from a control signal generation part included in the timing controller 300.

For example, as shown in FIG. 11A, when four pixels PX connected to the pixel driving circuit PD are provided in one row extending along the first direction X, 16 pixels PX can be provided in four rows 1H, 2H, 3H, and 4H.

In addition, each of the four rows can be provided along the first direction X, and the four rows can be spaced apart along the second direction Y.

In this case, in order to output light from the light emitting devices ED provided in the first row 1H, light emitting signals EM and scan signals can be supplied to pixel circuits PC connected to the light emitting devices ED provided in the first row 1H.

As described above, the scan signal SC can be a direct current (DC) power source capable of continuously turning on the driving transistor TDR, and the light emitting signal EM can be a pulse width modulation (PWM) signal.

The light emitting transistor TEM can be turned on by the scan signal SC, and thus, the high potential power supply voltage VDD can be supplied to the anode electrode 134 of the light emitting device ED through the driving transistor TDR, the light emitting transistor TEM, and the first electrode CE1.

In this case, as described above, the light emitting signal EM applied to the gate electrode of the light emitting transistor TEM can be a pulse width modulation (PWM) signal, and the pulse width of the light emitting signals EM supplied to the pixel circuits PC connected to the anode electrodes 134 of the light emitting devices ED provided in the first row 1H can be variously set depending on the brightness of light output from the light emitting devices ED.

For example, the pulse width of the light emitting signal EM supplied to the pixel circuit PC connected to the light emitting device outputting high-brightness light can be greater than the pulse width of the light emitting signal EM supplied to the pixel circuit PC connected to the light emitting device outputting low-brightness light.

In this case, when a high-level pulse is supplied to the gate of the light emitting transistor TEM, the light emitting transistor TEM can be turned on.

When the period in which the light emitting transistor TEM is turned on increases, the amount of current supplied to the light emitting device ED through the light emitting transistor TEM can increase. The luminance of the light emitting device ED can vary based on the magnitude of the current flowing to the light emitting device ED.

Therefore, as the pulse width of the light emitting signal EM increases, the luminance of light output from the light emitting device ED can increase.

Also, when the pulse width of the light emitting signal EM supplied to the pixel circuit PC connected to the light emitting device outputting high-brightness light and the pulse width of the light emitting signal EM supplied to the pixel circuit PC connected to the light emitting device outputting low-brightness light are the same, the number of pulses of the light emitting signal EM supplied to the pixel circuit PC connected to the light emitting device outputting high-brightness light can be greater than the number of pulses of the light emitting signal EM supplied to the pixel circuit PC connected to the light emitting device outputting low-brightness light. For example, the frequency of the light emitting signal EM supplied to the pixel circuit PC connected to the light emitting device outputting high-brightness light can be greater than the frequency of the light emitting signal EM supplied to the pixel circuit PC connected to the light emitting device outputting low-brightness light.

When the frequency increases, the number of pulses increases. When the number of pulses supplied to the light emitting transistor TEM increases, the number of times the light emitting transistor TEM is turned on increases. When the number of times the light emitting transistor TEM is turned on increases, the amount of current flowing to the light emitting device ED through the light emitting transistor TEM can increase.

As described above, because the luminance of the light emitting device ED can be changed depending on the magnitude of the current flowing to the light emitting device ED, as the frequency of the light emitting signal EM increases or the number of pulses of the light emitting signal EM increases, the luminance of light output from the light emitting device ED can increase.

For example, the timing controller 300 can supply light emitting signals EM with different frequencies or different pulse widths to the light emitting transistor TEM provided in the pixel circuit PC.

Accordingly, light having different luminance can be output from the light emitting devices ED connected to the pixel driving circuit PD.

Finally, when the scan signal SC is supplied to the driving transistor TDR, the touch control part 420 can supply cathode voltages to the second electrodes CE2.

For example, as shown in FIG. 11A, when 16 pixels PX having a 4×4 shape are connected to the pixel driving circuit PD and one second electrode CE2 is connected to four pixels PX provided along the first direction X, 16 pixels PX can be provided in four rows 1H, 2H, 3H, and 4H, and the four rows 1H, 2H, 3H, and 4H can be spaced apart from each other along the second direction Y.

In this case, four pixels PX provided in each of the four rows 1H, 2H, 3H and 4H are connected to one second electrode CE2. Accordingly, four second electrodes CE2 are provided in the display panel 100 for driving the 16 pixels PX.

The four second electrodes CE2 are connected to one pixel driving circuit PD. The four second electrodes CE2 connected to one pixel driving circuit PD are referred to as sub-touch electrodes STE. For example, the sub-touch electrode STE includes four second electrodes CE2.

In addition, at least one second electrode CE2 connected to the pixel driving circuit PD can be provided along the first direction X or row of the display panel 100, and at least two light emitting devices ED connected to the second electrode CE2 can be provided in a row along the first direction X or row.

In the above example, three sub-pixels SP are provided in each of the four pixels PX provided in the first row 1H.

Accordingly, when anode voltages are supplied from the 12 pixel circuits PC connected to the 12 sub-pixels SP provided in the first row 1H to the 12 anode electrodes 134 provided in the 12 sub-pixels SP, the touch control part 420 can supply a cathode voltage to the second electrode CE2 provided in the first row 1H. Accordingly, light can be output from the sub-pixels SP provided in the first row 1H.

This operation can be simultaneously performed in sub-pixels SP provided in the first row 1H and connected to other pixel driving circuits PD. Accordingly, light can be simultaneously output from all sub-pixels SP provided in the first row 1H of the display panel 100.

Also, when anode voltages are supplied from the 12 pixel circuits PC connected to the 12 sub-pixels SP provided in the second row 2H to the 12 anode electrodes 134 provided in the 12 sub-pixels SP, the touch control part 420 can supply a cathode voltage to the second electrode CE2 provided in the second row 2H. Accordingly, light can be output from the sub-pixels SP provided in the second row 2H.

This operation can be simultaneously performed in sub-pixels SP provided in the second row 2H and connected to other pixel driving circuits PD. Accordingly, light can be simultaneously output from all sub-pixels SP provided in the second row 2H of the display panel 100.

By the above-described operations, light can be sequentially output from sub-pixels SP provided in all rows of the display panel 100, and thus, one image can be displayed through the display panel 100.

The sub-pixels SP can be individually driven by the structure and driving method as described above.

To perform the operation as described above, the touch control part 420 can include a cathode voltage supply part 421 for supplying cathode voltages to the second electrodes CE2, a touch driving signal supply part 422 for supplying touch driving signals to the second electrodes CE2, and a control switching part 423 for connecting each of the second electrodes CE2 to the cathode voltage supply part 421 or the touch driving signal supply part 422, as shown in FIG. 11A. Also, the touch control part 420 can further include a conversion part 424 for converting analog touch sensing signals received from the second electrodes CE2 into digital touch sensing signals.

The control switching part 423 includes control switches SW.

Each of the control switches SW can connect the second electrode CE2 to the cathode voltage supply part 421 or the touch driving signal supply part 422.

In the above example, one sub-touch electrode STE includes four second electrodes CE2, and the four second electrodes CE2 are connected to one pixel driving circuit PD.

In this case, the control switching part 423 can include four control switches SW. Each of the four control switches SW is connected to the second electrode CE2.

During a display period in which an image is displayed on the display panel 100, the control switch SW can connect the second electrode CE2 to the cathode voltage supply part 421.

For example, each of the pixel driving circuits PD can supply a cathode voltage to at least one second electrode CE2 provided along the first direction X or row of the display panel 100 during the display period.

In the above example, one second electrode CE2 is provided in one row. Accordingly, the control switch SW can connect one second electrode CE2 provided in one row to the cathode voltage supply part 421, during the display period.

However, when two or more second electrodes CE2 are provided in one row, the control switch SW can connect two or more second electrodes CE2 provided in one row to the cathode voltage supply part 421.

As described above, when an anode voltage is supplied from the sub-pixel driving part 410 to the anode electrode 134 of the light emitting device ED through the first electrode CE1, and a cathode voltage is supplied from the touch control part 420 to the cathode electrode 135 of the light emitting device ED through the second electrode CE2, light can be output from the light emitting device ED.

When a cathode voltage is sequentially supplied to the four second electrodes CE2 provided in the four rows 1H, 2H, 3H, and 4H, light can be sequentially output from the four rows 1H, 2H, 3H, and 4H.

The same operation can be performed in the sub-pixels SP connected to other pixel driving circuits PD.

Accordingly, light can be sequentially output from the rows of the display panel 100, and thus, one image can be displayed throughout the display panel 100.

Also, in a touch sensing period during which a touch is sensed on the display panel 100, the control switch SW can connect the second electrode CE2 to the touch driving signal supply part 422.

For example, the display period for displaying an image and the touch sensing period for sensing a touch can be implemented in a time division method.

For example, each of the pixel driving circuits PD can supply a touch driving signal to all the second electrodes CE2 connected to the pixel driving circuit PD during the touch sensing period.

In the above example, one second electrode CE2 is provided in one row, and four second electrodes CE2 are provided in four rows. Accordingly, the control switch SW can connect all four second electrodes CE2 to the touch driving signal supply part 422 during the touch sensing period.

When two or more second electrodes CE2 are provided in one row, the control switch SW can connect both of the two or more second electrodes CE2 provided in one row to the touch driving signal supply part 422.

When the touch driving signal is simultaneously supplied to the four second electrodes CE2 provided in the four rows 1H, 2H, 3H, and 4H, a touch sensing signal can be generated in the four rows.

The touch sensing signals generated in the four rows can be transmitted to the touch determination part 200 through the control switching part 423.

For example, after the touch driving signal supply part 422 supplies the touch driving signal to the control switch SW, the touch driving signal supply part 422 can be separated from the control switch SW. In this case, the touch sensing signals transmitted from the four second electrodes CE2 can be transmitted to the touch determination part 200 through the control switch SW.

In this case, the touch sensing signals transmitted from the four second electrodes CE2 can be transmitted to the touch determination part 200 through separate transmission lines, or can be transmitted to the touch determination part 200 through one transmission line 429. The touch sensing signals transmitted from the four second electrodes CE2 can be referred to as sub-touch sensing signal.

However, analog touch sensing signals transmitted from the four second electrodes CE2 can be converted into digital touch sensing signals by the conversion part 424, and digital touch sensing signals can be transmitted to the touch determination part 200 through the transmission line 429.

This operation can be similarly performed in other pixel driving circuits PD.

In addition, each of the pixel driving circuits PD can supply a touch driving signal to at least one second electrode CE2 during the touch sensing period, and transmit a touch sensing signal received from at least one second electrode to the touch determination part 200.

The touch determination part 200 can determine whether there is a touch on the touch electrode TE by using touch sensing signals transmitted from the at least one pixel driving circuit PD.

A method in which the touch determination part 200 determines whether there is a touch on the touch electrode TE by using touch sensing signals transmitted from at least one pixel driving circuit PD will be described with reference to FIGS. 12 to 16.

As described above, in the display apparatus according to an implementation of the present disclosure, pixels PX arranged in a 4×4 form as illustrated in FIG. 11A can be connected to the pixel driving circuit PD, pixels PX arranged in a 16×16 form as illustrated in FIG. 11B can be connected to the pixel driving circuit PD, or pixels PX arranged in various forms can be connected to the pixel driving circuit PD. Hereinafter, a structure of a display panel 100 applied to a display apparatus according to an implementation of the present disclosure will be described with reference to FIGS. 11B and 11C. In the following descriptions, details that are the same as or similar to details described with reference to FIGS. 1 to 11A will be omitted or briefly described.

In the display apparatus according to another implementation of the present disclosure, a pixel driving circuit PD and pixels PX1 to PX16 including light emitting devices ED electrically connected to the pixel driving circuit PD can be provided.

For example, the first to sixteenth pixels PX1 to PX16 can be arranged along the first direction X. One pixel PX can include a red sub-pixel, a green sub-pixel, and a blue sub-pixel SP.

A light emitting device ED can be disposed in the sub-pixel SP. At least one light emitting device ED can be disposed in one sub-pixel SP. For example, two light emitting devices can be disposed in one sub-pixel. One of the two light emitting devices can be a main light emitting device, and the other can be a redundancy light emitting device. The light emitting device ED can be a micro LED.

A red sub-pixel, a green sub-pixel, and a blue sub-pixel can be repeatedly disposed along the first direction X.

Sub-pixels SP that output light of the same color can be disposed along the second direction Y. For example, along the second direction Y, sub-pixels SP that output light of any one color of red, green, and blue can be disposed. The sub-pixels SP emitting the same color can be electrically connected through one first electrode line AND, as shown in FIG. 11C. The first electrode line AND can be connected to the first electrodes CE1.

The first electrode line AND can include a first line AND_P and a second line AND_R. The first line AND_P and the second line AND_R can be disposed to be spaced apart from each other in the first direction X. The first line AND_P can be connected to the main light emitting device, and the second line AND_P can be connected to the redundancy light emitting device.

Each of the second electrodes CE2 can extend in the first direction X, as shown in FIG. 11B. Also, each of the second electrodes CE2 can be arranged to be spaced apart from each other along the second direction Y. Accordingly, each of the second electrodes CE2 can be connected to the first to sixteenth pixels PX1 to PX16 disposed in each of the rows 1H to 16H.

The pixel driving circuit PD can be connected to the pixels PX1 to PX16 through the first electrodes CE1 and the second electrodes CE2. Accordingly, the pixel driving circuit PD can drive the light emitting devices ED arranged in the first to sixteenth rows 1H to 16H.

In addition, the pixel driving circuit PD can be electrically connected to the light emitting devices arranged in the first to 16th rows 1H to 16H through the first electrodes CE1 and the second electrodes CE2, and the pixel driving circuit PD can supply the control signal and power to the light emitting devices ED through the first electrodes CE1 and the second electrodes CE2 to control the light emitting operation of the light emitting devices ED.

In this case, the second electrodes CE2 can be connected to the pixels PX and the pixel driving circuit PD in the form shown in FIG. 11B, the first electrodes CE1 provided in the pixels PX can be connected to the first electrode lines AND in the form shown in FIG. 11C, and the first electrodes CE1 can be connected to the pixel driving circuit PD through the first electrode lines AND.

For example, in the light emitting device part EDU, as shown in FIG. 11C, first electrode lines AND can be disposed on the upper and lower sides of the pixel driving circuit PD, respectively.

As shown in FIG. 11C, one first electrode line AND among the first electrode lines AND can connect the first electrodes CE1 of the light emitting devices ED adjacent to each other in the vertical direction among the light emitting devices ED.

In this case, a pixel circuit PC can be connected to each of the first electrode lines AND. However, the pixel circuit PC can be connected to at least two first electrode lines AND. In this case, the anode voltage can be sequentially supplied to at least two first electrode lines AND.

Hereinafter, the basic driving method of the display apparatus according to the present disclosure in the display period in which the image is displayed will be briefly described.

Figure 11D:
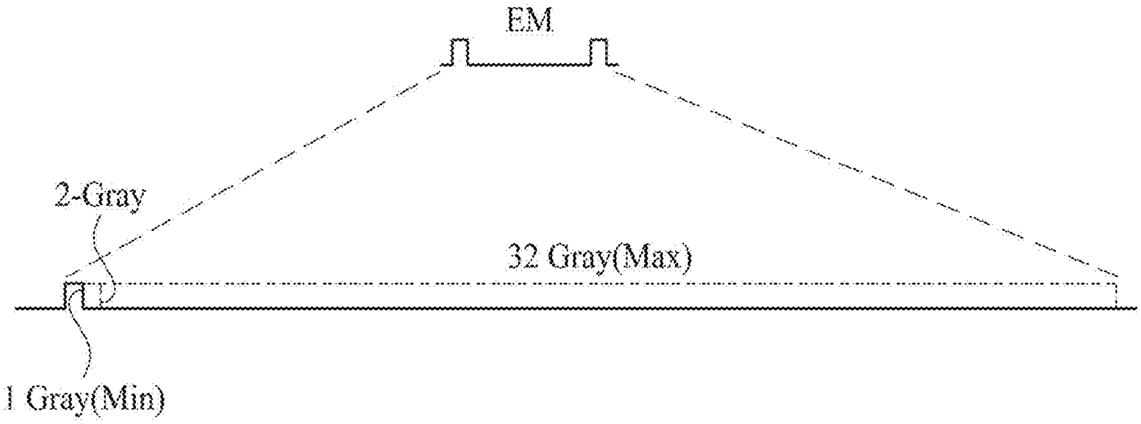
FIG. 11D is a diagram illustrating an example of a light emitting signal applied to a display apparatus according to an implementation of the present disclosure.
Figure 11E:
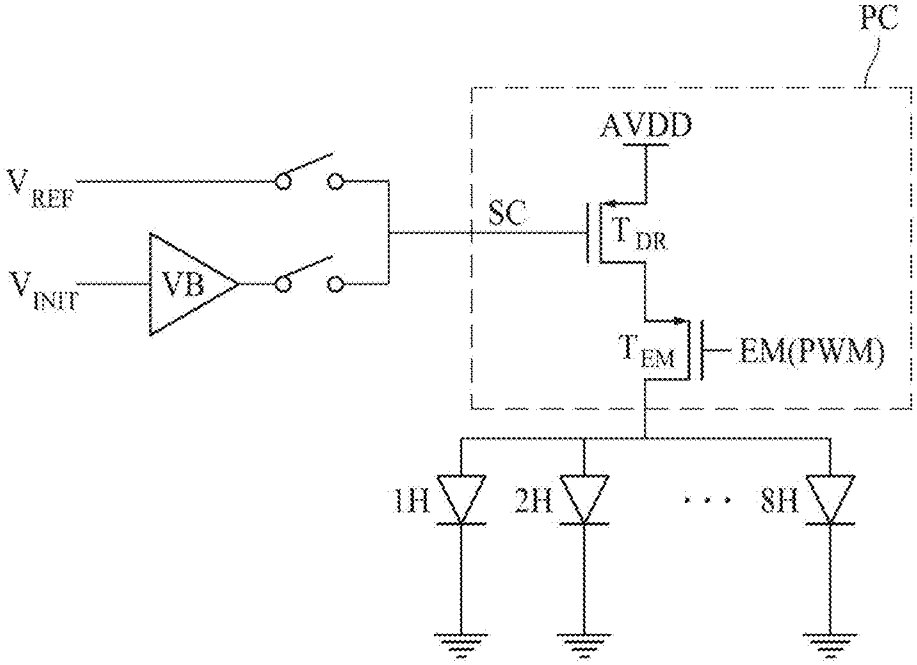
FIG. 11E is a diagram illustrating an example of a pixel circuit applied to a display apparatus according to an implementation of the present disclosure.

FIG. 11D is an exemplary diagram illustrating a light emitting signal applied to a display apparatus according to an implementation of the present disclosure, and FIG. 11E is an exemplary diagram illustrating a pixel circuit applied to a display apparatus according to an implementation of the present disclosure.

As described above, the pixel driving circuit PD can control the light emitting operation of the light emitting device ED by using the pulse width of the light emitting signal EM.

For example, as shown in FIG. 11D, the pixel driving circuit PD can adjust the pulse width of the light emitting signal EM, and thus, light corresponding to 1 Gray to 32 Gray can be output through the light emitting device ED.

The pixel driving circuit PD can supply a light emitting signal EM having a pulse width adjusted based on gray to a gate electrode of the light emitting transistor TEM.

In this case, a fixed light emitting current can be applied to the light emitting device ED through the light emitting transistor TEM, and thus, the light emitting device ED can output light.

For example, when eight light emitting devices ED are connected to one first electrode line AND, the eight light emitting devices ED can output light by constant current having the same current value.

In this case, in a typical organic light emitting display apparatus, the amount of current flowing to the light emitting device is different because the voltage applied to the gate electrode of the driving transistor varies from one light emitting device to another, and the time for which the current flows to the light emitting devices is the same.

However, in the display apparatus according to an implementation of the present disclosure, the amount of current flowing to the light emitting devices ED is the same, and the time for which the current flows is different for each light emitting device. That is, the time for which the current flows through the light emitting device can be adjusted by the pulse width of the light emitting signal (PWM signal) EM.

For example, the pixel circuit PC, as shown in FIGS. 4 and 11E, includes a driving transistor TDR and a light emitting transistor TEM, and is connected to light emitting devices. Reference numerals 1H, 2H, and 8H shown in FIG. 11E refer to light emitting devices ED provided in the first row 1H, the second row 2H, and the eighth row 8H shown in FIG. 11B.

A high potential voltage AVDD can be applied to the first electrode of the driving transistor TDR, a light emitting transistor TEM can be connected to the second electrode of the driving transistor TDR, and a reference voltage VREF or initialization voltage VINT can be applied to the gate electrode of the driving transistor TDR. The reference voltage VREF or the initialization voltage VINT can be a scan signal SC.

For example, a reference voltage VREF can be applied to the gate electrode of the driving transistor TDR through a switching means, or an initialization voltage VINT can be applied to the gate electrode of the driving transistor TDR through a voltage buffer (VB) and a switching means.

A driving transistor TDR can be connected to the first electrode of the light emitting transistor TEM, light emitting devices can be connected to the second electrode of the light emitting transistor TEM, and a light emitting signal EM can be applied to the gate electrode of the light emitting transistor TEM.

Hereinafter, a display period in which an image is displayed and a touch sensing period in which a touch is sensed will be briefly described with reference to FIGS. 11F and 11G.

Figure 11F:
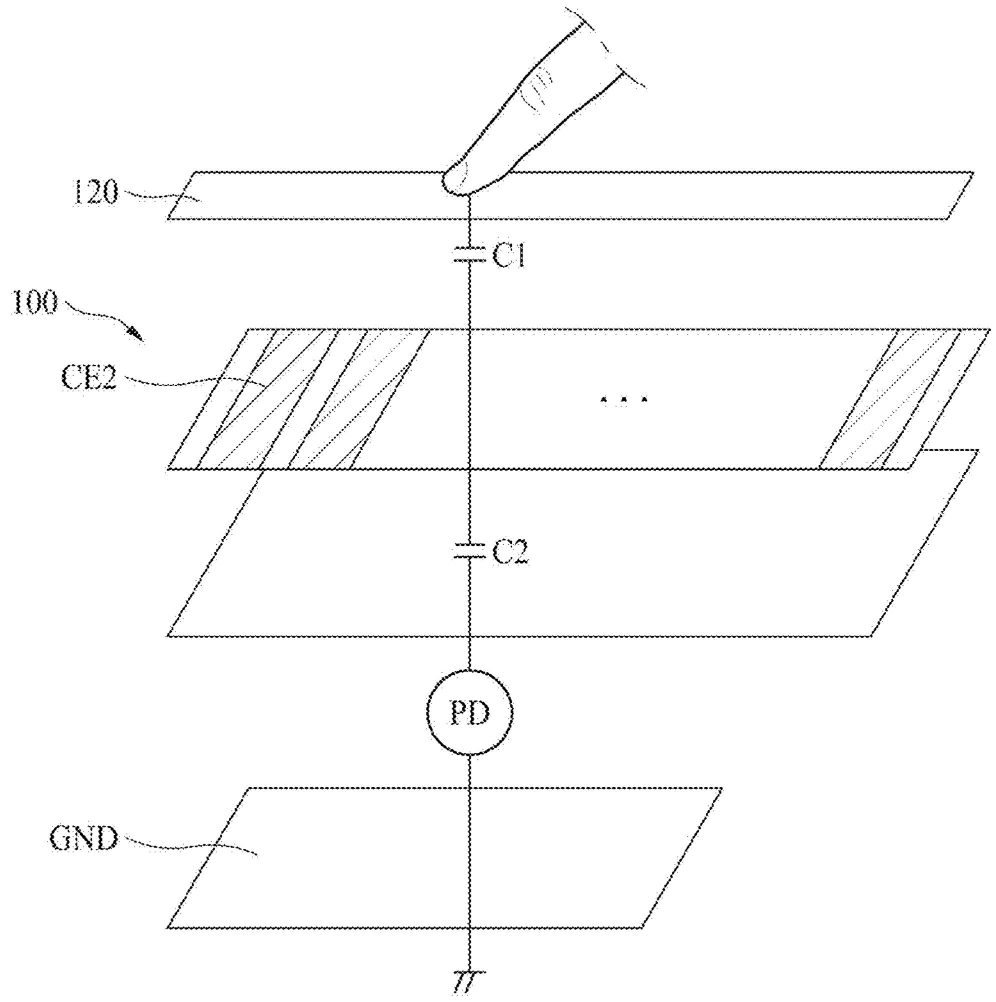
FIG. 11F is a diagram illustrating an example of a touch sensing method in a display apparatus according to an implementation of the present disclosure.
Figure 11G:
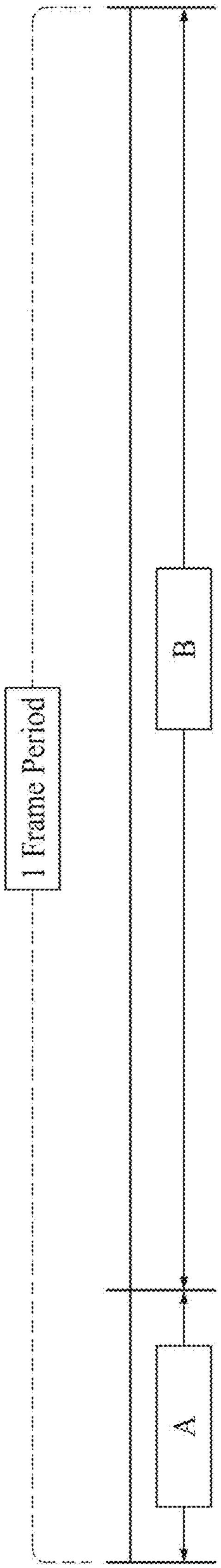
FIG. 11G is a diagram illustrating an example of one frame period applied to a display apparatus according to an implementation of the present disclosure.

FIG. 11F is an exemplary diagram illustrating a touch sensing method in a display apparatus according to an implementation of the present disclosure, and FIG. 11G is an exemplary diagram illustrating one frame period applied to a display apparatus according to an implementation of the present disclosure.

In the display apparatus according to an implementation of the present disclosure, the second electrodes CE2 can be used as a touch electrode TE, and this structure is referred to as an in-cell touch structure. Because a separate touch electrode is not provided in the display apparatus according to an implementation of the present disclosure, the thickness of the display panel can be reduced.

For example, when the cover member 120 is touched by the user, the first capacitance C1 between the second electrodes CE2 and the cover member 120 which are provided on the display panel 100 and the second capacitance C2 between the second electrodes CE2 and the signal lines can be changed, as shown in FIG. 11F.

The touch sensing signal generated by the change of the first capacitance C1 and the second capacitance C2 can be transmitted to the pixel driving circuit PD through the second electrodes CE2. In this case, the pixel driving circuit PD can be connected to the ground part GND.

The touch sensing signals transmitted to the pixel driving circuit PD can be transmitted to the touch determination part 200, and the touch determination part 200 can determine whether there is a touch on the touch electrode TE by using the touch sensing signals transmitted from the at least one pixel driving circuit PD.

One frame period (1Frame Period) can mean a period in which one image is displayed through the display panel 100. As shown in FIG. 11G, one frame period (1 Frame Period) can include a touch sensing period A and a display period B.

In one frame period, the touch sensing period A and the display period B can be different. For example, the touch sensing period A can be shorter than the display period B.

Hereinafter, a method in which the touch determination part 200 determines whether there is a touch on the touch electrode TE by using touch sensing signals transmitted from at least one pixel driving circuit PD will be described with reference to FIGS. 12 to 16.

FIGS. 12 to 16 are exemplary diagrams illustrating a method in which a display apparatus according to an implementation of the present disclosure determines whether there is a touch. In the following descriptions, details that are the same as or similar to details described with reference to FIGS. 1 to 11G will be omitted or briefly described.

Hereinafter, for convenience of description, the display apparatus according to an implementation of the present disclosure will be described, using a pixel driving circuit PD to which 16 pixels PX having a 4×4 shape are connected, as an example, as shown in FIG. 11.

In this case, as shown in FIG. 11A, the touch determination part 200 can include the receiving parts 210 connected to the pixel driving circuits PD, the determination parts 230 for determining whether there is a touch on the display panel 100 by using touch sensing signals transmitted from the receiving parts 210, and the switching part 220 for connecting each of the determination parts 230 to at least two receiving parts 210.

Hereinafter, for convenience of description, the display apparatus according to the present disclosure will be described by taking as an example the determination part 230 for determining whether there is a touch on the display panel 100 using touch sensing signals transmitted from the receiving parts 210.

Figure 12:
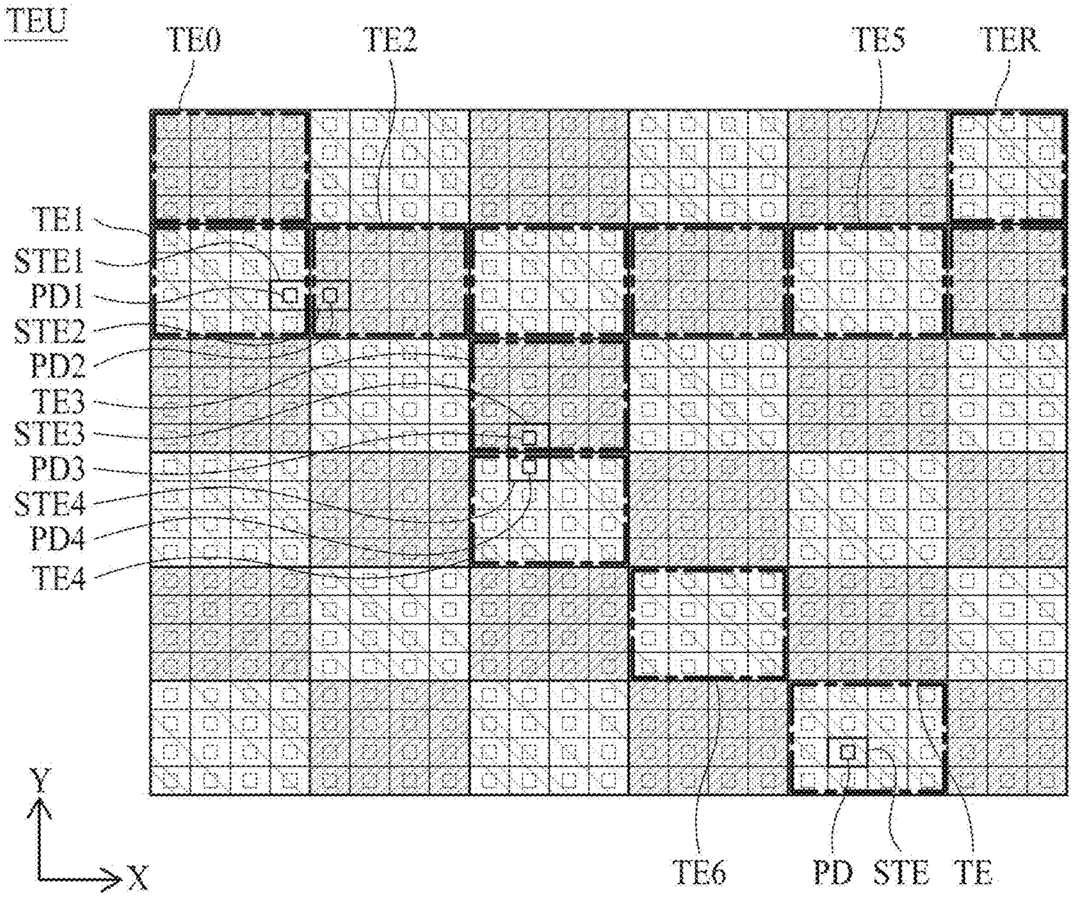
FIGS. 12 to 16 are diagrams illustrating examples of a method in which a display apparatus according to an implementation of the present disclosure determines whether there is a touch.

First, referring to FIG. 12, as described above, the touch determination part 200 can determine whether there is a touch at a touch electrode TE corresponding to one touch coordinate by using a touch sensing signal received from at least one of the pixel driving circuits PD.

For example, in FIG. 12, a touch electrode part TEU including 36 touch electrodes TE having a 6×6 shape is illustrated. For example, the touch electrode part TEU can include six touch electrodes TE provided along the first direction X and six touch electrodes TE provided along the second direction Y.

In this case, each of the 36 touch electrodes TE can correspond to one touch coordinate.

Each of the 36 touch electrodes TE can include 16 sub-touch electrodes STE.

Each of the 16 sub-touch electrodes STE is connected to one pixel driving circuit PD.

In the above example described with reference to FIG. 11A, each of the pixel driving circuits PD can be connected to 16 pixels PX having a 4×4 shape, and each of the 16 pixels PX can include three sub-pixels SP.

The touch electrodes TE provided in the touch electrode part TEU can include different numbers of sub-touch electrodes STE.

For example, each of the touch electrodes (hereinafter, simply referred to as a right touch electrode TER) provided on the right side of the touch electrode part TEU shown in FIG. 12 can include 12 sub-touch electrodes STE having a 3×4 shape, and each of the remaining touch electrodes TE can include 16 sub-touch electrodes STE having a 4×4 shape. For example, the right touch electrode TER can include three sub-touch electrodes STE provided along the first direction X and four sub-touch electrodes STE provided along the second direction Y. In this case, each of the remaining touch electrodes TE except for the right touch electrodes TER can include four sub-touch electrodes STE provided along the first direction X and four sub-touch electrodes STE provided along the second direction Y.

That is, the number of sub-touch electrodes STE included in each of the touch electrodes TE can be the same or different.

To provide an additional description, the number of sub-touch electrodes STE included in the touch electrode TE can be variously changed based on the number and arrangement form of pixels PX.

The sub-touch electrode STE is driven by the pixel driving circuit PD, and touch sensing signals transmitted from the sub-touch electrode STE during the touch sensing period can be transmitted to the receiving part 210 of the touch determination part 200 through at least one transmission line 429.

Hereinafter, for convenience of description, the display apparatus according to the present disclosure will be described by taking the receiving part 210 connected to the pixel driving circuit PD through one transmission line 429 as an example. That is, hereinafter, the display apparatus in which one sub-touch electrode STE is connected to the receiving part 210 through one transmission line 429 will be described.

In this case, depending on touch setting information stored in the touch determination part 200 or the timing controller 300, the switching part 220 can connect 16 transmission lines 429 connected to the 16 sub-touch electrodes STE adjacent to each other in the form of 4×4 as shown in FIG. 12 to one determination part 230. Accordingly, 16 touch sensing information can be transmitted to the determination part 230 from the 16 sub-touch electrodes STE.

The determination part 230 can determine whether there is a touch at the touch electrode TE corresponding to one touch coordinate by using 16 touch sensing information transmitted through the switching part 220.

For example, by analyzing at least one of voltage values and current values included in touch sensing information, it can be determined whether a touch electrode TE corresponding to one touch coordinate is touched.

For example, voltage values and current values, which are included in touch sensing information when the touch electrode TE is touched, can be different from voltage values and current values, which are included in touch sensing information when the touch electrode TE is not touched. Accordingly, the determination part 230 can determine whether the touch electrode TE is touched by using a change amount of at least one of voltage values and current values.

To provide an additional description, the determination part 230 can determine whether there is a touch at one touch electrode TE by using 16 touch sensing information received from 16 sub-touch electrodes STE adjacent to each other in the form of 4×4.

The touch coordinates of each of the touch electrodes TE connected to the determination part 230 can be stored in the touch determination part 200 or the timing controller 300.

Accordingly, the touch determination part 200 or the timing controller 300 can determine whether a touch has occurred at the touch electrode TE and the touch coordinates in which the touch has occurred.

Figure 13:
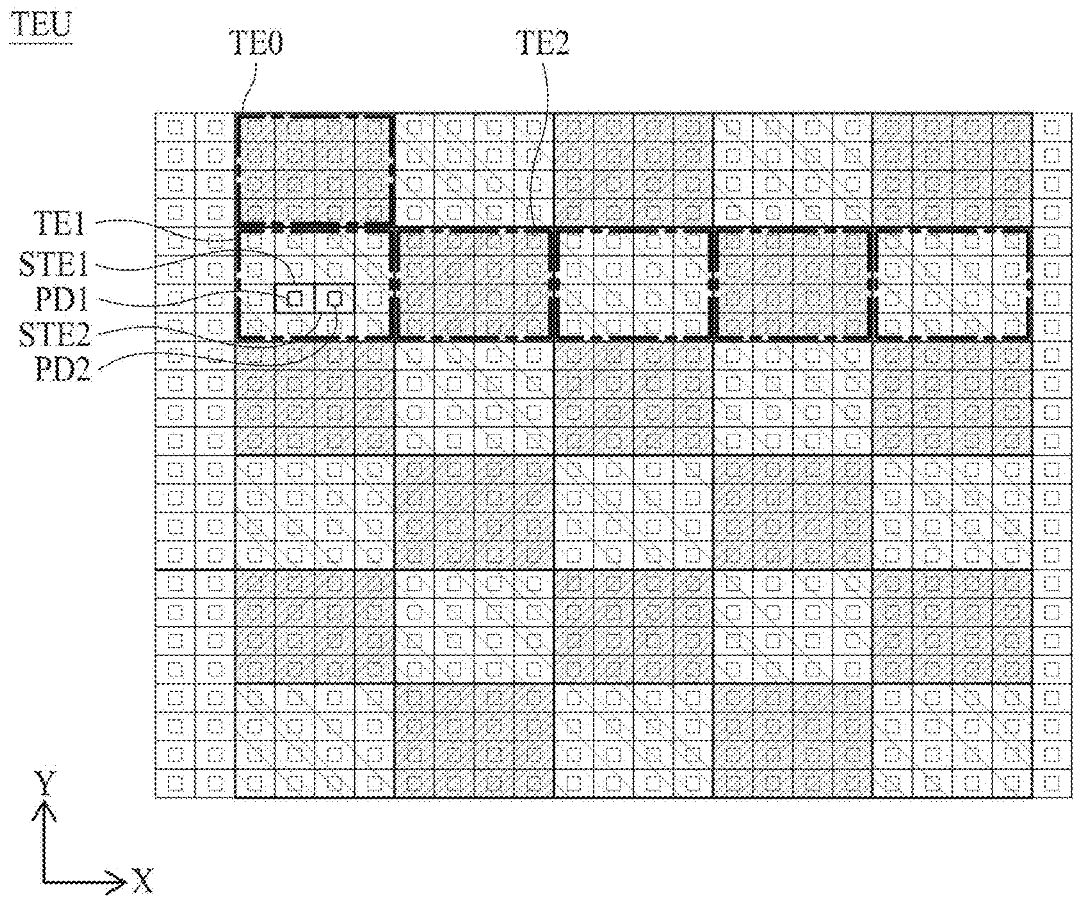

Next, referring to FIGS. 12 and 13, the position of the touch electrode TE corresponding to one touch coordinate can be changed based on the size and type of the electronic device to which the display apparatus according to the present disclosure is applied, and the position can be changed based on an application used in the electronic device.

For example, in the touch electrode part TEU shown in FIG. 12, the sub-touch electrode STE provided on the leftmost side of the touch electrode TEU is included in one touch electrode TE.

However, in the touch electrode part TEU applied to a specific electronic device, the sub-touch electrode STE provided on the leftmost side of the touch electrode TEU may not need to be included in the touch electrode TE.

For example, as shown in FIG. 13, the sub-touch electrodes STE provided at the third position from the leftmost side of the touch electrode part TEU can be included in the touch electrode TE. In this case, the sub-touch electrodes STE provided at the second position from the rightmost side of the touch electrode part TEU can be included in the touch electrode TE.

To provide an additional description, in FIG. 12, all sub-touch electrodes STE provided along the first direction X of the touch electrode part TEU can be included in the touch electrodes TE, and each of the touch electrodes TE can include sub-touch electrodes STE of a 4×4 type (the right touch electrode TER can include sub-touch electrodes STE of a 3×4 type). Accordingly, six touch electrodes TE can be provided along the first direction X, and six touch electrodes TE can be provided along the second direction Y.

However, in the touch electrode part TEU shown in FIG. 13, among the sub-touch electrodes STE provided along the first direction X, the sub-touch electrodes STE provided at the first and second positions from the leftmost side are not included in the touch electrode TE. Also, among the sub-touch electrodes STE provided along the first direction X, the sub-touch electrode STE provided at the first position from the rightmost side is not included in the touch electrode TE.

In this case, each of the touch electrodes TE can include sub-touch electrodes STE having a 4×4 shape. Accordingly, five touch electrodes TE can be provided along the first direction X, and six touch electrodes TE can be provided along the second direction Y.

Accordingly, the coordinates of the 0th touch electrode TE0 provided at the leftmost side among the touch electrodes TE provided along the first direction X in FIG. 12 can be different from the coordinates of the 0th touch electrode TE0 provided at the leftmost side among the touch electrodes TE provided along the first direction X in FIG. 13.

In this case, depending on the touch setting information stored in the touch determination part 200 or the timing controller 300, the switching part 220 can connect the 16 transmission lines 429 connected to the 16 sub-touch electrodes STE adjacent to each other in the form of 4×4 in FIG. 13 to one determination part 230. Accordingly, 16 touch sensing information can be transmitted to the determination part 230 from the 16 sub-touch electrodes STE. In this case, the 0th touch electrode TE0 provided at the leftmost side of the touch electrode part TEU does not include the sub-touch electrode STE provided at the first position from the leftmost side of the touch electrode part TEU and the sub-touch electrode STE provided at the second position from the leftmost side of the touch electrode part TEU.

However, in FIG. 13, the sub-touch electrodes STE provided at the first position from the leftmost side of the touch electrode part TEU and the sub-touch electrodes STE provided at the second position from the leftmost side can also be used as the touch electrodes TE.

For example, in FIG. 13, eight sub-touch electrodes (sub-touch electrodes having a 2×4 type structure) including the sub-touch electrode STE provided at the first position from the leftmost side of the touch electrode part TEU and the sub-touch electrodes STE provided at the second position from the leftmost side of the touch electrode part TEU can be included in the 0th touch electrode TE0. Also, the remaining sub-touch electrodes STE, excluding the sub-touch electrodes STE included in the 0th touch electrode TE0 among the sub-touch electrodes STE provided at the first position from the leftmost side of the touch electrode part TEU and the sub-touch electrodes STE provided at the second position from the leftmost side of the touch electrode part TEU, can be included in other touch electrodes TE.

However, in FIG. 13, among the sub-touch electrodes STE provided at the first position from the leftmost side of the touch electrode part TEU and the sub-touch electrodes STE provided at the second position from the leftmost side of the touch electrode part TEU, eight sub-touch electrodes STE disposed in the form of 2×4 shape can be used as independent touch electrodes TE.

Also, in FIG. 13, the sub-touch electrodes STE provided at the first position from the rightmost side of the touch electrode part TEU can be included in the touch electrodes TE shown in FIG. 13, or can be included in independent touch electrodes TE having a 1×4 shape.

Next, referring to FIGS. 12 and 13, the determination part 230 can determine whether there is a touch at the touch electrode TE corresponding to one touch coordinate by using 16 touch sensing information transmitted through the switching part 220.

In this case, each of the sub-touch electrodes STE can be connected to the pixel driving circuit PD.

Therefore, as shown in FIG. 13, the touch determination part 200 can be set to determine whether there is a touch at the first touch electrode TE1 corresponding to one touch coordinate by using touch sensing signals transmitted from the first pixel driving circuit PD1 and the second pixel driving circuit PD2, which are adjacent to each other along the first direction X of the display panel 100.

However, the touch determination part 200 can be set so that the touch electrode part TEU includes touch electrodes TE having an arrangement structure as shown in FIG. 12.

For example, as shown in FIG. 12, the touch determination part 200 can be set to determine whether there is a touch at the first touch electrode TE1 corresponding to a first touch coordinate by using the touch sensing signal transmitted from the first pixel driving circuit PD1, and to determine whether there is a touch at the second touch electrode TE2 corresponding to a second touch coordinate by using the touch sensing signal transmitted from the second pixel driving circuit PD2.

To provide an additional description, when the transmission line 429 connected to the first pixel driving circuit PD1 and the transmission line 429 connected to the second pixel driving circuit PD2 are connected to one determination part 230 by the switching part 220, the determination part 230 can determine whether the first touch electrode TE1 shown in FIG. 13 is touched and can determine the touch coordinates of the first touch electrode TE1 shown in FIG. 13, by using the touch sensing signal received from the first pixel driving circuit PD1 and the touch sensing signal received from the second pixel driving circuit PD2.

However, when the transmission line 429 connected to the first pixel driving circuit PD1 is connected to a first determination part by the switching part 220 and the transmission line 429 connected to the second pixel driving circuit PD2 is connected to a second determination part by the switching part 220, the first determination part can determine whether there is a touch at the first touch electrode TE1 shown in FIG. 12, by using the touch sensing signal received from the first pixel driving circuit PD1, and the second determination part can determine whether there is a touch at the second touch electrode TE2 shown in FIG. 12, by using the touch sensing signal received from the second pixel driving circuit PD2.

To provide an additional description, the first sub-touch electrode STE1 provided at the same position in the touch electrode parts TEU shown in FIGS. 12 and 13 can be included in the first touch electrode TE1 in each of the touch electrode parts TEU shown in FIGS. 12 and 13.

However, the second sub-touch electrode STE2 provided at the same position in the touch electrode parts TEU shown in FIGS. 12 and 13 can be included in the second touch electrode TE2 in the touch electrode part TEU shown in FIG. 12, and can be included in the first touch electrode TE1 in the touch electrode part TEU shown in FIG. 13.

Therefore, a manufacturer who wants to use the touch electrodes TE having the arrangement structure as shown in FIG. 12 can set touch setting information so that the receiving part 210 connected to the first pixel driving circuit PD1 can be connected to the first determination part and the receiving part 210 connected to the second pixel driving circuit PD2 can be connected to the second determination part during the manufacturing process of the display apparatus, and can store the touch setting information in the touch determination part 200 or the timing controller 300.

Also, a manufacturer who wants to use the touch electrodes TE having the arrangement structure as shown in FIG. 13 can set touch setting information so that the receiving part 210 connected to the first pixel driving circuit PD1 and the receiving part 210 connected to the second pixel driving circuit PD2 can be connected to one determination part 230 during the manufacturing process of the display apparatus, and can store the touch setting information in the touch determination part 200 or timing controller 300.

Figure 14:
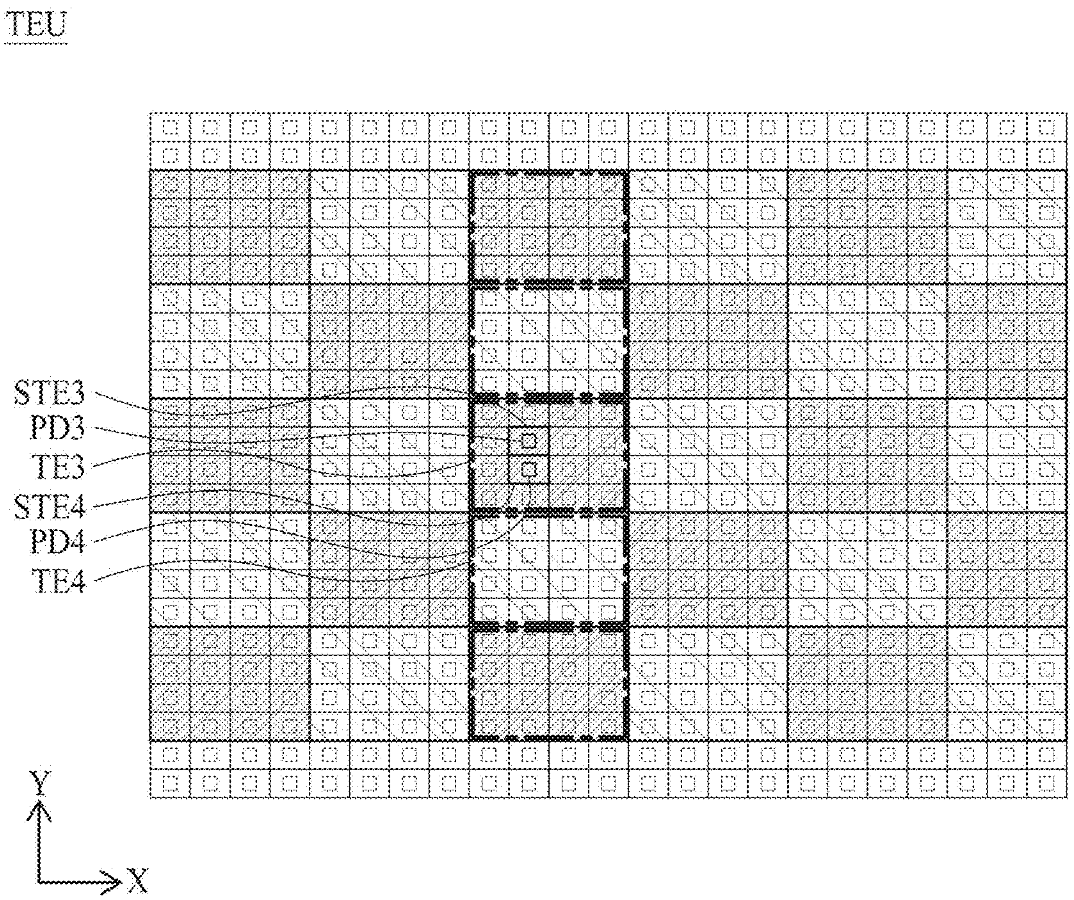

Next, as shown in FIG. 14, the touch determination part 200 can be set to determine whether there is a touch at a third touch electrode TE3 corresponding to one touch coordinate by using touch sensing signals transmitted from a third pixel driving circuit PD3 and a fourth pixel driving circuit PD4, which are adjacent to each other along the second direction Y different from the first direction X of the display panel 100.

However, as shown in FIG. 12, the touch determination part 200 can be set to determine whether there is a touch at a third touch electrode TE3 corresponding to a third touch coordinate by using the touch sensing signal transmitted from a third pixel driving circuit PD3, and determine whether there is a touch at a fourth touch electrode TE4 corresponding to a fourth touch coordinate by using the touch sensing signal transmitted from a fourth pixel driving circuit PD4.

To provide an additional description, the third sub-touch electrode STE3 provided at the same position in the touch electrode parts TEU shown in FIGS. 12 and 14 can be included in the third touch electrode TE3 in each of the touch electrode parts TEU shown in FIGS. 12 and 14.

However, the fourth sub-touch electrode TE4 provided at the same position in the touch electrode parts TEU shown in FIGS. 12 and 14 can be included in the fourth touch electrode TE4 in the touch electrode part TEU shown in FIG. 12, and can be included in the third touch electrode TE3 in the touch electrode part TEU shown in FIG. 14.

Therefore, a manufacturer who wants to use the touch electrodes TE having the arrangement structure as shown in FIG. 12 can set touch setting information so that the receiving part 210 connected to the third pixel driving circuit PD3 can be connected to the third determination part and the receiving part 210 connected to the fourth pixel driving circuit PD4 can be connected to the fourth determination part during the manufacturing process of the display apparatus, and can store the touch setting information in the touch determination part 200 or the timing controller 300.

Also, a manufacturer who wants to use the touch electrodes TE having the arrangement structure as shown in FIG. 14 can set touch setting information so that the receiving part 210 connected to the third pixel driving circuit PD3 and the receiving part 210 connected to the fourth pixel driving circuit PD4 can be connected to one determination part 230 during the manufacturing process of the display apparatus, and can store touch setting information in the touch determination part 200 or timing controller 300.

In this case, as shown in FIGS. 12 and 14, the number of touch electrodes TE disposed along the second direction Y can be changed.

For example, six touch electrodes TE can be disposed in the second direction Y in the touch electrode part TEU shown in FIG. 12, but five touch electrodes TE can be disposed in the second direction Y in the touch electrode part TEU shown in FIG. 14.

In this case, the uppermost sub-touch electrodes provided at the first and second positions from the uppermost end of the touch electrode part TEU shown in FIG. 14 and the lowermost sub-touch electrodes provided at the first and second positions from the lowermost end of the touch electrode part TEU shown in FIG. 14 may not be used as the touch electrode TE. However, the uppermost sub-touch electrodes can be included in the touch electrodes TE adjacent to them, or can be included in other touch electrodes having a 4×2 structure. Also, the lowermost sub-touch electrodes can also be included in the touch electrodes adjacent to them, or can be included in other touch electrodes having a 4×2 structure.

Next, the touch determination part 200 can be set to determine whether there is a touch at a fifth touch electrode TE5 corresponding to one touch coordinate by using touch sensing signals transmitted from n pixel driving circuits PD adjacent to each other along the first direction X of the display panel among pixel driving circuits PD, or can be set to determine whether there is a touch at a fifth touch electrode TE5 corresponding to one touch coordinate by using touch sensing signals transmitted from m pixel driving circuits PD adjacent to each other along the first direction X of the display panel among pixel driving circuits PD. In this case, m and n can be different natural numbers.

Figure 15:
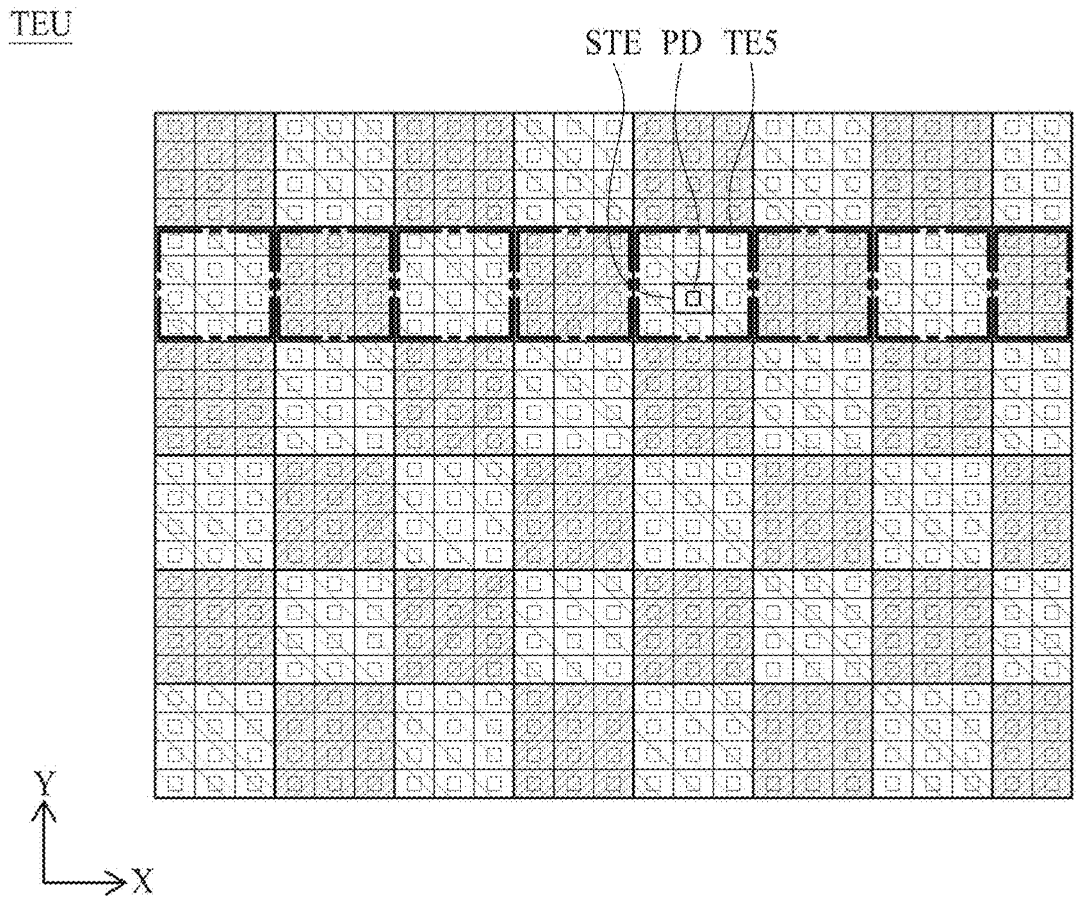

For example, the touch determination part 200 can be set to determine whether there is a touch at the fifth touch electrode TE5 by using touch sensing signals transmitted from four (n=4) pixel driving circuits PD adjacent to each other along the first direction X, as shown in FIG. 12, or can be set to determine whether there is a touch at the fifth touch electrode TE5 by using touch sensing signals transmitted from three (m=3) pixel driving circuits PD adjacent to each other along the first direction X, as shown in FIG. 15.

That is, in a display apparatus according to the present disclosure, the number of sub-touch electrodes STE provided along the first direction X in the touch electrode TE can be changed.

Accordingly, a manufacturer who wants to use the touch electrodes TE having the arrangement structure as shown in FIG. 12 can set touch setting information so that the receiving parts 210 connected to the four pixel driving circuits PD provided along the first direction X are connected to a fifth determination part during the manufacturing process of the display apparatus, and can store the touch setting information in the touch determination part 200 or timing controller 300.

Also, a manufacturer who wants to use touch electrodes TE having the arrangement structure as shown in FIG. 15 can set touch setting information so that the receiving parts 210 connected to the three pixel driving circuits PD provided along the first direction X can be connected to a fifth determination part during the manufacturing process of the display apparatus, and can store touch setting information in touch determination part 200 or timing controller 300.

Next, the touch determination part 200 can be set to determine whether there is a touch at a sixth touch electrode TE6 corresponding to one touch coordinate by using touch sensing signals transmitted from s pixel driving circuits PD adjacent to each other along the second direction Y different from the first direction X of the display panel 100 among the pixel driving circuits PD, or can be set to determine whether there is a touch at a sixth touch electrode TE6 corresponding to one touch coordinate by using touch sensing signals transmitted from t pixel driving circuits PD adjacent to each other along the second direction Y among the pixel driving circuits PD. In this case, s and t can be different natural numbers.

Figure 16:
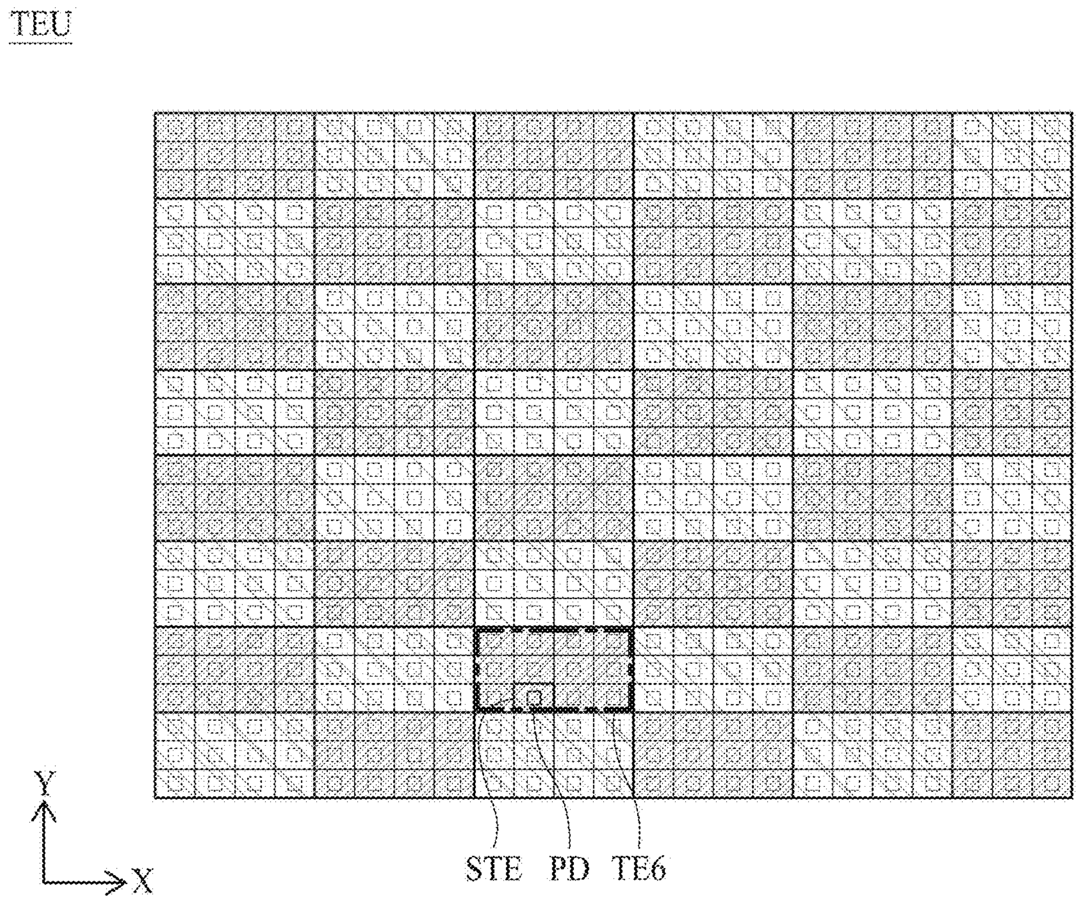

For example, the touch determination part 200 can be set to determine whether there is a touch at the sixth touch electrode TE6 by using touch sensing signals transmitted from four (s=4) pixel driving circuits PD adjacent to each other along the second direction Y, as shown in FIG. 16, and can be set to determine whether there is a touch at the sixth touch electrode TE6 by using touch sensing signals transmitted from three (t=3) pixel driving circuits PD adjacent to each other along the second direction Y.

That is, in the display apparatus according to the present disclosure, the number of sub-touch electrodes STE provided along the second direction Y in the touch electrode TE can be changed.

Accordingly, a manufacturer who wants to use the touch electrodes TE having the arrangement structure as shown in FIG. 12 can set touch setting information so that the receiving parts 210 connected to the four pixel driving circuits PD provided along the second direction Y are connected to a sixth determination part during the manufacturing process of the display apparatus, and can store the touch setting information in the touch determination part 200 or timing controller 300.

Also, a manufacturer who wants to use touch electrodes TE having an arrangement structure as shown in FIG. 16 can set touch setting information so that the receiving parts 210 connected to the three pixel driving circuits PD provided along the second direction Y are connected to a sixth determination part during the manufacturing process of the display apparatus, and can store touch setting information in touch determination part 200 or timing controller 300.

As described above, in the display apparatus according to the present disclosure, the number and touch coordinates of the touch electrodes TE disposed along the first direction X can be changed, as shown in FIGS. 12 and 13.

Also, in the display apparatus according to the present disclosure, the number and touch coordinates of the touch electrodes TE disposed along the second direction Y can be changed, as shown in FIGS. 12 and 14.

Also, in the display apparatus according to the present disclosure, the number of touch electrodes TE disposed along the first direction X and the number of touch electrodes TE disposed along the second direction Y can be changed, and thus, the touch coordinates of the touch electrodes TE disposed along the first direction X and the touch coordinates of the touch electrodes TE disposed along the second direction Y can be changed.

Also, in the display apparatus according to the present disclosure, the number of sub-touch electrodes STE provided along the first direction X in the touch electrode TE can be changed, as shown in FIGS. 12 and 15.

Also, in the display apparatus according to the present disclosure, as shown in FIGS. 12 and 16, the number of sub-touch electrodes STE provided along the second direction Y in the touch electrode TE can be changed.

In addition, in the display apparatus according to the present disclosure, the number of sub-touch electrodes STE provided along the first direction X and the number of sub-touch electrodes STE provided along the second direction Y in the touch electrode TE can be changed.

To provide an additional description, based on the control of the timing controller 300 that controls the pixel driving circuits PD, the touch determination part 200 can change the number of pixel driving circuits PD driving a touch electrode corresponding to one touch coordinate.

Also, based on the control of the timing controller 300 that controls the pixel driving circuits PD, the touch determination part 200 can change the pixel driving circuits PD driving a touch electrode corresponding to one touch coordinate.

For example, the timing controller 300 can control the touch determination part 200 based on the stored touch setting information.

In this case, the touch determination part 200 can change the pixel driving circuits PD driving one touch electrode, as described with reference to FIGS. 12 to 14.

For example, as described with reference to FIG. 12, the first touch electrode TE1 can include the first pixel driving circuit PD1, and as described with reference to FIG. 13, the first touch electrode TE1 can include both the first pixel driving circuit PD1 and the second pixel driving circuit PD2.

Also, the touch determination part 200 can change the number of pixel driving circuits PD driving one touch electrode, as described with reference to FIGS. 12, 15, and 16.

For example, as described with reference to FIG. 12, the fifth touch electrode TE5 can be connected to four pixel driving circuits PD provided along the first direction X, or as described with reference to FIG. 15, the fifth touch electrode TE5 can be connected to three pixel driving circuits PD provided along the first direction X.

However, using the stored touch setting information, the touch determination part 200 can directly change the number of pixel driving circuits PD driving the touch electrode corresponding to one touch coordinate or change the pixel driving circuits PD driving the touch electrode corresponding to one touch coordinate.

Finally, even when the display apparatus according to the present disclosure is used by a user, the touch determination part 200 can change the number of pixel driving circuits PD driving the touch electrode or change the pixel driving circuits PD driving the touch electrode corresponding to one touch coordinate.

For example, when resolution information indicating that a resolution of the display panel 100 has been changed, or image size information indicating that a size of images to be displayed on the display panel 100 has been changed, or touch electrode size information indicating that a size of a touch electrode corresponding to one touch coordinate has been changed is transmitted from the external system 900 during a period in which images are displayed through the display panel, the timing controller 300 transmits a touch control signal for changing the number of the pixel driving circuits or a touch control signal for changing the pixel driving circuits to the touch determination part 200.

In this case, the touch determination part 200 can change the number of pixel driving circuits PD driving the touch electrode or change the pixel driving circuits PD driving the touch electrode corresponding to one touch coordinate by using at least one of the methods described with reference to FIGS. 12 to 16.

For example, when the resolution of the display panel 100 increases, the area of the touch electrode needs to be reduced. Also, when the size of an image to be displayed on the display panel increases, the area of the touch electrode needs to be increased. Also, a touch electrode size information for changing the size of the touch electrode TE can be directly transmitted from the external system to the timing controller 300.

In this case, the touch determination part 200 can perform at least one of the various functions described above based on the control of the timing controller 300.

FIGS. 17 to 20 are diagrams illustrating electronic devices to which a display apparatus according to implementations of the present disclosure is applied.

Figure 17:
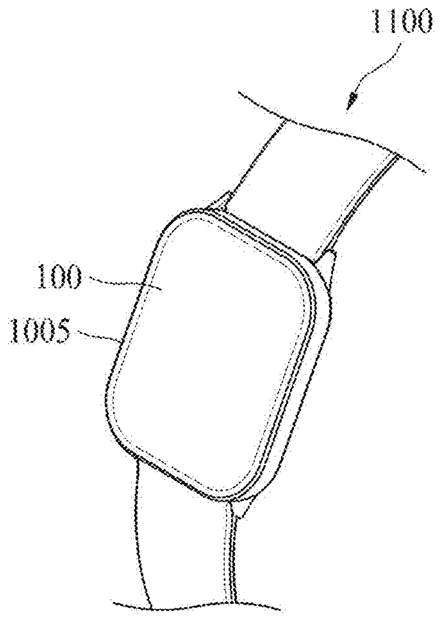
FIGS. 17 to 20 are diagrams illustrating examples of electronic devices to which a display apparatus according to implementations of the present disclosure is applied.
Figure 18:
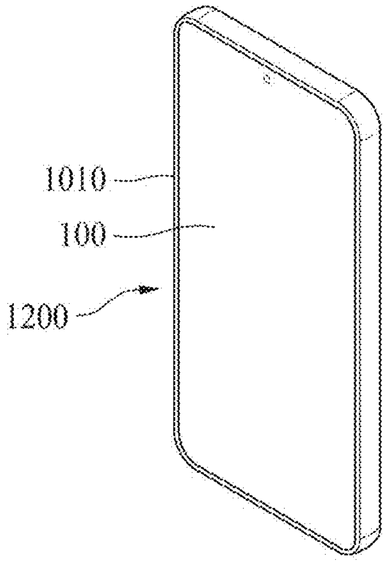
Figure 19:
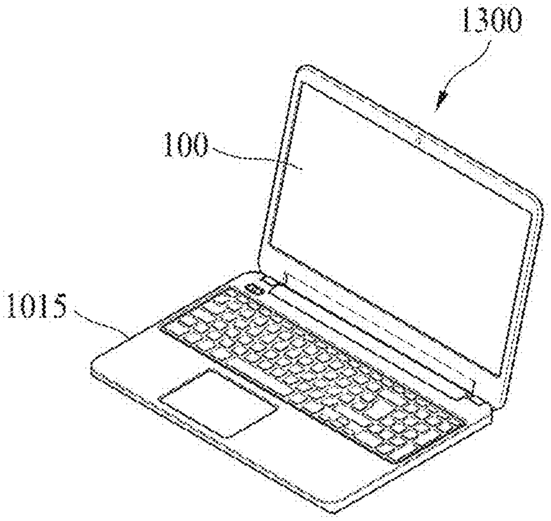
Figure 20:
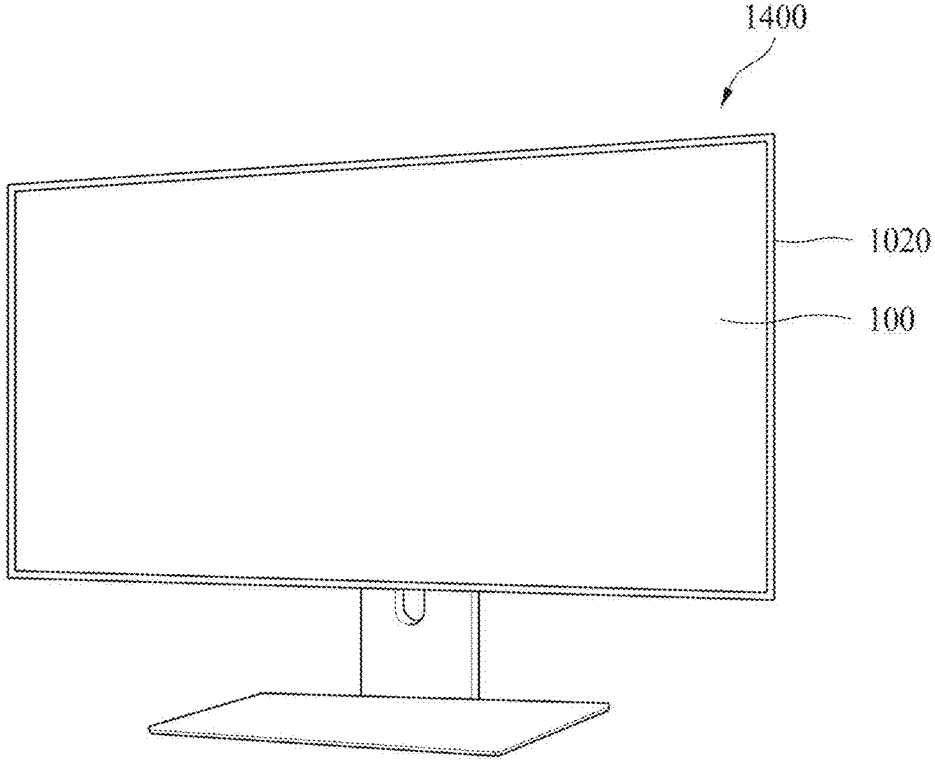

Referring to FIGS. 17 to 20, the display apparatus according to implementations of the present disclosure can be included in various electronic devices. For example, various electronic devices can be a wearable device 1100 as shown in FIG. 17, a mobile device 1200 as shown in FIG. 18, a laptop 1300 as shown in FIG. 19, and a monitor or TV 1400 as shown in FIG. 20, but implementations of the present disclosure are not limited thereto.

Each of the wearable device 1100, the mobile device 1200, the laptop 1300, and the monitor or TV 1400 can include a case part 1005, 1010, 1015, and 1020, and a display panel 100 and a display apparatus 1000 as described above.

For example, the display apparatus according to an implementation of the present disclosure can be applied to a mobile device, a video phone, a smart watch, a watch phone, a wearable device, a foldable device, a rollable device, a bendable device, a flexible device, a curved device, a sliding device, a variable device, an electronic notebook, an electronic book, a portable multimedia player (PMP), PDA (personal digital assistant), an MP3 player, a mobile medical device, a desktop PC, a laptop PC, a netbook computer, a workstation, a navigation, a vehicle display, a theater display, a television, a wall paper device, a signage device, a game device, a laptop, a game device, a monitor, a camera, a camcorder or a home appliance.

According to the present disclosure, positions and sizes of the touch electrodes can be variously changed. Therefore, the touch sensing capability of the display apparatus can be improved.

The above-described feature, structure, and effect of the present disclosure are included in at least one implementation of the present disclosure, but are not limited to only one implementation. Furthermore, the feature, structure, and effect described in at least one implementation of the present disclosure can be implemented through combination or modification of other implementations. Therefore, content associated with the combination and modification should be construed as being within the scope of the present disclosure.

It will be apparent that modifications and variations can be made from the disclosed examples while remaining true to the implementations described in the present disclosure. Thus, it is intended that the described implementations include modifications and variations of the disclosed examples.

What is claimed is:

1. A display apparatus comprising:

a display panel; and a touch determination circuit configured to determine whether the display panel is touched using touch sensing signals transmitted from pixel driving circuits in the display panel, wherein the display panel comprises:
a substrate including a display area and a non-display area;
the pixel driving circuits in the display area on the substrate;
a protective layer covering the pixel driving circuits;
connection lines disposed on the protective layer and electrically connected to the pixel driving circuits;
first electrodes disposed over the protective layer and electrically connected to the pixel driving circuits via the connection lines;
light emitting devices on the first electrodes; and
second electrodes on the light emitting devices,
at least one of the pixel driving circuits is configured to drive each of the light emitting devices,
each of the second electrodes is electrically connected to at least two of the light emitting devices, and
at least one of the second electrodes is electrically connected to each of the pixel driving circuits via the connection lines.

2. The display apparatus of claim 1, wherein the display panel comprises:
an insulating layer on the pixel driving circuits; and
banks on the insulating layer,
a first electrode is on each of the banks,
a light emitting device is on the first electrode, and
the light emitting device is covered by the second electrode.

3. The display apparatus of claim 1, wherein
the at least one second electrode connected to each of the pixel driving circuits is provided along a first direction of the display panel, and
the at least two light emitting devices connected to the second electrode are provided in a row along the first direction.

4. The display apparatus of claim 1, wherein
in a touch sensing period, each of the pixel driving circuits supplies a touch driving signal to the at least one second electrode and transmits a touch sensing signal received from the at least one second electrode to the touch determination circuit.

5. The display apparatus of claim 4, wherein
in a display period, each of the pixel driving circuits supplies a cathode voltage to the at least one second electrode provided along a first direction of the display panel.

6. The display apparatus of claim 1, wherein
each of the pixel driving circuits comprises:
a sub-pixel driving circuit for supplying anode voltages to anodes provided in the light emitting devices; and
a touch control circuit for supplying a cathode voltage or a touch driving signal to a second electrode shared by at least two light emitting devices.

7. The display apparatus of claim 6, wherein
the touch control circuit comprises:
a cathode voltage supply circuit for supplying cathode voltages to the second electrodes;
a touch driving signal supply circuit for supplying touch driving signals to the second electrodes; and
a control switching circuit for connecting each of the second electrodes to the cathode voltage supply circuit or the touch driving signal supply circuit.

8. The display apparatus of claim 1, wherein
the touch determination circuit comprises:
receiving circuits connected to the pixel driving circuits;
determination circuits for determining whether the display panel is touched by using touch sensing signals transmitted from the receiving circuits; and
a switching circuit connecting each of the determination circuits to at least two receiving circuits.

9. The display apparatus of claim 1, wherein the touch determination circuit determines whether there is a touch at a touch electrode corresponding to one touch coordinate by using a touch sensing signal received from at least one of the pixel driving circuits.

10. The display apparatus of claim 1, wherein
the touch determination circuit determines whether there is a touch at a touch electrode corresponding to one touch coordinate by using touch sensing signals transmitted from a first pixel driving circuit and a second pixel driving circuit adjacent to each other in a first direction of the display panel among the pixel driving circuits, or
the touch determination circuit determines whether there is a touch at a first touch electrode corresponding to a first touch coordinate by using a touch sensing signal transmitted from the first pixel driving circuit, and determines whether there is a touch at a second touch electrode corresponding to a second touch coordinate by using a touch sensing signal transmitted from the second pixel driving circuit.

11. The display apparatus of claim 10, wherein
the touch determination circuit determines whether there is a touch at a third touch electrode corresponding to one touch coordinate by using touch sensing signals transmitted from a third pixel driving circuit and a fourth pixel driving circuit adjacent to each other along a second direction different from the first direction of the display panel among the pixel driving circuits, or
the touch determination circuit determines whether there is a touch at a third touch electrode corresponding to a third touch coordinate by using a touch sensing signal transmitted from a third pixel driving circuit, and determines whether there is a touch at a fourth touch electrode corresponding to a fourth touch coordinate by using a touch sensing signal transmitted from a fourth pixel driving circuit.

12. The display apparatus of claim 1, wherein
the touch determination circuit is configured to selectively determine whether there is a touch at a fifth touch electrode corresponding to one touch coordinate by using touch sensing signals transmitted from n pixel driving circuits adjacent to each other in a first direction of the display panel among the pixel driving circuits, and
the touch determination circuit is configured to determine whether there is a touch at the touch electrode corresponding to one touch coordinate by using touch sensing signals transmitted from m pixel driving circuits adjacent to each other along the first direction among the pixel driving circuits, and
the m and n are different natural numbers greater than one.

13. The display apparatus of claim 1, wherein
the touch determination circuit is configured to selectively determine whether there is a touch at a sixth touch electrode corresponding to one touch coordinate by using touch sensing signals transmitted from s pixel driving circuits adjacent to each other along a second direction different from a first direction of the display panel among the pixel driving circuits, and
the touch determination circuit is configured to determine whether there is a touch at the touch electrode corresponding to one touch coordinate by using touch sensing signals transmitted from t pixel driving circuits adjacent to each other along the second direction among the pixel driving circuits, and the s and t are different natural numbers greater than one.

14. The display apparatus of claim 1, wherein based on a control of a timing controller controlling the pixel driving circuits, the touch determination circuit changes the number of pixel driving circuits driving a touch electrode corresponding to one touch coordinate, or based on a control of a timing controller controlling the pixel driving circuits, the touch determination circuit changes pixel driving circuits driving a touch electrode corresponding to one touch coordinate.

15. The display apparatus of claim 14, wherein when resolution information indicating that a resolution of the display panel has been changed, or image size information indicating that a size of images to be displayed on the display panel has been changed, or touch electrode size information indicating that a size of a touch area has been changed is transmitted from an external system, during a period in which images are displayed through the display panel, the timing controller transmits a touch control signal for changing the number of the pixel driving circuits driving the touch electrode to change the size of the touch area or a touch control signal for changing the pixel driving circuits driving the touch electrode to the touch determination circuit.

* * * * *